US011960182B2

(12) United States Patent
Kato et al.

(10) Patent No.: US 11,960,182 B2
(45) Date of Patent: Apr. 16, 2024

(54) LIGHT ABSORPTION ANISOTROPIC FILM, LAMINATE, AND IMAGE DISPLAY DEVICE

(71) Applicant: FUJIFILM Corporation, Tokyo (JP)

(72) Inventors: Yumi Kato, Kanagawa (JP); Naoki Koito, Kanagawa (JP); Hiroshi Matsuyama, Kanagawa (JP); Akihiro Sugita, Kanagawa (JP); Takehiro Kasahara, Kanagawa (JP); Naoyoshi Yamada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/060,873

(22) Filed: Dec. 1, 2022

(65) Prior Publication Data

US 2023/0213823 A1 Jul. 6, 2023

Related U.S. Application Data

(63) Continuation of application No. PCT/JP2021/018699, filed on May 18, 2021.

(30) Foreign Application Priority Data

| Jun. 5, 2020 | (JP) | 2020-098483 |
| Jul. 14, 2020 | (JP) | 2020-120655 |
| Jul. 29, 2020 | (JP) | 2020-127906 |
| Sep. 4, 2020 | (JP) | 2020-149107 |
| Nov. 5, 2020 | (JP) | 2020-185059 |

(51) Int. Cl.
| G02F 1/13363 | (2006.01) |
| G02F 1/1333 | (2006.01) |
| G02F 1/1335 | (2006.01) |
| G02F 1/135 | (2006.01) |
| H01J 49/40 | (2006.01) |

(52) U.S. Cl.
CPC ...... *G02F 1/1351* (2021.01); *G02F 1/133354* (2021.01); *G02F 1/133509* (2013.01); *G02F 1/13363* (2013.01); *H01J 49/40* (2013.01)

(58) Field of Classification Search
CPC ............ G02F 1/1351; G02F 1/133354; G02F 1/13363; H01J 49/40
See application file for complete search history.

(56) References Cited

U.S. PATENT DOCUMENTS

| 2011/0240918 A1 | 10/2011 | Ootsuki et al. |
| 2019/0071571 A1 | 3/2019 | Takada et al. |
| 2020/0018879 A1 | 1/2020 | Katou et al. |
| 2020/0326590 A1 | 10/2020 | Shibata et al. |
| 2021/0302773 A1 | 9/2021 | Koito et al. |

FOREIGN PATENT DOCUMENTS

| JP | 2011-225520 A | 11/2011 |
| WO | 2014/181846 A1 | 11/2014 |
| WO | 2017/195833 A1 | 11/2017 |
| WO | 2018/186503 A1 | 10/2018 |
| WO | 2019/131943 A1 | 7/2019 |
| WO | 2020/122116 A1 | 6/2020 |

OTHER PUBLICATIONS

WO 2019131943 A1 (Year: 2019).*
Office Action, issued by the Japanese Patent Office dated Aug. 1, 2023, in connection with Japanese Patent Application No. 2022-528519.
International Search Report issued in PCT/JP2021/018699 dated Jul. 27, 2021.
Written Opinion issued in PCT/JP2021/018699 dated Jul. 27, 2021.
International Preliminary Report on Patentability completed by WIPO dated Dec. 6, 2022 in connection with International Patent Application No. PCT/JP2021/018699.

* cited by examiner

*Primary Examiner* — James A Dudek
(74) *Attorney, Agent, or Firm* — Edwards Neils LLC; Jean C. Edwards, Esq.

(57) ABSTRACT

Provided is a light absorption anisotropic film capable of preparing an image display device having excellent display performance and excellent durability, and a laminate and an image display device formed of the light absorption anisotropic film. The light absorption anisotropic film is used for an image display device, which is formed of a liquid crystal composition containing a liquid crystal compound and a dichroic substance, in which in a signal derived from the dichroic substance detected by time-of-flight secondary ion mass spectrometry, a relationship between a maximum intensity Imax of the light absorption anisotropic film in a thickness direction and an intensity Isur1 in a surface of the light absorption anisotropic film on a viewing side of the image display device satisfies Expression (I-1) 2.0≤Imax/Isur1.

20 Claims, No Drawings

LIGHT ABSORPTION ANISOTROPIC FILM, LAMINATE, AND IMAGE DISPLAY DEVICE

CROSS-REFERENCE TO RELATED APPLICATIONS

This application is a Continuation of PCT International Application No. PCT/JP2021/018699 filed on May 18, 2021, which was published under PCT Article 21(2) in Japanese, and which claims priority under 35 U.S.C. § 119(a) to Japanese Patent Application No. 2020-098483 filed on Jun. 5, 2020, Japanese Patent Application No. 2020-120655 filed on July 142020, Japanese Patent Application No. 2020-127906 filed on Jul. 29, 2020, Japanese Patent Application No. 2020-149107 filed on Sep. 4, 2020 and Japanese Patent Application No. 2020-185059 filed on Nov. 5, 2020. The above applications are hereby expressly incorporated by reference, in their entirety, into the present application.

BACKGROUND OF THE INVENTION

1. Field of the Invention

The present invention relates to a light absorption anisotropic film, a laminate, and an image display device.

2. Description of the Related Art

In the related art, in a case where an attenuation function, a polarization function, a scattering function, a light-shielding function of irradiation light including laser light or natural light is required, a device that is operated according to principles different for each function is used. Therefore, products corresponding to the above-described functions are also produced by production processes different for each function.

For example, a linear polarizer or a circular polarizer is used in an image display device (for example, a liquid crystal display device) to control optical revolution or birefringence in display. Further, a circular polarizer is used in an organic light emitting diode (OLED) to prevent reflection of external light.

In the related art, iodine has been widely used as a dichroic substance in these polarizers, but a polarizer that uses an organic coloring agent in place of iodine as a dichroic substance has also been examined.

For example, WO2017/195833A describes a light absorption anisotropic film formed of a composition containing a dichroic substance having a predetermined structure ([claim 1] and [claim 14]).

SUMMARY OF THE INVENTION

The present inventors have conducted examination on the light absorption anisotropic film and the image display device described in WO2017/195833A and found that the display performance and the durability of the image display device are degraded in some cases depending on the kind and the blending amount of the dichroic substance contained in the light absorption anisotropic film, the layer configuration other than the light absorption anisotropic film in the image display device, and the like.

Therefore, an object of the present invention is to provide a light absorption anisotropic film capable of preparing an image display device having excellent display performance and excellent durability, and a laminate and an image display device formed of the light absorption anisotropic film.

As a result of intensive examination conducted by the present inventors in order to achieve the above-described object, it was found that an image display device with excellent display performance and excellent durability can be prepared by reducing the amount of the dichroic substance present in the surface of the light absorption anisotropic film on a viewing side of the image display device, thereby completing the present invention.

That is, the present inventors found that the above-described object can be achieved by employing the following configurations.

[1] A light absorption anisotropic film used for an image display device, which is formed of a liquid crystal composition containing a liquid crystal compound and a dichroic substance, in which in a signal derived from the dichroic substance detected by time-of-flight secondary ion mass spectrometry, a relationship between a maximum intensity Imax of the light absorption anisotropic film in a thickness direction and an intensity Isur1 in a surface of the light absorption anisotropic film on a viewing side of the image display device satisfies Expression (I-1), $$2.0 \leq I_{max}/I_{sur1} \qquad (I-1).$$

[2] The light absorption anisotropic film according to [1], in which a thickness between the surface of the light absorption anisotropic film on the viewing side of the image display device and a position where the maximum intensity Imax is exhibited is greater than 50 nm.

[3] The light absorption anisotropic film according to [1], in which a thickness between the surface of the light absorption anisotropic film on the viewing side of the image display device and a position where the maximum intensity Imax is exhibited is greater than 60 nm.

[4] The light absorption anisotropic film according to any one of [1] to [3], in which the liquid crystal composition further contains a surfactant, and a difference between a log P value of the surfactant and a log P value of the liquid crystal compound is less than 3.1.

[5] The light absorption anisotropic film according to any one of [1] to [3], in which the liquid crystal composition further contains a surfactant, and a difference between a log P value of the surfactant and a log P value of the liquid crystal compound is less than 1.4.

[6] The light absorption anisotropic film according to any one of [1] to [3], in which the liquid crystal composition further contains a surfactant, where a difference in a log P value between the surfactant and the liquid crystal compound is less than 1.4 and a surfactant, where a difference in a log P value between the surfactant and the liquid crystal compound is greater than or equal to 1.4.

[7] A laminate used for an image display device, comprising in order: a base material; an alignment film; and a light absorption anisotropic film, in which the light absorption anisotropic film is the light absorption anisotropic film according to any one of [1] to [6], and in a signal derived from the dichroic substance detected by time-of-flight secondary ion mass spectrometry, a relationship between a maximum intensity Imax of the light absorption anisotropic film in a thickness direction and an intensity Isur1 in a surface of the light absorption anisotropic film on a viewing side of the image display device satisfies Expression (I-1), $$2.0 \leq I_{max}/I_{sur1} \qquad (I-1).$$

[8] The laminate according to [7], further comprising: a retardation plate provided on the light absorption anisotropic film, in which the retardation plate includes a plurality of optically anisotropic layers containing a liquid crystal compound, and at least one of the plurality of optically anisotropic layers is an optically anisotropic layer containing a twistedly aligned liquid crystal compound having a helix axis in the thickness direction.

[9] The laminate according to [7], further comprising: a surface protective material provided on the light absorption anisotropic film, in which the base material is a glass base material having a thickness of 100 μm or less.

[10] The laminate according to [7], further comprising: a λ/4 plate provided on the light absorption anisotropic film.

[11] An image display device comprising: the light absorption anisotropic film according to any one of [1] to [6] or the laminate according to any one of [7] to [10].

According to the present invention, it is possible to provide a light absorption anisotropic film capable of preparing an image display device having excellent display performance and excellent durability, and a laminate and an image display device formed of the light absorption anisotropic film.

DESCRIPTION OF THE PREFERRED EMBODIMENTS

Hereinafter, the present invention will be described in detail.

The description of constituent requirements described below may be made based on typical embodiments of the present invention, but the present invention is not limited to such embodiments.

In addition, in the present specification, a numerical range shown using "to" indicates a range including numerical values described before and after "to" as a lower limit and an upper limit.

Further, in the present specification, materials corresponding to respective components may be used alone or in combination of two or more kinds thereof. Here, in a case where two or more kinds of substances corresponding to respective components are used in combination, the content of the components indicates the total content of the combined substances unless otherwise specified.

Further, in the present specification, "(meth)acrylate" is a notation representing "acrylate" or "methacrylate", "(meth) acryl" is a notation representing "acryl" or "methacryl", and "(meth)acryloyl" is a notation representing "acryloyl" or "methacryloyl".

In the present specification, a substituent W represents the following group.

Examples of the substituent W include an alkyl group (preferably an alkyl group having 1 to 20 carbon atoms, more preferably an alkyl group having 1 to 12 carbon atoms, and particularly preferably an alkyl group having 1 to 8 carbon atoms, and examples thereof a methyl group, an ethyl group, an isopropyl group, a tert-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms, and examples thereof include a vinyl group, an aryl group, a 2-butenyl group, and a 3-pentenyl group), an alkynyl group (preferably an alkynyl group having 2 to 20 carbon atoms, more preferably an alkynyl group having 2 to 12 carbon atoms, and particularly preferably an alkynyl group having 2 to 8 carbon atoms, and examples thereof include a propargyl group and a 3-penty-nyl group), an aryl group (preferably an aryl group having 6 to 30 carbon atoms, more preferably an aryl group having 6 to 20 carbon atoms, and particularly preferably an aryl group having 6 to 12 carbon atoms, and examples thereof include a phenyl group, a 2,6-diethylphenyl group, a 3,5-ditrifluoromethylphenyl group, a styryl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, and examples thereof include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms, and examples thereof include an acetoxy group, a benzoyloxy group, an acryloyl group, and a methacryloyl group), an acylamino group (preferably an acylamino group having 2 to 20 carbon atoms, more preferably an acylamino group having 2 to 10 carbon atoms, and particularly preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms, and examples thereof include an unsubstituted sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably an alkylthio group having 1 to 10 carbon atoms, and particularly preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, and examples thereof include an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and particularly preferably a phosphoric acid amide group having 1 to 6 carbon atoms, and examples thereof include a diethylphosphoric acid amide group and a phenylphosphoric acid amide group), a hydroxy group, a mercapto group, a halogen atom (such as a fluorine atom, a chlorine atom, a bromine atom, and an iodine atom), a cyano group, a nitro group, a hydroxamic acid group, a sulfino group, a hydrazino group, an imino group, an azo group, a heterocyclic group (preferably a heterocyclic group having 1 to 30 carbon atoms and more preferably a heterocyclic group having 1 to 12 carbon atoms, and examples thereof include a heterocyclic group having a heteroatom such as a nitrogen atom, an oxygen atom, or a sulfur atom, and examples of the heterocyclic group having a heteroatom include an epoxy group, an oxetanyl group, an imidazolyl group, a pyridyl group, a quinolyl group, a furyl group, a piperidyl group, a morpholino group, a maleimide group, a benzoxazolyl group, a benzimidazolyl group, and a benzothiazolyl group), a silyl group (preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group), a carboxy group, a sulfonic acid group, and a phosphoric acid group.

[Light Absorption Anisotropic Film]

The light absorption anisotropic film according to the embodiment of the present invention is a light absorption anisotropic film used for an image display device formed of a liquid crystal composition containing a liquid crystal compound and a dichroic substance.

Further, in a signal derived from the dichroic substance detected by time-of-flight secondary ion mass spectrometry (TOF-SIMS), the light absorption anisotropic film according to the embodiment of the present invention is formed such that a relationship between a maximum intensity Imax of the light absorption anisotropic film in a thickness direction and an intensity Isur1 in a surface of the light absorption anisotropic film on a viewing side of the image display device (hereinafter, also simply referred to as "viewing-side surface") satisfies Expression (I-1).

$$2.0 \leq Imax/Isur1 \quad (I-1)$$

<Method of Measuring TOF-SIMS>

In the present invention, the measurement using TOF-SIMS is performed in the following manner.

(1) Device and Conditions

Device: TOF-SIMS 5 (manufactured by ION-TOF)

Depth direction analysis: combined with Ar ion sputtering

Measurement range: Raster scan on 128 points in one direction and 128 points in a direction orthogonal to the one direction Polarity: posi, nega (2) Intensity Isur1 and Maximum Intensity Imax The intensity of each of the following regions in the light absorption anisotropic film which is an object to be measured, is measured in a case where an area from the viewing-side surface of the light absorption anisotropic film to the surface on a side opposite to the viewing-side surface is measured in the thickness direction at a constant speed.

(Intensity Isur1)

The average value (average value of the intensities from the baseline) of the intensities of the fragments derived from the dichroic substance based on the mass spectrometry in a region of 1% from the viewing-side surface of the light absorption anisotropic film is defined as the intensity Isur1 in the viewing-side surface.

(Maximum Intensity Imax)

The maximum value of the intensity (intensity from baseline) of the fragment derived from the dichroic substance based on the mass spectrometry in a region of 98% of the total thickness excluding a portion of 1% of the total thickness from each surface is defined as the maximum intensity Imax in the thickness direction.

(3) In Regard to Object to be Measured

In a case where the light absorption anisotropic film which is an object to be measured is present in a form of a laminate having an adjacent layer, the viewing-side surface (that is, an interface with the adjacent layer) of the light absorption anisotropic film described above can be specified in terms that the intensity of a fragment derived from a liquid crystal compound detected from the light absorption anisotropic film based on the mass spectrometry and the intensity of a fragment derived from the largest amount of compound based on the mass spectrometry among fragments detected from the adjacent layer intersect with each other.

Further, the intensity of a fragment derived from the dichroic substance (hereinafter, also referred to as "measurement object dichroic substance" in this paragraph) having a maximal absorption wavelength in a wavelength range of 500 to 650 nm is measured based on the mass spectrometry in a case where the light absorption anisotropic film contains two or more kinds of dichroic substances, and the intensity of a fragment derived from the dichroic substance having the largest absorbance among the measurement object dichroic substances is measured based on the mass spectrometry in a case where the light absorption anisotropic film contains two or more kinds of measurement object dichroic substances.

In the present invention, as described above, an image display device with excellent display performance and excellent durability can be prepared by reducing the amount of the dichroic substance present in the viewing-side surface of the light absorption anisotropic film, that is, by allowing the relationship between the maximum intensity Imax of the light absorption anisotropic film in the thickness direction and the intensity Isur1 in the viewing-side surface to satisfy Expression (I-1) in the signal derived from the dichroic substance detected by TOF-SIMS.

Although the details of the reason are not yet clear, the present inventors assume that the reason is as follows.

First, the present inventors speculated that the display performance in the related art is degraded because the refractive index of the dichroic substance present in the viewing-side surface of the light absorption anisotropic film is high and this causes internal reflection at the interface between the light absorption anisotropic film and the adjacent layer on the viewing side.

Further, the present inventors speculated that the durability in the related art is degraded because the dichroic substance present in the viewing-side surface of the light absorption anisotropic film is transitioned to the adjacent layer of the light absorption anisotropic film depending on the kind of the adjacent layer on the viewing side.

Therefore, in the present invention, it is considered that an image display device with excellent display performance and excellent durability can be prepared because Expression (I-1) is satisfied, and thus the amount of the dichroic substance present on the viewing-side surface of the light absorption anisotropic film is reduced, the internal reflection at the interface between the light absorption anisotropic film and the adjacent layer is suppressed, and the transition of the dichroic substance to the adjacent layer is suppressed.

In addition, in the present invention, since the relationship between the maximum intensity Imax of the light absorption anisotropic film in the thickness direction and the intensity Isur1 in the viewing-side surface satisfies Expression (I-1) in the signal derived from the dichroic substance detected by TOF-SIMS, the display performance and the durability are enhanced even in a case where a refractive index adjusting layer or a barrier layer (oxygen blocking layer) is not separately provided, and thus the thickness of the image display device can be reduced.

In the present invention, as is clear from the fact that the upper limit of the ratio (Imax/Isur1) of the maximum intensity Imax to the intensity Isur1 is not specified, Expression (I-1) includes an aspect in which the maximum intensity Imax is significantly measured, and the intensity Isur1 is less than or equal to the measurement limit.

Further, in consideration of the reason why the display performance and the durability of the image display device are enhanced, the relationship between the maximum intensity Imax in the thickness direction of the light absorption anisotropic film and the intensity Isur1 in the viewing-side surface of the light absorption anisotropic film satisfies preferably Expression (I-2) and more preferably Expression (I-3).

$$5 \leq \text{Imax/Isur1} \qquad (I-2)$$

$$20 < \text{Imax/Isur1} \leq 100 \qquad (I-3)$$

In the present invention, in consideration of the reason why the display performance and the durability of the image display device are enhanced, the thickness between the viewing-side surface of the light absorption anisotropic film and the position where the maximum intensity Imax is exhibited is preferably greater than 50 nm (hereinafter, also referred to as "gradient thickness"), more preferably greater than 60 nm, and still more preferably greater than 60 nm and less than 300 nm.

Here, "gradient thickness" is a value obtained by measuring the maximum intensity Imax using a measuring method based on TOF-SIMS described above and performing calculation according to the following procedures.

(1) A scan time X from the viewing-side surface of the light absorption anisotropic film to the surface on a side opposite to the viewing-side surface in the entire film thickness direction is measured.

(2) A scan time Y from the viewing-side surface of the light absorption anisotropic film to the position where the maximum intensity Imax is exhibited is measured.

(3) A total thickness Z (nm) of the light absorption anisotropic film is measured using a scanning electron microscope (SEM) or the like.

(4) The gradient thickness (nm) is calculated by the following equation.

Gradient thickness (nm)=$Z$ (nm)×($Y/X$)

[Liquid Crystal Composition]

Hereinafter, each component contained in the liquid crystal composition used for forming the light absorption anisotropic film according to the embodiment of the present invention will be described in detail.

<Liquid Crystal Compound>

As the liquid crystal compound contained in the liquid crystal composition, both a polymer liquid crystal compound and a low-molecular-weight liquid crystal compound can be used, and a polymer liquid crystal compound is preferably used from the viewpoint of increasing the alignment degree.

Here, "polymer liquid crystal compound" denotes a liquid crystal compound having a repeating unit in the chemical structure.

Here, "low-molecular-weight liquid crystal compound" denotes a liquid crystal compound having no repeating units in the chemical structure.

Examples of the polymer liquid crystal compound include thermotropic liquid crystal polymers described in JP2011-237513A and polymer liquid crystal compounds described in paragraphs [0012] to [0042] of WO2018/199096A.

Examples of the low-molecular-weight liquid crystal compound include liquid crystal compounds described in paragraphs [0072] to [0088] of JP2013-228706A. Among these, a liquid crystal compound exhibiting smectic properties is preferable.

Further, as the liquid crystal compound, a polymer liquid crystal compound and a low-molecular-weight liquid crystal compound may be used in combination.

From the viewpoint of further improving the alignment degree of the light absorption anisotropic film to be obtained, it is preferable that the liquid crystal compound is a polymer liquid crystal compound having a repeating unit represented by Formula (1) (hereinafter, also referred to as "repeating unit (1)").

In the following description, the expression "alignment degree of the light absorption anisotropic film to be obtained further increases" is also referred to as "effects of the present invention are more excellent".

In Formula (1), P1 represents the main chain of the repeating unit, L1 represents a single bond or a divalent linking group, SP1 represents a spacer group, M1 represents a mesogen group, and T1 represents a terminal group.

Specific examples of the main chain of the repeating unit represented by P1 include groups represented by Formulae (P1-A) to (P1-D). Among these, from the viewpoints of diversity and ease of handling of a monomer serving as a raw material, a group represented by Formula (P1-A) is preferable.

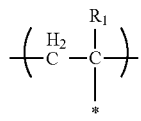

(P1-A)

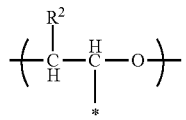

(P1-B)

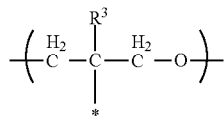

(P1-C)

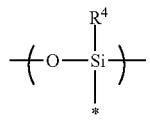

(P1-D)

In Formulae (P1-A) to (P1-D), "*" represents a bonding position with respect to L1 in Formula (1).

In Formulae (P1-A) to (P1-D), $R^1$, $R^2$, $R^3$, and $R^4$ each independently represent a hydrogen atom, a halogen atom, a cyano group, an alkyl group having 1 to 10 carbon atoms, or an alkoxy group having 1 to 10 carbon atoms. The alkyl group may be a linear or branched alkyl group or an alkyl group having a cyclic structure (cycloalkyl group). Further, the number of carbon atoms of the alkyl group is preferably in a range of 1 to 5.

It is preferable that the group represented by Formula (P1-A) is a unit of a partial structure of poly(meth)acrylic acid ester obtained by polymerization of (meth)acrylic acid ester.

It is preferable that the group represented by Formula (P1-B) is an ethylene glycol unit formed by ring-opening polymerization of an epoxy group of a compound containing the epoxy group.

It is preferable that the group represented by Formula (P1-C) is a propylene glycol unit formed by ring-opening polymerization of an oxetane group of a compound containing the oxetane group.

It is preferable that the group represented by Formula (P1-D) is a siloxane unit of a polysiloxane obtained by polycondensation of a compound containing at least one of an alkoxysilyl group or a silanol group. Here, examples of the compound containing at least one of an alkoxysilyl group or a silanol group include a compound containing a group represented by Formula $SiR^{14}(OR^{15})_2$—. In the formula, $R^{14}$ has the same definition as that for $R^{14}$ in (P1-D), and a plurality of $R^{15}$'s each independently represent a hydrogen atom or an alkyl group having 1 to 10 carbon atoms.

In Formula (1), L1 represents a single bond or a divalent linking group.

Examples of the divalent linking group represented by L1 include —C(O)O—, —OC(O)—, —O—, —S—, —C(O)NR$^3$—, —NR$^3$C(O)—, —SO$_2$—, and —NR$^3$R$^4$—. In the formulae, $R^3$ and $R^4$ each independently represent a hydrogen atom or an alkyl group having 1 to 6 carbon atoms which may have a substituent.

In a case where P1 represents a group represented by Formula (P1-A), from the viewpoint that the effects of the present invention are more excellent, it is preferable that L1 represents a group represented by —C(O)O—.

In a case where P1 represents a group represented by any of Formulae (P1-B) to (P1-D), from the viewpoint that the effects of the present invention are more excellent, it is preferable that L1 represents a single bond.

In Formula (1), from the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

Here, as the oxyethylene structure represented by SP1, a group represented by *—(CH$_2$—CH$_2$O)$_{n1}$—* is preferable. In the formula, n1 represents an integer of 1 to 20, and "*" represents a bonding position with respect to L1 or M1 in Formula (1). From the viewpoint that the effects of the present invention are more excellent, n1 represents preferably an integer of 2 to 10, more preferably an integer of 2 to 4, and most preferably 3.

Further, from the viewpoint that the effects of the present invention are more excellent, a group represented by *—(CH(CH$_3$)—CH$_2$O)$_{n2}$—* is preferable as the oxypropylene structure represented by SP1. In the formula, n2 represents an integer of 1 to 3, and "*" represents a bonding position with respect to L1 or M1.

Further, from the viewpoint that the effects of the present invention are more excellent, a group represented by *—(Si(CH$_3$)$_2$—O)$_{n3}$—* is preferable as the polysiloxane structure represented by SP1. In the formula, n3 represents an integer of 6 to 10, and "*" represents a bonding position with respect to L1 or M1.

Further, from the viewpoint that the effects of the present invention are more excellent, a group represented by *—(CF$_2$—CF$_2$)$_{n4}$—* is preferable as the alkylene fluoride structure represented by SP1. In the formula, n4 represents an integer of 6 to 10, and "*" represents a bonding position with respect to L1 or M1.

In Formula (1), the mesogen group represented by M1 is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited and for example, particularly description on pages 7 to 16 of "FlussigeKristalle in Tabellen II" (VEB Deutsche Verlag fur Grundstoff Industrie, Leipzig, 1984) and particularly the description in Chapter 3 of "Liquid Crystal Handbook" (Maruzen, 2000) edited by Liquid Crystals Handbook Editing Committee can be referred to.

As the mesogen group, for example, a group having at least one cyclic structure selected from the group consisting of an aromatic hydrocarbon group, a heterocyclic group, and an alicyclic group is preferable.

From the viewpoint that the effects of the present invention are more excellent, the mesogen group contains preferably an aromatic hydrocarbon group, more preferably 2 to 4 aromatic hydrocarbon groups, and still more preferably 3 aromatic hydrocarbon groups.

From the viewpoints of exhibiting the liquid crystallinity, adjusting the liquid crystal phase transition temperature, and the availability of raw materials and synthetic suitability and from the viewpoint that the effects of the present invention are more excellent, as the mesogen group, a group represented by Formula (M1-A) or Formula (M1-B) is preferable, and a group represented by Formula (M1-B) is more preferable.

In Formula (M1-A), A1 represents a divalent group selected from the group consisting of an aromatic hydrocarbon group, a heterocyclic group, and an alicyclic group. These groups may be substituted with an alkyl group, a fluorinated alkyl group, an alkoxy group, or a substituent.

It is preferable that the divalent group represented by A1 is a 4- to 6-membered ring. Further, the divalent group represented by A1 may be a monocycle or a fused ring.

Further, "*" represents a bonding position with respect to SP1 or T1.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable, and a phenylene group is more preferable.

The divalent heterocyclic group represented by A1 may be any of aromatic or non-aromatic, but a divalent aromatic heterocyclic group is preferable as the divalent heterocyclic group from the viewpoint of further improving the alignment degree.

The atoms other than carbon constituting the divalent aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 represents 2 or greater, a plurality of A1's may be the same as or different from each other.

In Formula (M1-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (M1-A), and thus description thereof will not be repeated.

In Formula (M1-B), a2 represents an integer of 1 to 10. In a case where a2 represents 2 or greater, a plurality of A2's may be the same as or different from each other, a plurality of A3's may be the same as or different from each other, and a plurality of LA1's may be the same as or different from each other. From the viewpoint that the effects of the present invention are more excellent, a2 represents preferably an integer of 2 or greater and more preferably 2.

In Formula (M1-B), in a case where a2 represents 1, LA1 represents a divalent linking group. In a case where a2 represents 2 or greater, a plurality of LA1's each independently represent a single bond or a divalent linking group, and at least one of the plurality of LA1's is a divalent linking group. In a case where a2 represents 2, from the viewpoint that the effects of the present invention are more excellent, it is preferable that one of the two LA1's represents a divalent linking group and the other represents a single bond.

In Formula (M1-B), examples of the divalent linking group represented by LA1 include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Among these, from the viewpoint that the effects of the present invention are more excellent, —C(O)O— is preferable. LA1 may represent a group obtained by combining two or more of these groups.

Specific examples of M1 include the following structures. In the following specific examples, "Ac" represents an acetyl group.

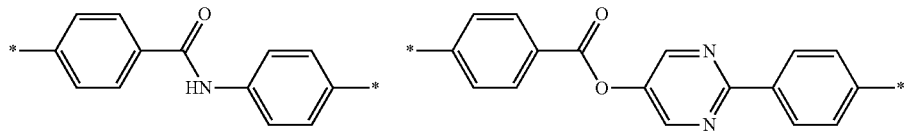

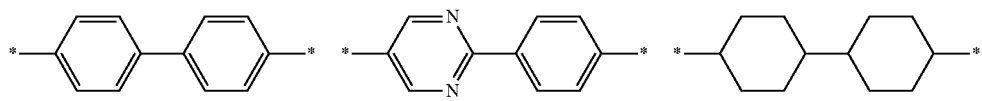

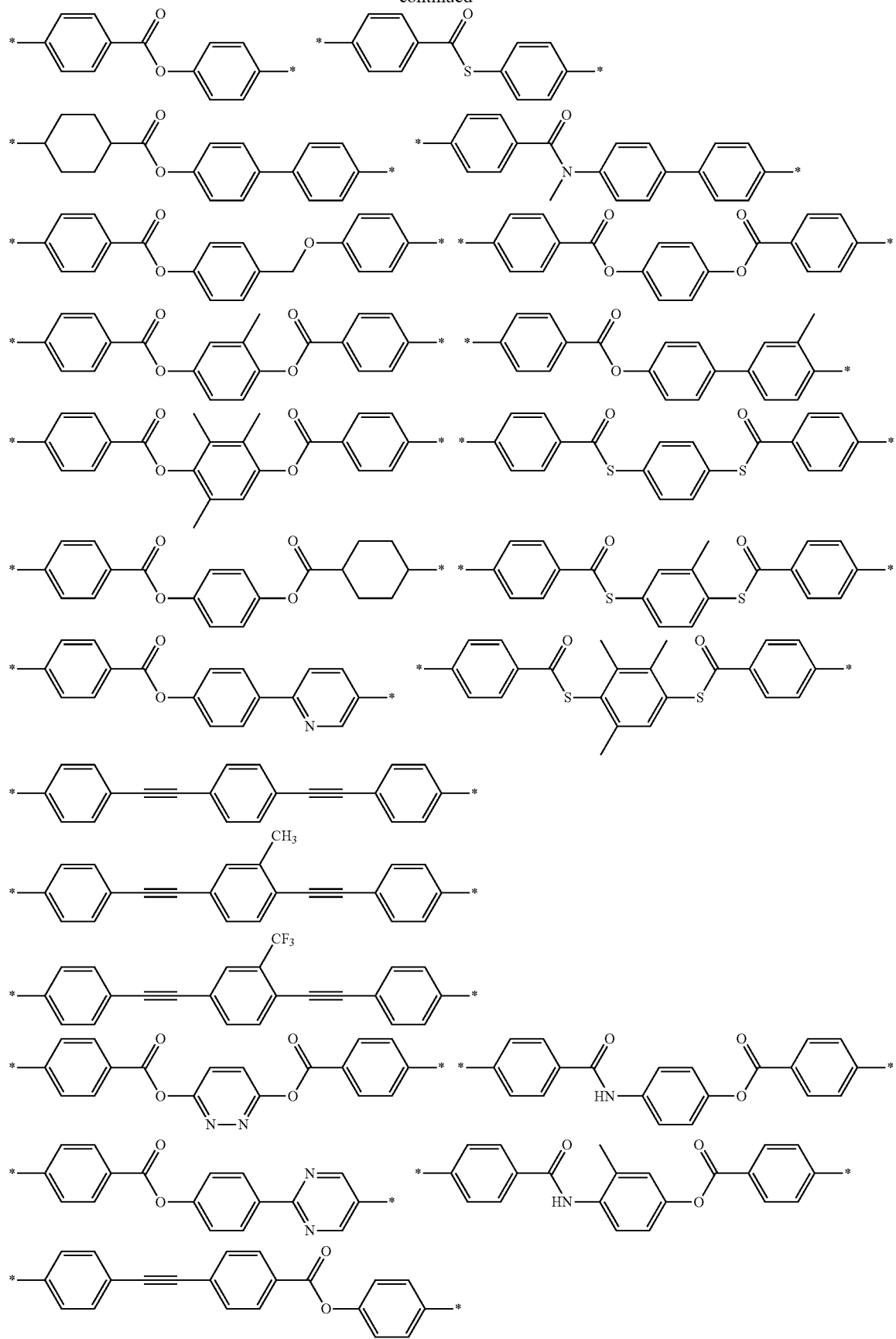

-continued
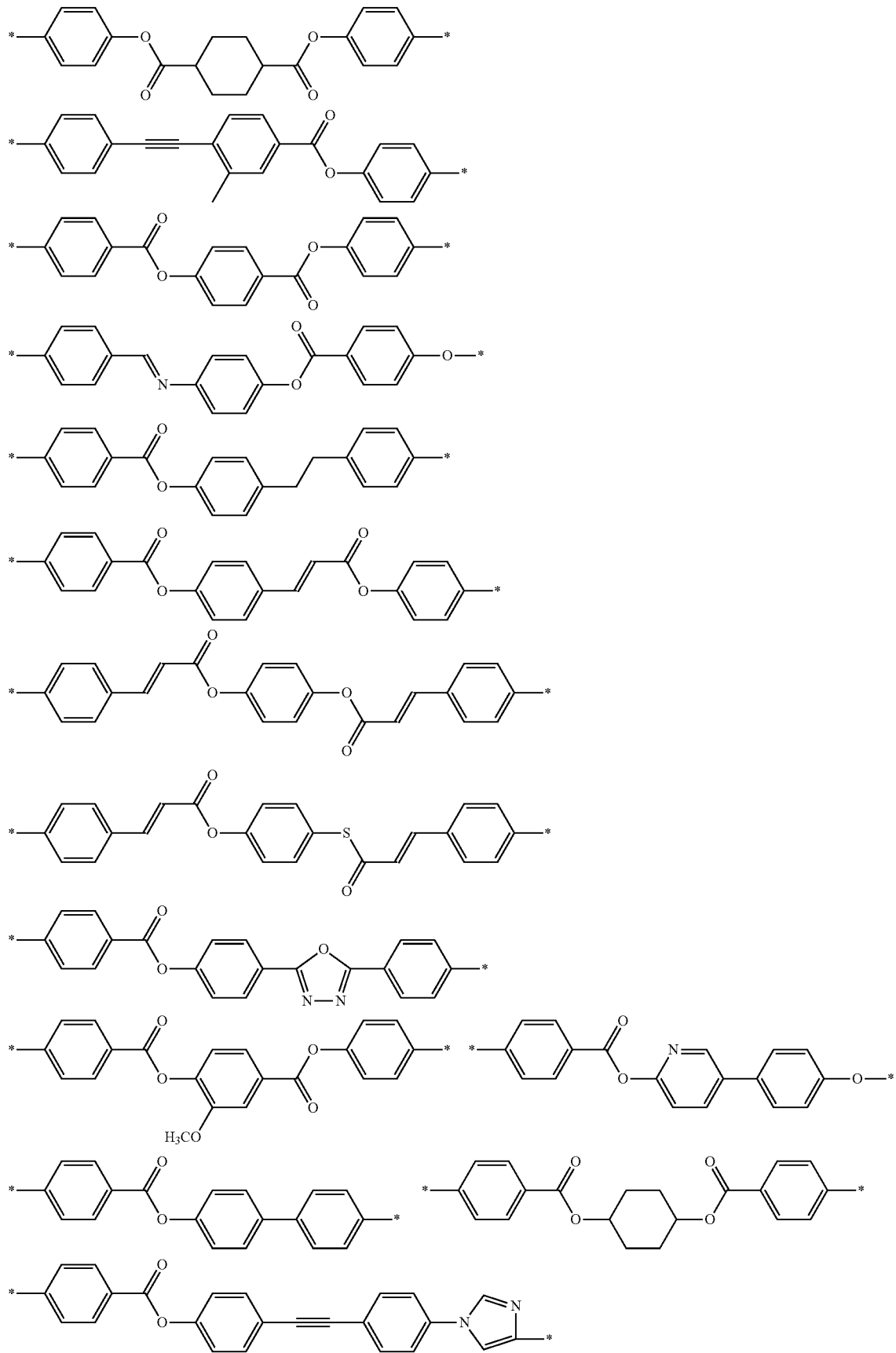

-continued
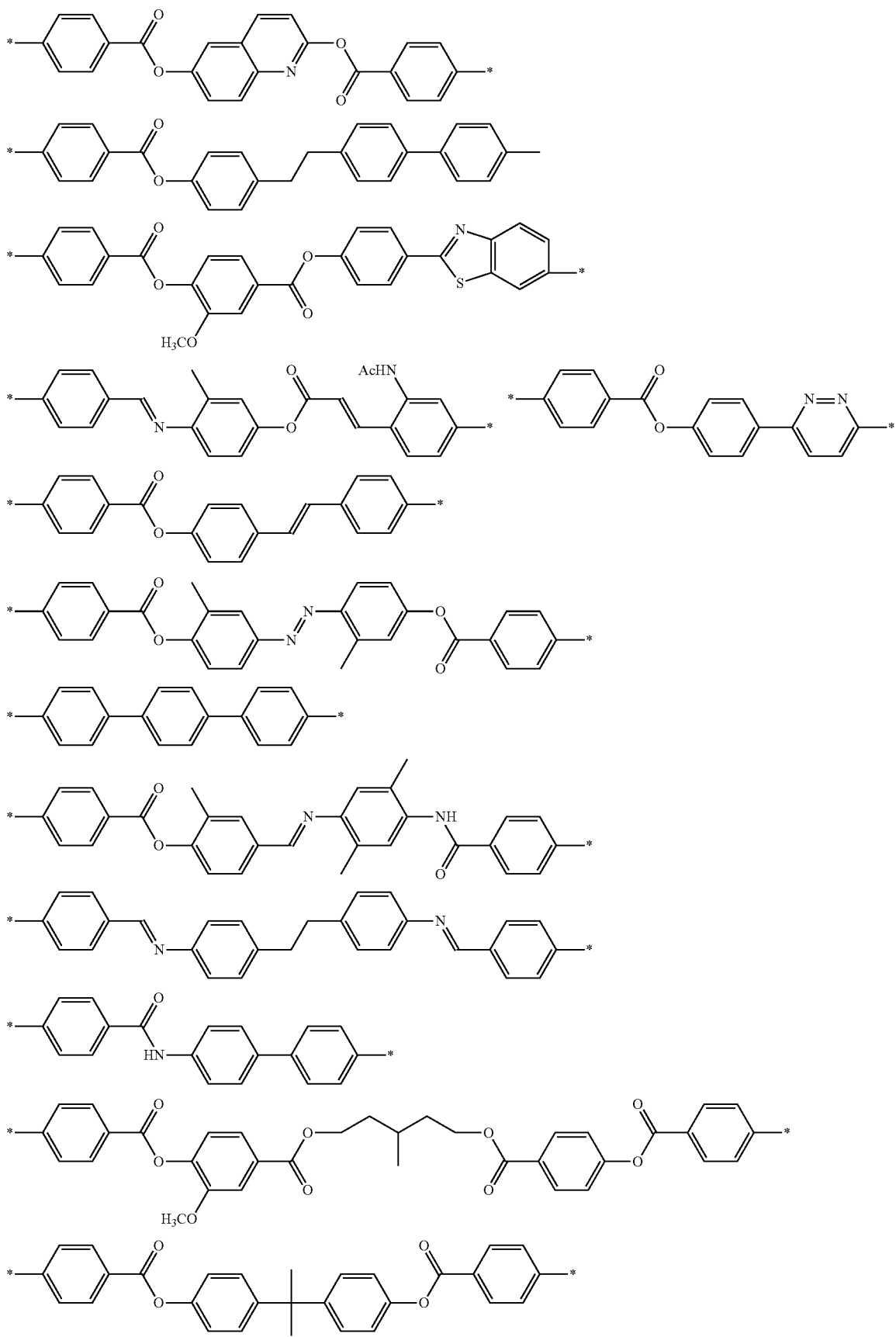

-continued
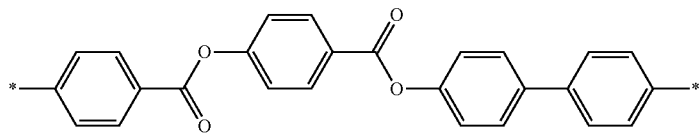
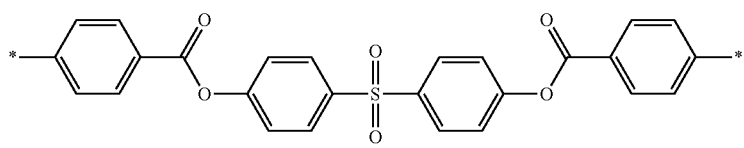
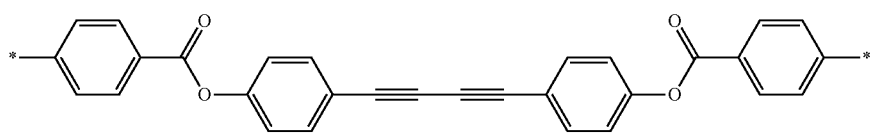
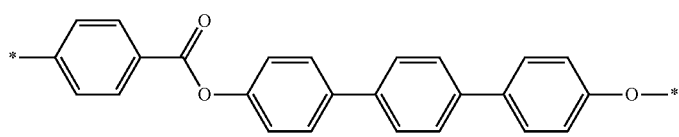
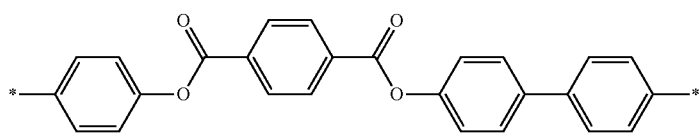
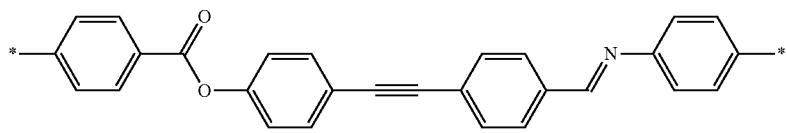
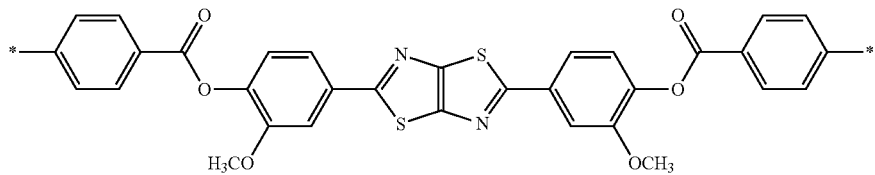
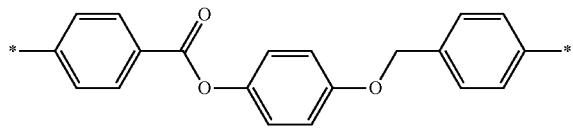
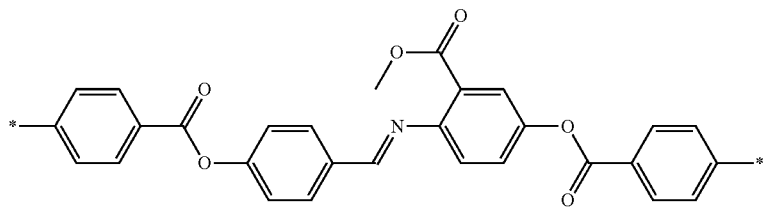
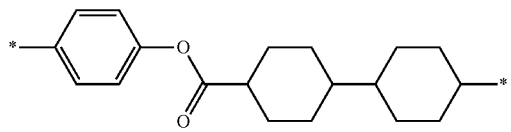
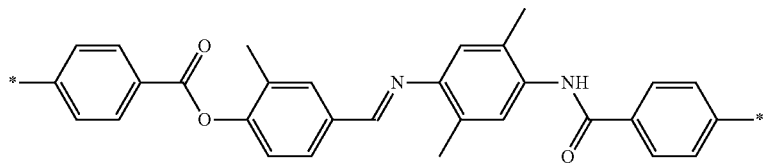

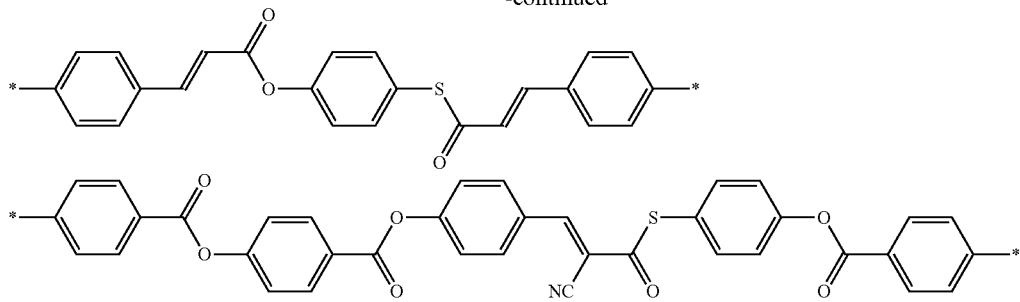

In Formula (1), examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group having 1 to 10 carbon atoms (ROC(O)—: R represents an alkyl group), an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group. Specific examples of the linking group are the same as those for L1 and SP1 described above. A represents a (meth)acryloyloxy group).

From the viewpoint that the effects of the present invention are more excellent, T1 represents preferably an alkoxy group having 1 to 10 carbon atoms, more preferably an alkoxy group having 1 to 5 carbon atoms, and still more preferably a methoxy group.

These terminal groups may be further substituted with these groups or the polymerizable groups described in JP2010-244038A.

From the viewpoint of further enhancing the adhesiveness of the film to the adjacent layer and improving the adhesive strength of the film, it is preferable that T1 represents a polymerizable group.

Here, the polymerizable group is not particularly limited, but a polymerizable group capable of radical polymerization or cationic polymerization is preferable.

As the radically polymerizable group, a generally known radically polymerizable group can be used, and suitable examples thereof include an acryloyl group and a methacryloyl group. In this case, since the acryloyl group is generally known to have a higher polymerization rate, the acryloyl group is preferable from the viewpoint of improving the productivity, but the methacryloyl group can also be used as the polymerizable group.

As the cationically polymerizable group, a generally known cationically polymerizable group can be used, and specific examples thereof include an alicyclic ether group, a cyclic acetal group, a cyclic lactone group, a cyclic thioether group, a spiroorthoester group, and a vinyloxy group. Among these, an alicyclic ether group or a vinyloxy group is suitable, and an epoxy group, an oxetanyl group, or a vinyloxy group is particularly preferable.

From the viewpoint that the effects of the present invention are more excellent, the weight-average molecular weight (Mw) of the polymer liquid crystal compound having a repeating unit represented by Formula (1) is preferably in a range of 1000 to 500000 and more preferably in a range of 2000 to 300000. In a case where the Mw of the polymer liquid crystal compound is in the above-described range, the polymer liquid crystal compound is easily handled.

In particular, from the viewpoint of suppressing cracking during the coating, the weight-average molecular weight (Mw) of the polymer liquid crystal compound is preferably 10000 or greater and more preferably in a range of 10000 to 300000.

In addition, from the viewpoint of the temperature latitude of the alignment degree, the weight-average molecular weight (Mw) of the polymer liquid crystal compound is preferably less than 10000 and preferably 2000 or greater and less than 10000.

Here, the weight-average molecular weight and the number average molecular weight in the present invention are values measured according to gel permeation chromatography (GPC).

Solvent (eluent): N-methylpyrrolidone
Equipment name: TOSOH HLC-8220GPC
Column: Connect and use three of TOSOH TSKgel Super AWM-H (6 mm×15 cm)
Column temperature: 25° C.
Sample concentration: 0.1% by mass
Flow rate: 0.35 mL/min
Calibration curve: TSK standard polystyrene (manufactured by TOSOH Corporation), calibration curves of 7 samples with Mw of 2800000 to 1050 (Mw/Mn=1.03 to 1.06) are used.

In the present invention, from the viewpoint that the compatibility with the dichroic substance described below is easily adjusted, the log P value of the liquid crystal compound is preferably in a range of 0.0 to 10, more preferably in a range of 1.0 to 7.0, and still more preferably in a range of 2.0 to 5.0.

Here, the log P value is an index for expressing the properties of the hydrophilicity and hydrophobicity of a chemical structure and is also referred to as a hydrophilic-hydrophobic parameter. The log P value can be calculated using software such as ChemBioDrawUltra or HSPiP (Ver. 4.1.07). Further, the log P value can be acquired experimentally by the method of the OECD Guidelines for the Testing of Chemicals, Sections 1, Test No. 117 or the like. In the present invention, a value calculated by inputting the structural formula of a compound to HSPiP (Ver. 4.1.07) is employed as the log P value unless otherwise specified.

In the present invention, the content of the liquid crystal compound is preferably in a range of 8% to 99% by mass and more preferably in a range of 8% to 96% by mass with respect to the solid content of the liquid crystal composition.

Here, "solid content in the liquid crystal composition" denotes components from which solvents are removed, and specific examples of the solid content include the liquid crystal compound, and a dichroic substance, a polymerization initiator, a surfactant described below.

<Dichroic Substance>

The dichroic substance contained in the liquid crystal composition is not particularly limited, and examples thereof include a visible light absorbing substance (dichroic coloring agent), a light emitting substance (such as a fluorescent substance or a phosphorescent substance), an ultraviolet absorbing substance, an infrared absorbing substance, a non-linear optical substance, a carbon nanotube, and an inorganic substance (for example, a quantum rod). Further, known dichroic substances (dichroic coloring agents) of the related art can be used.

Specific examples thereof include those described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-14883A, paragraphs [0012] to [0029] of JP2013-109090A, paragraphs [0009] to [0017] of JP2013-101328A, paragraphs [0051] to [0065] of JP2013-37353A, paragraphs [0049] to [0073] of JP2012-63387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0005] to [0051] of JP2016-006502, paragraphs [0005] to [0041] of WO2016/060173A, paragraphs [0008] to [0062] of WO2016/136561A, paragraphs [0014] to [0033] of WO2017/154835A, paragraphs [0014] to [0033] of WO2017/154695A, paragraphs [0013] to [0037] of WO2017/195833A, and paragraphs [0014] to [0034] of WO2018/164252A.

In the present invention, two or more kinds of dichroic substances may be used in combination. For example, from the viewpoint of making the color of the light absorption anisotropic film to be obtained closer to black, it is preferable that at least one dichroic substance having a maximal absorption wavelength in a wavelength range of 370 nm or greater and less than 500 nm and at least one dichroic substance having a maximal absorption wavelength in a wavelength range of 500 nm or greater and less than 700 nm are used in combination.

The dichroic substance may contain a crosslinkable group.

Specific examples of the crosslinkable group include a (meth)acryloyl group, an epoxy group, an oxetanyl group, and a styryl group. Among these, a (meth)acryloyl group is preferable.

In the present invention, from the viewpoint of further enhancing the display performance and the durability of the image display device, a difference between the log P value of the dichroic substance and the log P value of the liquid crystal compound is preferably 5.0 or greater, more preferably 7.0 or greater, and still more preferably 7.0 or greater and less than 10.0. Here, in a case a plurality of dichroic substances or a plurality of liquid crystal compounds are used, the difference (absolute value) between the log P value of the dichroic substance and the log P value of the liquid crystal compound denotes the maximum difference from among differences calculated from log P values of the compounds.

From the viewpoint that the effects of the present invention are more excellent, the content of the dichroic substance is preferably in a range of 1 to 400 parts by mass, more preferably in a range of 2 to 100 parts by mass, and still more preferably in a range of 5 to 30 parts by mass with respect to 100 parts by mass of the liquid crystal compound.

Further, the content of the dichroic substance is preferably in a range of 1% to 50% by mass and more preferably in a range of 2% to 40% by mass with respect to the solid content in the liquid crystal composition.

<Polymerization Initiator>

It is preferable that the liquid crystal composition contains a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), o-acyloxime compounds (paragraph [0065] of JP2016-27384A), and acylphosphine oxide compounds (JP1988-40799B (JP-S63-40799B), JP1993-29234B (JP-H05-29234B), JP1998-95788A (JP-H10-95788A), and JP1998-29997A (JP-H10-29997A)).

Commercially available products can also be used as such a photopolymerization initiator, and examples thereof include IRGACURE 184, IRGACURE 907, IRGACURE 369, IRGACURE 651, IRGACURE 819, IRGACURE OXE-01, and IRGACURE OXE-02 (all manufactured by BASF SE).

In a case where the liquid crystal composition contains a polymerization initiator, the content of the polymerization initiator is preferably in a range of 0.01 to 30 parts by mass and more preferably in a range of 0.1 to 15 parts by mass with respect to 100 parts by mass which is the total amount of the dichroic substance and the liquid crystal compound in the liquid crystal composition. The durability of the light absorption anisotropic film is enhanced in a case where the content of the polymerization initiator is 0.01 parts by mass or greater, and the alignment degree of the light absorption anisotropic film is enhanced in a case where the content thereof is 30 parts by mass or less.

The polymerization initiator may be used alone or in combination of two or more kinds thereof. In a case where the composition contains two or more kinds of polymerization initiators, it is preferable that the total amount of the polymerization initiators is in the above-described ranges.

<Surfactant>

It is preferable that the liquid crystal composition contains a surfactant.

In a case where the liquid crystal composition contains a surfactant, the smoothness of the coated surface is improved, the alignment degree is further improved, and cissing and unevenness are suppressed so that the in-plane uniformity is expected to be improved.

As the surfactant, surfactants that allow dichroic substances and liquid crystal compounds to be horizontally aligned on the coated surface side are preferable, and examples thereof include the compounds described in paragraphs [0155] to [0170] of WO2016/009648A and the compounds (horizontal alignment agents) described in paragraphs [0253] to [0293] of JP2011-237513A.

The surfactant contained in the liquid crystal composition according to the embodiment of the present invention may be a fluorine-containing polymer having a repeating structure B1 represented by Formula (B-1) and a repeating structure B2 having a fluorine atom.

(Repeating Structure B1)

The repeating structure B1 of the fluorine-containing polymer is a repeating structure represented by Formula (B-1).

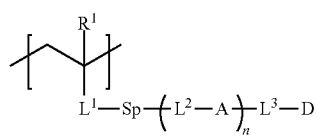

(B-1)

In Formula (B-1), $R^1$ represents a hydrogen atom, an alkyl group having 1 to 5 carbon atoms, or a halogen atom.

Further, $L^1$ represents a single bond or —CO—.

In addition, Sp represents a linear or branched divalent hydrocarbon group having 1 to 20 carbon atoms. Here, one or two or more —CH$_2$—'s that are not adjacent to each other among —CH$_2$—'s constituting a part of a hydrocarbon group may be each independently substituted with —O—, —S—, —NH—, or —N(Q)-, and Q represents a substituent.

$L^2$ and $L^3$ each independently represent a single bond or a divalent linking group.

$R^1$ in Formula (B-1) represents preferably a hydrogen atom or an alkyl group having 1 to 5 carbon atoms and more preferably a hydrogen atom or a methyl group.

It is preferable that $L^1$ in Formula (B-1) represents —CO—.

Examples of the linear or branched divalent hydrocarbon group having 1 to 20 carbon atoms represented by Sp in Formula (B-1) include a linear or branched divalent aliphatic hydrocarbon group having 1 to 20 carbon atoms, a divalent alicyclic hydrocarbon group having 3 to 20 carbon atoms, a divalent aromatic hydrocarbon group having 6 to 20 carbon atoms, and a divalent aromatic heterocyclic group having 6 to 20 carbon atoms. Among these, a linear or branched divalent aliphatic hydrocarbon group having 1 to 20 carbon atoms is preferable.

Here, as the divalent aliphatic hydrocarbon group having 1 to 20 carbon atoms, an alkylene group having 1 to 15 carbon atoms is preferable, and an alkylene group having 1 to 8 carbon atoms is more preferable, and specific suitable examples thereof include a methylene group, an ethylene group, a propylene group, a butylene group, a pentylene group, a hexylene group, a methylhexylene group, and a heptylene group.

As described above, one or two or more —CH$_2$—'s that are not adjacent to each other among —CH$_2$-'s constituting a part of a linear or branched divalent hydrocarbon group having 1 to 20 carbon atoms as SP may be each independently substituted with —O—, —S—, —NH—, or —N(Q)-. Further, examples of the substituent represented by Q include the above-described substituent W. Among these, an alkyl group, an alkoxy group, or a halogen atom is preferable.

Examples of the divalent linking group represented by one aspect of $L^2$ and $L^3$ in Formula (B-1) include —C(O)O—, —OC(O)—, —O—, —S—, —C(O)NR$^{L1}$—, —NR$^{L1}$C(O)—, —SO$_2$—, and —NR$^{L1}$R$^{L2}$—. In the formulae, $R^{L1}$ and $R^{L2}$ each independently represent a hydrogen atom or an alkyl group having 1 to 6 carbon atoms which may have a substituent. Further, examples of the substituent that the alkyl group having 1 to 6 carbon atoms may have include the above-described substituent W. Among these, an alkyl group, an alkoxy group, or a halogen atom is preferable.

In Formula (B-1), A represents a divalent linking group represented by any of Formulae (A-1) to (A-15). Here, "*" in Formulae (A-1) to (A-15) represents a bonding position with respect to $L^2$ or $L^3$, and the carbon atoms constituting the ring structures in Formulae (A-1) to (A-15) may be substituted with heteroatoms or may have substituents. In addition, examples of the substituents that the carbon atoms constituting the ring structures may have include the above-described substituent W. Among these, an alkyl group, an alkoxy group, or a halogen atom is preferable.

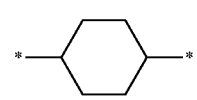

(A-1)

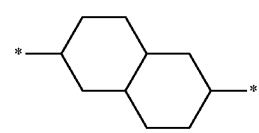

(A-2)

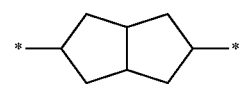

(A-3)

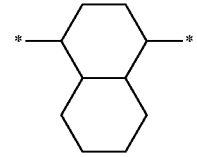

(A-4)

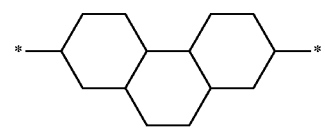

(A-5)

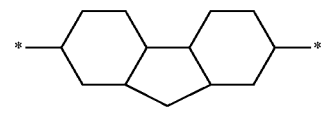

(A-6)

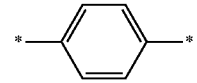

(A-7)

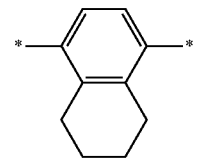

(A-8)

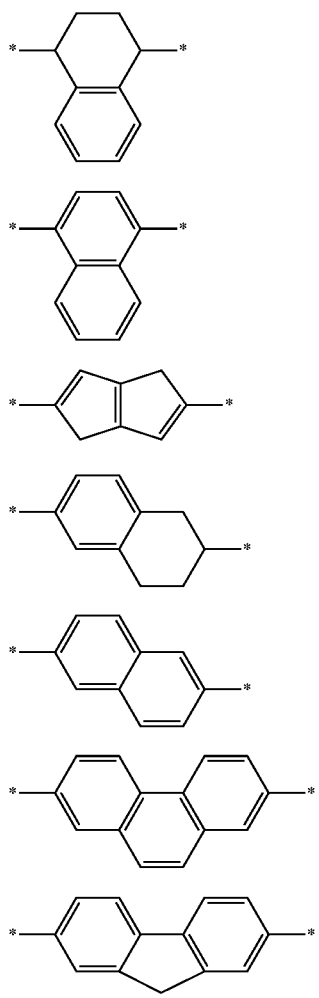

(A-9)
(A-10)
(A-11)
(A-12)
(A-13)
(A-14)
(A-15)

Specific examples of the divalent linking group represented by any of Formulae (A-1) to (A-15) include a 1,4-phenylene group, a 1,4-cyclohexylene group, a 1,4-cyclohexenyl group, a tetrahydropyran-2,5-diyl group, a 1,4-piperazine group, a 1,4-piperidine group, a 1,3-dioxane-2,5-diyl group, a tetrahydrothiopyran-2,5-diyl group, a 1,4-bicyclo(2,2,2)octylene group, a decahydronaphthalene-2,6-diyl group, a pyridine-2,5-diyl group, a pyrimidine-2,5-diyl group, a pyrazine-2,5-diyl group, a 1,2,3,4-tetrahydronaphthalene-2,6-diyl group, a 2,6-naphthylene group, a phenanthrene-2,7-diyl group, a 9,10-dihydrophenanthrene-2,7-diyl group, a 1,2,3,4,4a,9,10a-octahydrophenanthrene-2,7-diyl group, a 9-fluorenone-2,7-diyl group, a fluorene-2,7-diyl group, a thienothiophene-3,6-diyl group, a carbazole-3,6-diyl group, and a carbazole-2,7-diyl group.

In Formula (B-1), from the viewpoint of further increasing the alignment degree of the light absorption anisotropic film to be formed, A represents preferably a divalent linking group represented by any of Formulae (A-1), (A-4), (A-7), (A-10), and (A-13) and more preferably a divalent linking group represented by any of Formulae (A-7) and (A-13).

In Formula (B-1), D represents a hydrogen-bonding group formed of a hydrogen atom and a non-metal atom of Groups 14 to 16. Further, the non-metal atom may have a substituent.

Here, examples of the non-metal atoms of Groups 14 to 16 include an oxygen atom, a sulfur atom, a nitrogen atom, and a carbon atom.

Further, examples of the substituent that the non-metal atom (particularly, the nitrogen atom and the carbon atom) may have include a halogen atom, an alkyl group, an alkoxy group, an alkyl-substituted alkoxy group, a cyclic alkyl group, an aryl group (such as a phenyl group or a naphthyl group), a cyano group, an amino group, a nitro group, an alkylcarbonyl group, a sulfo group, and a hydroxyl group.

Examples of such a hydrogen-bonding group include a hydrogen bond-donating group and a hydrogen bond-accepting group.

Specific examples of the hydrogen bond-donating group include an amino group, an amide group, a urea group, a urethane group, a sulfonylamino group, a sulfo group, a phospho group, a hydroxy group, a mercapto group, a carboxyl group, a methylene group substituted with an electron withdrawing group, and a methine group substituted with electron withdrawing group. Among these, a carboxyl group or an amide group is preferable.

Specific examples of the hydrogen bond-accepting group include a heteroatom having an unshared electron pair on a heterocycle, a hydroxy group, an aldehyde, a ketone, a carboxyl group, carboxylic acid ester, carboxylic acid amide, a lactone, a lactam, sulfonic acid amide, a sulfo group, a phospho group, phosphoric acid amide, urethane, urea, an ether structure (particularly, a polymer structure having an oxygen atom contained in a polyether structure), an aliphatic amine, and an aromatic amine. Among these, a carboxyl group and an amide group are preferable.

(Repeating Structure B2)

The repeating structure B2 of the fluorine-containing polymer is a repeating structure having a fluorine atom.

In the present invention, from the viewpoint of further increasing the alignment degree of the light absorption anisotropic film to be formed, the content of the repeating structure B2 is preferably in a range of 15% to 90% by mass, more preferably in a range of 20% to 80% by mass, and still more preferably in a range of 30% to 70% by mass with respect to the total mass of the surfactant.

Further, the surfactant may have only one or two or more kinds of repeating structures B2. In a case where the surfactant has two or more kinds of repeating structures B2, the content of the repeating structures B2 is the total content of the repeating structure B2.

(Repeating Structure B3)

In the present invention, from the viewpoint of enhancing the upper layer coating properties with respect to the light absorption anisotropic film to be formed, it is preferable that the fluorine-containing polymer has a repeating structure B3 to be derived from a monomer having a molecular weight of 300 or less in addition to the repeating structures B1 and B2 described above.

From the viewpoint of enhancing the upper layer coating properties with respect to the light absorption anisotropic film to be formed, a repeating structure represented by Formula (N-1) is preferable as the repeating structure B3. It is preferable that the repeating structure B3 has a structure different from the repeating structure B2 described above and does not have a fluorine atom.

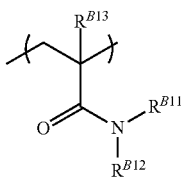

(N-1)

In Formula (N-1), $R^{B11}$ and $R^{B12}$ each independently represent a hydrogen atom or a substituent. However, in a case where $R^{B11}$ and $R^{B12}$ represent a substituent, $R^{B11}$ and $R^{B12}$ may be linked to each other to form a ring.

The total molecular weight of $R^{B11}$ and $R^{B12}$ is preferably 200 or less, more preferably 100 or less, and still more preferably 70 or less. In a case where the total molecular weight thereof is 100 or less, the interaction between the repeating structures B3 is further improved, and the compatibility between the surfactant and the liquid crystal molecule can be further decreased. In this manner, a light absorption anisotropic film having less alignment defects and an excellent alignment degree can be obtained.

The lower limit of the total molecular weight of $R^{B11}$ and $R^{B12}$ is preferably 2 or greater.

From the viewpoint that the effects of the present invention are more excellent, as the substituent represented by $R^{B11}$ and $R^{B12}$, an organic group is preferable, an organic group having 1 to 15 carbon atoms is more preferable, an organic group having 1 to 12 carbon atoms is still more preferable, and an organic group having 1 to 8 carbon atoms is particularly preferable.

Examples of the organic group include a linear, branched or cyclic alkyl group, an aromatic hydrocarbon group, and a heterocyclic group.

The number of carbon atoms of the alkyl group is preferably in a range of 1 to 15, more preferably in a range of 1 to 12, and still more preferably in a range of 1 to 8. The carbon atoms of the alkyl group may be substituted with —O—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —C(S)—, —S(O)—, —SO$_2$—, —(O)S(O)O—, —O(O)S(O)O—, —SC(O)—, —C(O)S—, or a group obtained by combining two or more of these groups. Among the groups which may be substituted with the carbon atoms of the alkyl group, from the viewpoint that the effects of the present invention are more excellent, —O—, —C(O)—, —N(Z)—, —OC(O)—, or —C(O)O— is preferable.

Further, the hydrogen atoms of the alkyl group may be substituted with a halogen atom, a cyano group, an aryl group, a nitro group, —OZ$^H$, —C(O)Z$^H$, C(O)OZ$^H$, —OC(O)Z$^H$, —OC(O)OZ$^H$—NZ$^H$Z$^{Hi}$, —NZ$^H$C(O)Z$^{Hi}$, —NZ$^H$C(O)OZ$^{Hi}$, —C(O)NZ$^H$Z$^{Hi}$, —OC(O)NZ$^H$Z$^{Hi}$, —NZ$^H$C(O)NZ$^{Hi}$OZ$^{Hiii}$, —SZ$^H$, —C(S)Z$^H$, —C(O)SZ$^H$, or —SC(O)Z$^H$. $Z^H$, $Z^{Hi}$, and $Z^{Hiii}$ each independently represent a hydrogen atom, a halogen atom, an alkyl group having 1 to 10 carbon atoms, a cyano group, or a nitro group. Among the groups which may be substituted with the hydrogen atoms of the alkyl group, from the viewpoint that the effects of the present invention are more excellent, —OH, —COOH, or an aryl group (preferably a phenyl group) is preferable.

Further, the hydrogen atoms of the aromatic hydrocarbon group and the hydrogen atoms of the heterocyclic group may be substituted with a halogen atom, a cyano group, an alkyl group having 1 to 10 carbon atoms, a nitro group, —OZ$^H$, —C(O)Z$^H$—, C(O)OZ$^H$, —OC(O)Z$^H$, —OC(O)OZ$^H$—NZ$^H$Z$^{Hi}$, —NZ$^H$C(O)Z$^{Hi}$, —NZ$^H$C(O)OZ$^{Hi}$, —C(O)NZ$^H$Z$^{Hi}$, —OC(O)NZ$^H$Z$^{Hi}$, —NZ$^H$C(O)NZ$^{Hi}$OZ$^{Hiii}$, —SZ$^H$, —C(S)Z$^H$, —C(O)SZ$^H$, —SC(O)Z$^H$, or —B(OH)$_2$. $Z^H$, $Z^{Hi}$, and $Z^{Hiii}$ each independently represent a hydrogen atom, a halogen atom, an alkyl group having 1 to 10 carbon atoms, a cyano group, or a nitro group. Among the groups which may be substituted with the hydrogen atoms of the aromatic hydrocarbon group and the hydrogen atoms of the heterocyclic group, from the viewpoint that the effects of the present invention are more excellent, —OH and —B(OH)$_2$ are preferable.

From the viewpoint that the effects of the present invention are more excellent, it is preferable that $R^{B11}$ and $R^{B12}$ each independently represent a hydrogen atom or an organic group having 1 to 15 carbon atoms. Preferred embodiments of the organic group are as described above.

From the viewpoint that the effects of the present invention are more excellent, at least one of $R^{B11}$ or $R^{B12}$ represents preferably a substituent and more preferably an organic group having 1 to 15 carbon atoms.

The ring formed by $R^{B11}$ and $R^{B12}$ being linked to each other is a heterocyclic ring having a nitrogen atom in Formula (N-1), and may further have heteroatoms such as an oxygen atom, a sulfur atom, and a nitrogen atom in the ring.

From the viewpoint that the effects of the present invention are more excellent, the ring formed by $R^{B11}$ and $R^{B12}$ being linked to each other is preferably a 4- to 8-membered ring, more preferably a 5- to 7-membered ring, and still more preferably a 5- or 6-membered ring.

From the viewpoint that the effects of the present invention are more excellent, the number of carbon atoms constituting the ring formed by $R^{B11}$ and $R^{B12}$ being linked to each other is preferably in a range of 3 to 7 and more preferably in a range of 3 to 6.

The ring formed by $R^{B11}$ and $R^{B12}$ being linked to each other may or may not have aromaticity, but it is preferable that the ring does not have aromaticity from the viewpoint that the effects of the present invention are more excellent.

Specific examples of the ring formed by $R^{B11}$ and $R^{B12}$ being linked to each other include the following groups.

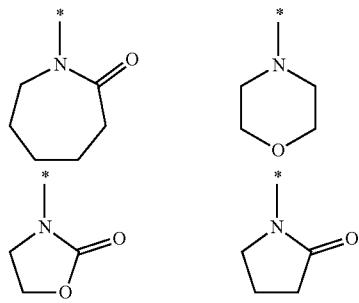

$R^{B13}$ represents a hydrogen atom, an alkyl group having 1 to 5 carbon atoms, a halogen atom, or a cyano group, preferably a hydrogen atom or an alkyl group having 1 to 5 carbon atoms, and more preferably a hydrogen atom.

The number of carbon atoms in the alkyl group is in a range of 1 to 5, preferably in a range of 1 to 3, and more preferably 1. The alkyl group may have a linear, branched, or cyclic structure.

Specific examples of the repeating structure B3 are shown below, but the repeating structure B3 is not limited to the following structures.

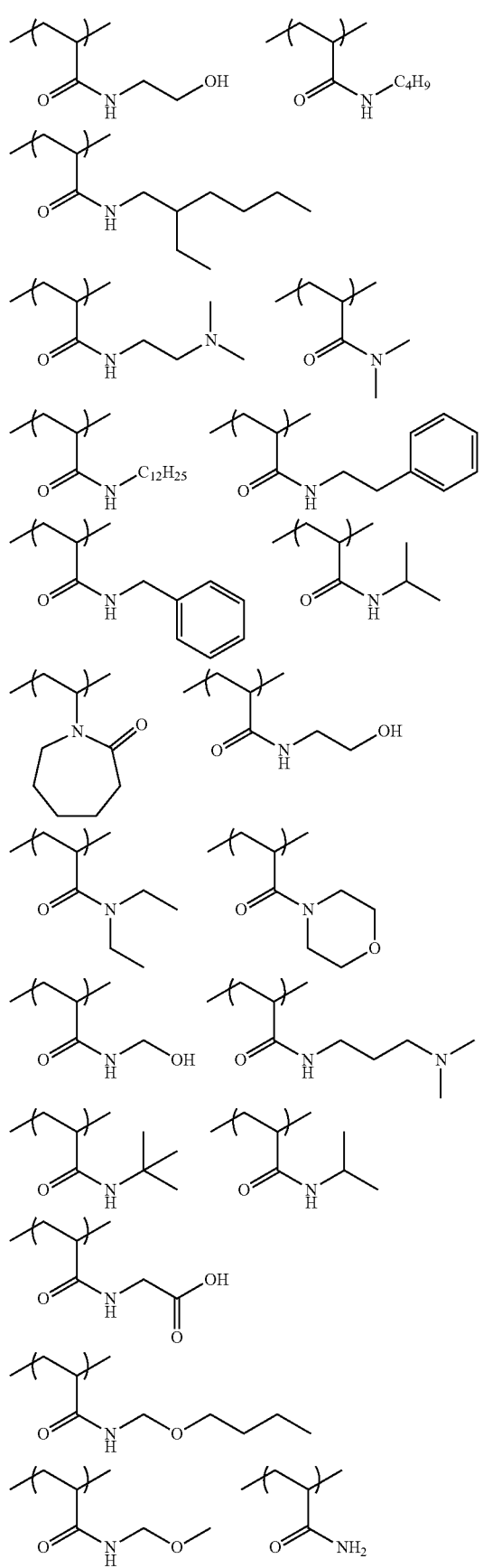
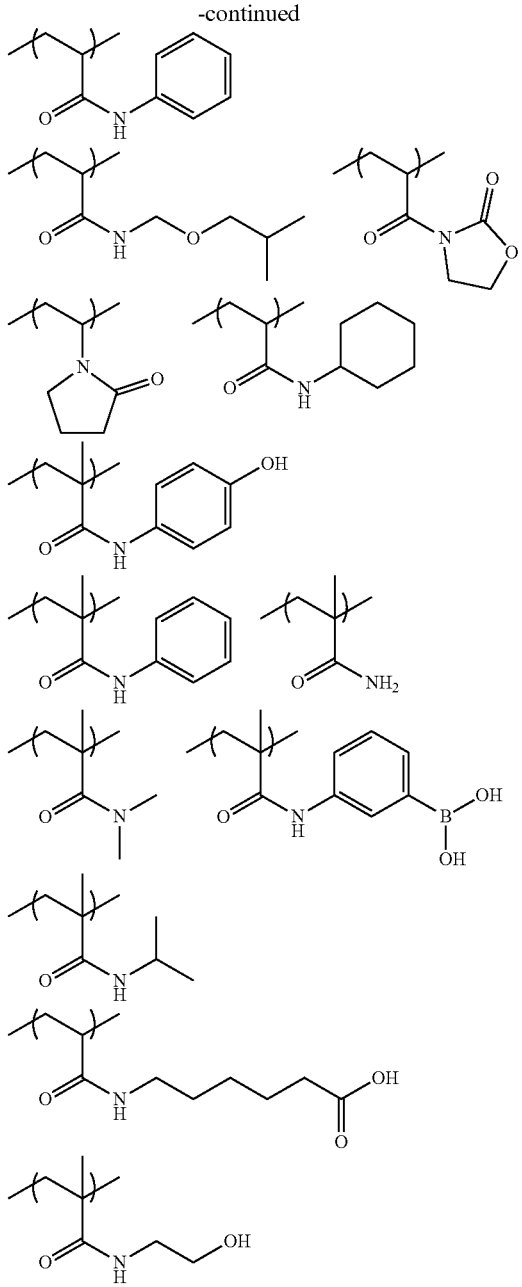

The content of the repeating structure B3 is preferably in a range of 3% to 75% by mass, more preferably in a range of 15% to 70% by mass, and still more preferably in a range of 20% to 65% by mass with respect to the total mass of all repeating structures of the fluorine-containing polymer. In a case where the content of the repeating structure B3 is in the above-described ranges, the effects of the present invention are more excellent.

The surfactant may have only one or two or more kinds of repeating structures B3. In a case where the surfactant has two or more kinds of repeating structures B3, the above-described content of the repeating structure B3 denotes the total content of the repeating structures B3.

(Other Repeating Structures (No. 1))

The fluorine-containing polymer may further have a repeating structure represented by General Formula (M-3).

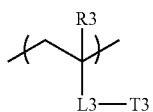

(M-3)

In Formula (M-3), R3 represents a hydrogen atom, a fluorine atom, a chlorine atom, or an alkyl group having 1 to 20 carbon atoms, L3 represents a single bond or a divalent linking group, and T3 represents an aromatic ring.

Examples of the linking group as L3 include at least one selected from an aromatic hydrocarbon group having 4 to 20 carbon atoms, a cyclic alkylene group having 4 to 20 carbon atoms, a heterocyclic group having 1 to 20 carbon atoms, a linear, branched, or cyclic alkylene group having 1 to 20 carbon atoms, —O—, —CO—O—, —CO—NH—, and —O—CO—, or a combination thereof.

Examples of the aromatic ring group as T3 include an aromatic hydrocarbon ring group such as a benzene ring group, a naphthalene ring group, an anthracene ring group, or a phenanthroline ring group, and an aromatic heterocyclic group such as a furan ring group, a pyrrole ring group, a thiophene ring group, a pyridine ring group, a thiazole ring group, or a benzothiazole ring group. Among these, a benzene ring group (for example, a 1,4-phenyl group) is preferable. The compatibility can be improved by allowing the polymer to contain these groups.

Specific examples of the monomer forming the repeating structure represented by Formula (M-3) include structures represented by Formulae (M3-1) to (M3-5), but the present invention is not limited thereto.

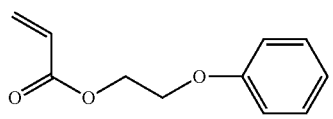

(M3-1)

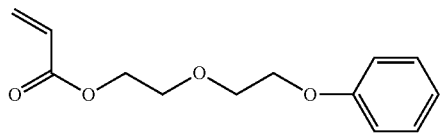

(M3-2)

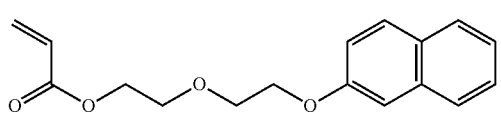

(M3-3)

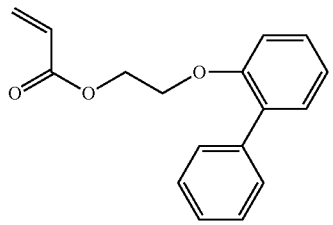

(M3-4)

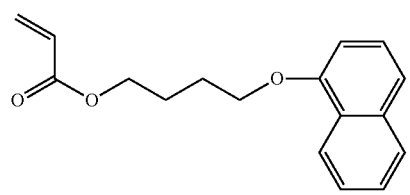

(M3-5)

(Other Repeating Structures (No. 2))

The fluorine-containing polymer may further have a repeating structure represented by General Formula (M-4).

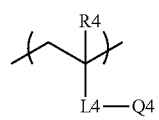

(M-4)

In Formula (M-4), R4 represents a hydrogen atom, a fluorine atom, a chlorine atom, or an alkyl group having 1 to 20 carbon atoms, L4 represents a single bond or a divalent linking group, and Q4 represents a crosslinkable group represented by any of Formulae (P1) to (P30).

Examples of the linking group as L4 include an aromatic hydrocarbon group having 4 to 20 carbon atoms, a cyclic alkylene group having 4 to 20 carbon atoms, and a heterocyclic group having 1 to 20 carbon atoms. Among these, a linear, branched, or cyclic alkylene group having 1 to 20 carbon atoms, and an aromatic hydrocarbon group having 4 to 20 carbon atoms are preferable, and it is preferable that the linking group contains —O—, —CO—O—, —CO—NH—, and —O—CO—.

In a case where Q4 represents a group containing a cationically polymerizable group, the cationically polymerizable group is not particularly limited, and examples thereof include an alicyclic ether group, a cyclic acetal group, a cyclic lactone group, a cyclic thioether group, a spiroorthoester group, and a vinyloxy group.

As the cationically polymerizable group, an alicyclic ether group or a vinyloxy group is preferable, an epoxy group, an oxetanyl group, or a vinyloxy group is more preferable, an epoxy group or an oxetanyl group is still more preferable, and an epoxy group is particularly preferable. An alicyclic epoxy group is particularly preferable as the epoxy group. Further, each of the above-described groups may have a substituent.

In a case where Q4 represents a group containing a radically polymerizable group, the radically polymerizable group is not particularly limited, and examples thereof include a group having a polymerizable carbon-carbon double bond, and specific examples thereof include a (meth)acryloyl group, a (meth)acryloyloxy group, a (meth)acrylamide group, a vinyl group, a styryl group, and an allyl group. Among these, a (meth)acryloyloxy group is preferable. Further, each of the above-described groups may have a substituent. The adhesiveness between layers in the form of laminating a plurality of liquid crystal composition layers in a liquid crystal film described above can be improved by allowing the polymer to contain these groups.

Specific examples of the monomer forming a repeating structure represented by Formula (M-4) include monomers represented by Formulae (M4-1) to (M4-17), but the present invention is not limited thereto.

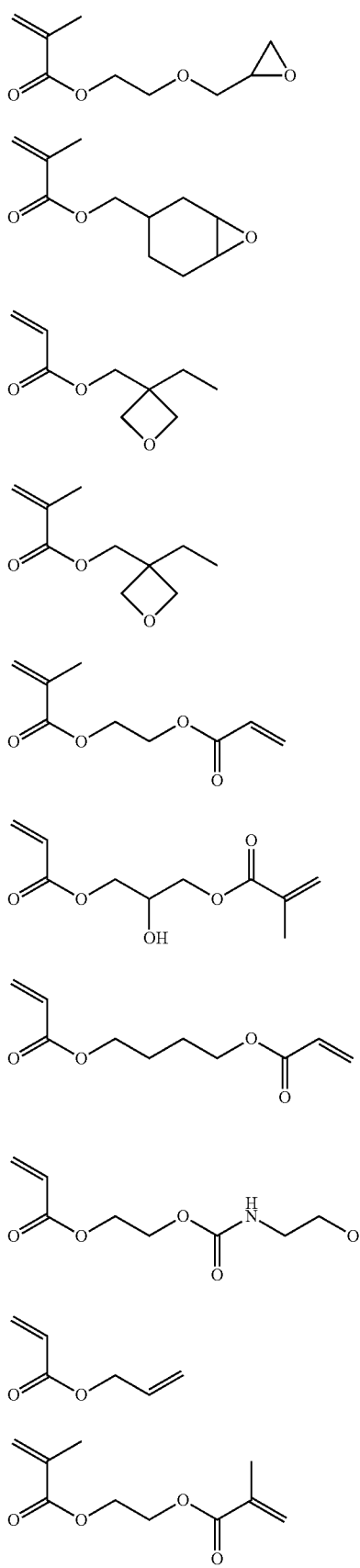
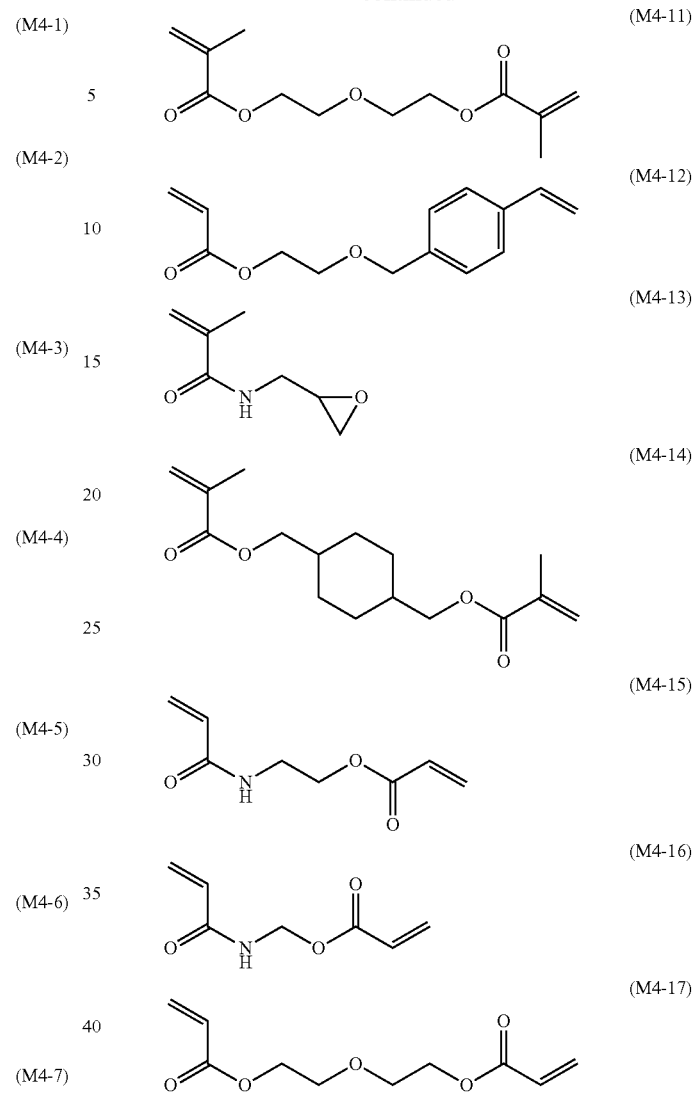

The fluorine-containing polymer may be a polymer having a block structure, a graft structure, a branch structure, or a star structure. It is preferable that the fluorine-containing polymer has such a block structure, a graft structure, a branch structure, or a star structure from the viewpoint that fluorine atomic groups are present lumps and the transferability of the polymer to the coating film surface is improved.

Further, in a copolymer having a random structure with a fluorine-substituted alkyl chain length of 1 to 4, the lumps of fluorine atomic groups are small and the solubility in a general-purpose solvent is excellent, but the transferability to a coating film surface is degraded. Since the fluorine atomic groups are present as lumps, the transferability of the polymer to the coating film surface is high even in a case where the fluorine-substituted alkyl chain length is in a range of 1 to 4, and thus it is preferable that such a copolymer is added to the composition from the viewpoint of reducing the surface tension of the coating film and enhancing the wettability (homogeneous coating property) of the composition to the base material during coating and the surface state of the coating film surface.

In the present invention, in a case where the liquid crystal composition contains a surfactant, a difference between the log P value of the surfactant and the log P value of the liquid crystal compound is preferably less than 3.1, more preferably less than 1.4, and still more preferably 0 or greater and less than 1.4 from the viewpoint of further enhancing the display performance and the durability of the image display device.

Here, in a case where a plurality of surfactants or a plurality of liquid crystal compounds are used, the difference (absolute value) between the log P value of the surfactant and the log P value of the liquid crystal compound denotes the minimum difference from among differences calculated from the log P values of the respective compounds.

In the present invention, the composition may contain two or more kinds of surfactants. It is preferable that the composition contains a surfactant in which the difference in the log P value with the liquid crystal compound is less than 1.4 from the viewpoint of further enhancing the display performance and the durability of the image display device and preferable that the composition further contains a surfactant in which the difference in the log P value with the liquid crystal compound is 1.4 or greater from the viewpoint of improving the smoothness of the coating film surface, improving the alignment degree, suppressing cissing and unevenness, and improving the in-plane uniformity.

In a case where the liquid crystal composition contains a surfactant, the content of the surfactant is preferably in a range of 0.001 to 5 parts by mass and more preferably in a range of 0.01 to 3 parts by mass with respect to 100 parts by mass which is the total amount of the dichroic substance and the liquid crystal compound in the liquid crystal composition.

The surfactant may be used alone or in combination of two or more kinds thereof. In a case where the composition contains two or more kinds of surfactants, it is preferable that the total amount of the surfactants is in the above-described ranges.

<Adhesion Improver>

The liquid crystal composition may contain an adhesion improver from the viewpoint of the adhesiveness to a barrier layer described below. Examples of the adhesion improver include a compound containing a hydroxyl group, a carboxyl group, and a boronic acid group, and a compound containing a boronic acid group is preferable.

Suitable examples of the compound containing a boronic acid group include a compound represented by the following formula.

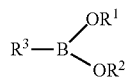

(In the formula, $R^1$ and $R^2$ each independently represent a hydrogen atom, a substituted or unsubstituted aliphatic hydrocarbon group, an aryl group, or a heterocyclic group, and $R^3$ represents a substituent containing a functional group that can be bonded to a (meth)acrylic group.)

<Solvent>

From the viewpoint of workability and the like, it is preferable that the liquid crystal composition contains a solvent.

Examples of the solvent include organic solvents such as ketones (such as acetone, 2-butanone, methyl isobutyl ketone, cyclopentanone, and cyclohexanone), ethers (such as dioxane, tetrahydrofuran, 2-methyltetrahydrofuran, cyclopentyl methyl ether, tertrahydropyran, and dioxolanes), aliphatic hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane, dichloroethane, dichlorobenzene, and chlorotoluene), esters (such as methyl acetate, ethyl acetate, butyl acetate, and ethyl lactate), alcohols (such as ethanol, isopropanol, butanol, cyclohexanol, isopentyl alcohol, neopentyl alcohol, diacetone alcohol, and benzyl alcohol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, and N-ethylpyrrolidone), and heterocyclic compounds (such as pyridine), and water. These solvents may be used alone or in combination of two or more kinds thereof.

Among these solvents, from the viewpoint of exhibiting the effect of the excellent solubility of the liquid crystal composition, ketones (particularly cyclopentanone and cyclohexanone), ethers (particularly tetrahydrofuran, cyclopentyl methyl ether, tetrahydropyran, and dioxolan), and amides (particularly dimethylformamide, dimethylacetamide, N-methylpyrrolidone, and N-ethylpyrrolidone) are preferable.

In a case where the liquid crystal composition contains a solvent, the content of the solvent is preferably in a range of 80% to 99% by mass, more preferably in a range of 83% to 97% by mass, and particularly preferably in a range of 85% to 95% by mass with respect to the total mass of the liquid crystal composition.

These solvents may be used alone or in combination of two or more kinds thereof. In a case where the composition contains two or more kinds of solvents, it is preferable that the total amount of the solvents is in the above-described range.

[Preparation Method]

A method of preparing the light absorption anisotropic film according to the embodiment of the present invention is not particularly limited as long as the abundance ratio of the dichroic substance can be adjusted by the method such that Expression (I-1) is satisfied, and examples thereof include a method including a step of forming a first coating film by coating an adjacent layer (for example, the alignment film) with a composition obtained by removing the dichroic substance from the liquid crystal composition (hereinafter, also referred to as "first coating film forming step"), a step of forming a second coating film by coating the first coating film with the liquid crystal composition (hereinafter, also referred to as "second coating film forming step"), and a step of aligning liquid crystal components contained in the first coating film and the second coating film (hereinafter, also referred to as "aligning step" in this order; a method of controlling the hydrophobicity of the liquid crystal compound and the dichroic substance described above and adjusting the compatibility between the liquid crystal compound and the dichroic substance contained in the liquid crystal composition described above; and a method of adjusting the heating temperature and adjusting the fluidity of the substance with respect to the liquid crystal composition described above in the aligning step described below.

Further, the liquid crystal component is a component that also includes a dichroic substance having liquid crystallinity in a case where the above-described dichroic substance has liquid crystallinity, in addition to the above-described liquid crystal compound.

<First Coating Film Forming Step>

The first coating film forming step is a step of forming a first coating film by coating an adjacent layer (for example, the alignment film) with a composition obtained by removing the dichroic substance from the liquid crystal composition.

Specific examples of a method of applying the composition include known methods such as a roll coating method, a gravure printing method, a spin coating method, a wire bar coating method, an extrusion coating method, a direct gravure coating method, a reverse gravure coating method, a die coating method, a spraying method, and an ink jet method.

<Second Coating Film Forming Step>

The second coating film forming step is a step of forming a second coating film by coating the first coating film with the liquid crystal composition.

The first coating film is easily coated with the liquid crystal composition by using the liquid crystal composition containing the above-described solvent or using a liquid material such as a melt obtained by heating the liquid crystal composition.

Examples of a method of applying the liquid crystal composition include the same methods as those for the first coating film forming step.

<Aligning Step>

The aligning step is a step of aligning the liquid crystal components contained in the first coating film and the second coating film. In this manner, a light absorption anisotropic film satisfying Expression (I-1) is obtained.

The aligning step may include a drying treatment. Components such as a solvent can be removed from the coating film by performing the drying treatment. The drying treatment may be performed according to a method of allowing the coating film to stand at room temperature for a predetermined time (for example, natural drying) or a method of heating the coating film and/or blowing air to the coating film.

Here, the liquid crystal components contained in the liquid crystal composition may be aligned by performing the above-described coating film forming step or drying treatment. For example, in an aspect in which the liquid crystal composition is prepared as a coating solution containing a solvent, a coating film having light absorption anisotropy (that is, a light absorption anisotropic film) is obtained by drying the coating film and removing the solvent from the coating film.

In a case where the drying treatment is performed at a temperature higher than or equal to the transition temperature of the liquid crystal component contained in the coating film to the liquid crystal phase, the heat treatment described below may not be performed.

The transition temperature of the liquid crystal component contained in the coating film to the liquid crystal phase is preferably in a range of 10° C. to 250° C. and more preferably in a range of 25° C. to 190° C. from the viewpoint of the manufacturing suitability or the like. It is preferable that the transition temperature is 10° C. or higher from the viewpoint that a cooling treatment or the like for lowering the temperature to a temperature range in which a liquid crystal phase is exhibited is not necessary. Further, it is preferable that the transition temperature is 250° C. or lower from the viewpoint that a high temperature is not required even in a case of setting an isotropic liquid state at a temperature higher than the temperature range in which a liquid crystal phase is temporarily exhibited, and waste of thermal energy and deformation and deterioration of a substrate can be reduced.

It is preferable that the aligning step includes a heat treatment. In this manner, since the liquid crystal component contained in the coating film can be aligned, the coating film after being subjected to the heat treatment can be suitably used as the light absorption anisotropic film.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the liquid crystal component contained in the coating film can be fixed. The cooling means is not particularly limited and can be performed according to a known method.

The light absorption anisotropic film can be obtained by performing the above-described steps.

In the present aspect, examples of the method of aligning the liquid crystal components contained in the coating films include a drying treatment and a heat treatment, but the method is not limited thereto, and the liquid crystal components can be aligned by a known alignment treatment.

(Other Steps)

The method of producing the light absorption anisotropic film may include a step of curing the light absorption anisotropic film after the aligning step (hereinafter, also referred to as a "curing step").

The curing step is performed by heating the light absorption anisotropic film and/or irradiating the film with light (exposing the film to light), for example, in a case where the light absorption anisotropic film contains a crosslinkable group (polymerizable group). Between these, it is preferable that the curing step is performed by irradiating the film with light.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits only a specific wavelength.

In a case where the exposure is performed while the film is heated, the heating temperature during the exposure depends on the transition temperature of the liquid crystal component contained in the light absorption anisotropic film to a liquid crystal phase, but is preferably 250 to 140° C.

Further, the exposure may be performed under a nitrogen atmosphere. In a case where the curing of the light absorption anisotropic film proceeds by radical polymerization, since the inhibition of polymerization by oxygen is reduced, it is preferable that exposure is performed in a nitrogen atmosphere.

The thickness of the light absorption anisotropic film is not particularly limited, but is preferably in a range of 100 to 8000 nm and more preferably in a range of 300 to 5000 nm from the viewpoint of the flexibility in a case where the laminate according to the embodiment of the present invention is used in a polarizer.

[Laminate]

The laminate according to the embodiment of the present invention which includes a base material, an alignment film, and a light absorption anisotropic film in this order and is used in an image display device.

The light absorption anisotropic film of the laminate according to the embodiment of the present invention is the light absorption anisotropic film according to the embodiment of the present invention, and the relationship between the maximum intensity Imax of the light absorption anisotropic film in the thickness direction and the intensity Isur1 in the viewing-side surface of the light absorption anisotropic film satisfies Expression (I-1) in the signal derived from the dichroic substance detected by TOF-SIMS.

$$2.0 \leq \text{Imax}/\text{Isur1} \quad (\text{I-1})$$

Hereinafter, each layer constituting the laminate according to the embodiment of the present invention will be described.

[Base Material]

The base material of the laminate according to the embodiment of the present invention can be appropriately selected depending on the applications of the light absorption anisotropic film, and examples thereof include glass and a polymer film. The light transmittance of the base material is preferably 80% or greater.

In a case where a polymer film is used as the base material, it is preferable to use an optically isotropic polymer film. As specific examples and preferred embodiments of the polymer, the description in paragraph [0013] of JP2002-22942A can be applied. Further, even in a case of a polymer easily exhibiting the birefringence such as polycarbonate and polysulfone which has been known in the related art, a polymer with the exhibiting property which has been decreased by modifying the molecules described in WO2000/26705A can be used.

[Alignment Film]

The alignment film of the laminate according to the embodiment of the present invention may be any layer as long as the dichroic substance contained in the liquid crystal composition can be in a desired alignment state on the alignment film.

An alignment film can be formed by a method such as a rubbing treatment performed on a film surface of an organic compound (preferably a polymer), oblique vapor deposition of an inorganic compound, formation of a layer having microgrooves, or accumulation of an organic compound (such as ω-tricosanoic acid, dioctadecylmethylammonium chloride, or methyl stearate) according to a Langmuir-Blodgett method (LB film). Further, an alignment film in which an alignment function is generated by application of an electric field, application of a magnetic field, or irradiation with light is also known.

Among these, in the present invention, an alignment film formed by performing a rubbing treatment is preferable from the viewpoint of easily controlling the pretilt angle of the alignment film, and a photo-alignment film formed by irradiation with light is also preferable from the viewpoint of the uniformity of alignment.

<Rubbing Treatment Alignment Film>

A polymer material used for the alignment film formed by performing a rubbing treatment is described in multiple documents, and a plurality of commercially available products can be used. In the present invention, polyvinyl alcohol or polyimide and derivatives thereof are preferably used. The alignment film can refer to the description on page 43, line 24 to page 49, line 8 of WO2001/88574A1. The thickness of the alignment film is preferably in a range of 0.01 to 10 μm and more preferably in a range of 0.01 to 2 μm.

<Photo-Alignment Film>

A photo-alignment compound used for an alignment film formed by irradiation with light is described in a plurality of documents. In the present invention, preferred examples thereof include azo compounds described in JP2006-285197A, JP2007-76839A, JP2007-138138A, JP2007-94071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadiimide compounds having a photo-alignment unit described in JP2002-265541A and JP2002-317013A, photocrosslinkable silane derivatives described in JP4205195B and JP4205198B, and photocrosslinkable polyimides, polyamides, or esters described in JP2003-520878A, JP2004-529220A, and JP4162850B. Among these, azo compounds, photocrosslinkable polyimides, polyamides, or esters are more preferable.

Among these, a photosensitive compound containing a photoreactive group that is generated by at least one of dimerization or isomerization due to the action of light is preferably used as the photo-alignment compound.

Examples of the photoreactive group include a group having a cinnamic acid (cinnamoyl) structure (skeleton), a group having a coumarin structure (skeleton), a group having a chalcone structure (skeleton), a group having a benzophenone structure (skeleton), and a group having an anthracene structure (skeleton). Among these groups, a group having a cinnamoyl structure or a group having a coumarin structure is preferable, and a group having a cinnamoyl structure is more preferable.

In addition, the photosensitive compound containing the photoreactive group may further contain a crosslinkable group.

As the crosslinkable group, a thermally crosslinkable group that causes a curing reaction due to the action of heat and a photocrosslinkable group that causes a curing reaction due to the action of light are preferable, and the crosslinkable group may be a crosslinkable group that contains both a thermally crosslinkable group and a photocrosslinkable group.

Examples of the crosslinkable group include at least one selected from the group consisting of an epoxy group, an oxetanyl group, a group represented by —NH—CH$_2$—O—R (R represents a hydrogen atom or an alkyl group having 1 to 20 carbon atoms), a group having an ethylenically unsaturated double bond, and a block isocyanate group. Among these, an epoxy group, an oxetanyl group, or a group having an ethylenically unsaturated double bond is preferable.

Further, a 3-membered cyclic ether group is also referred to as an epoxy group, and a 4-membered cyclic ether group is also referred to as an oxetanyl group.

Further, specific examples of the group having an ethylenically unsaturated double bond include a vinyl group, an allyl group, a styryl group, an acryloyl group, and a methacryloyl group. Among these, an acryloyl group or a methacryloyl group is preferable.

The photo-alignment film formed of the above-described material is irradiated with linearly polarized light or non-polarized light to produce a photo-alignment film.

In the present specification, the "irradiation with linearly polarized light" and the "irradiation with non-polarized light" are operations for causing a photoreaction in the photo-alignment material. The wavelength of the light to be used varies depending on the photo-alignment material to be used and is not particularly limited as long as the wavelength is required for the photoreaction. The peak wavelength of light to be used for irradiation with light is preferably in a range of 200 nm to 700 nm, and ultraviolet light having a peak wavelength of 400 nm or less is more preferable.

Examples of the light source used for irradiation with light include commonly used light sources, for example, lamps such as a tungsten lamp, a halogen lamp, a xenon lamp, a xenon flash lamp, a mercury lamp, a mercury xenon lamp, or a carbon arc lamp, various lasers [such as a semiconductor laser, a helium neon laser, an argon ion laser, a helium cadmium laser, and a yttrium aluminum garnet (YAG) laser], a light emitting diode, and a cathode ray tube.

As means for obtaining linearly polarized light, a method of using a polarizing plate (for example, an iodine polarizing plate, a dichroic coloring agent polarizing plate, or a wire grid polarizing plate), a method of using a prism-based element (for example, a Glan-Thompson prism) or a reflective type polarizer for which a Brewster's angle is used, or a method of using light emitted from a laser light source having polarized light can be employed. In addition, only light having a required wavelength may be selectively applied using a filter or a wavelength conversion element.

In a case where light to be applied is linearly polarized light, a method of applying light vertically or obliquely to the upper surface with respect to the alignment film or the surface of the alignment film from the rear surface is employed. The incidence angle of light varies depending on the photo-alignment material, but is preferably in a range of 0 to 90° (vertical) and preferably in a range of 40 to 90°.

In a case where light to be applied is non-polarized light, the alignment film is irradiated with non-polarized light obliquely. The incidence angle is preferably in a range of 10° to 80°, more preferably in a range of 20° to 60°, and still more preferably in a range of 30° to 50°.

The irradiation time is preferably in a range of 1 minute to 60 minutes and more preferably in a range of 1 minute to 10 minutes.

In a case where patterning is required, a method of performing irradiation with light using a photomask as many times as necessary for pattern preparation or a method of writing a pattern by laser light scanning can be employed.

[Light Absorption Anisotropic Film]

The light absorption anisotropic film of the laminate according to the embodiment of the present invention is as described above, and thus the description thereof will not be repeated.

[Optically Anisotropic Film]

It is preferable that the laminate according to the embodiment of the present invention includes an optically anisotropic film.

Here, the optically anisotropic film denotes all films showing a retardation, and examples thereof include a stretched polymer film and a retardation film provided with an optically anisotropic layer containing a liquid crystal compound aligned on a support.

Here, the alignment direction of the liquid crystal compound contained in the optically anisotropic layer is not particularly limited, and examples thereof include horizontal, vertical, and twisted alignment with respect to the film surface.

Further, a λ/4 plate, a λ/2 plate, and the like have specific functions of the optically anisotropic film.

In addition, the optically anisotropic layer may be formed of a plurality of layers. In regard to the optically anisotropic layer formed of a plurality of optically anisotropic layers, for example, the description in paragraphs [0008] to [0053] of JP2014-209219A can be referred to.

Further, such an optically anisotropic film and the above-described light absorption anisotropic film may be provided by coming into contact with each other, or another layer may be provided between the optically anisotropic film and the light absorption anisotropic film. Examples of such a layer include a pressure sensitive adhesive layer or an adhesive layer for ensuring the adhesiveness.

It is preferable that the laminate according to the embodiment of the present invention includes a λ/4 plate as the optically anisotropic film described above and more preferable that the laminate includes a λ/4 plate on the light absorption anisotropic film.

Here, "λ/4 plate" is a plate having a λ/4 function, specifically, a plate having a function of converting linearly polarized light having a specific wavelength into circularly polarized light (or converting circularly polarized light into linearly polarized light).

For example, specific examples of an aspect in which a λ/4 plate has a single-layer structure include a stretched polymer film and a retardation film in which an optically anisotropic layer having a λ/4 function is provided on a support. Further, specific examples of an aspect in which a λ/4 plate has a multilayer structure include a broadband λ/4 plate obtained by laminating a λ/4 plate and a λ/2 plate.

[Barrier Layer]

The laminate according to the embodiment of the present invention may have a barrier layer on the light absorption anisotropic film (the λ/4 plate in a case where the laminate includes the λ/4 plate).

Here, the barrier layer is also referred to as a gas barrier layer (oxygen blocking layer) and has a function of protecting the polarizer of the present invention from gas such as oxygen in the atmosphere, the moisture, or the compound contained in an adjacent layer.

In regard to the barrier layer, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A can be referred to.

[Pressure Sensitive Adhesive Layer]

The laminate according to the embodiment of the present invention may include a pressure sensitive adhesive layer on a surface to which the V4 plate is bonded, from the viewpoint of bonding the V4 plate described above.

Examples of the pressure sensitive adhesive contained in the pressure sensitive adhesive layer include a rubber-based pressure sensitive adhesive, an acrylic pressure sensitive adhesive, a silicone-based pressure sensitive adhesive, a urethane-based pressure sensitive adhesive, a vinyl alkyl ether-based pressure sensitive adhesive, a polyvinyl alcohol-based pressure sensitive adhesive, a polyvinylpyrrolidone-based pressure sensitive adhesive, a polyacrylamide-based pressure sensitive adhesive, and a cellulose-based pressure sensitive adhesive.

Among these, an acrylic pressure sensitive adhesive (pressure sensitive adhesive) is preferable from the viewpoints of the transparency, the weather fastness, the heat resistance, and the like.

The pressure sensitive adhesive layer can be formed by a method of coating a release sheet with a solution of a pressure sensitive adhesive, drying the solution, and transferring the sheet to a surface of a transparent resin layer or a method of directly coating a surface of a transparent resin layer with a solution of a pressure sensitive adhesive and drying the solution.

A solution of a pressure sensitive adhesive is prepared as a 10 to 40 mass % solution obtained by dissolving or dispersing the pressure sensitive adhesive in a solvent such as toluene or ethyl acetate.

As a coating method, a roll coating method such as reverse coating or gravure coating, a spin coating method, a screen coating method, a fountain coating method, a dipping method, or a spraying method can be employed.

Examples of the constituent material of the release sheet include appropriate thin paper bodies, for example, synthetic resin films such as polyethylene, polypropylene, and polyethylene terephthalate, rubber sheets, paper, cloth, nonwoven fabrics, nets, foam sheets, and metal foils.

In the present invention, the thickness of an optional pressure sensitive adhesive layer is not particularly limited, but is preferably in a range of 3 µm to 50 µm, more preferably in a range of 4 µm to 40 µm, and still more preferably in a range of 5 µm to 30 µm.

[Applications]

The laminate according to the embodiment of the present invention can be used as a polarizer (polarizing plate) and specifically, the laminate can be used as, for example, as a linearly polarizing plate or a circularly polarizing plate.

In a case where the laminate according to the embodiment of the present invention does not include an optically anisotropic layer such as the λ/4 plate, the laminate can be used as a linearly polarizing plate.

Meanwhile, in a case where the laminate according to the embodiment of the present invention includes the λ/4 plate, the laminate can be used as a circularly polarizing plate.

[Image Display Device]

An image display device according to the embodiment of the present invention includes the above-described light absorption anisotropic film or the above-described laminate according to the embodiment of the present invention.

The display element used in the image display device according to the embodiment of the present invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and a liquid crystal cell is more preferable. That is, in the image display device according to the embodiment of the present invention, a liquid crystal display device formed of a liquid crystal cell as a display element or an organic EL display device formed of an organic EL display panel as a display element is preferable, and a liquid crystal display device is more preferable.

[Viewing Angle Control Layer]

The image display device according to the embodiment of the present invention may include a viewing angle control layer.

Here, the viewing angle control layer is a layer that controls the transmittance as viewed in the front direction and an oblique direction of the image display device used for preventing peeping into the display device or switching the viewing angle, and examples thereof include a light control film (manufactured by 3M Company) and a laminate formed of a light absorption anisotropic layer having an absorption axis in the thickness direction. In regard to the laminate formed of a light absorption anisotropic layer having an absorption axis in the thickness direction, for example, the description in paragraphs [0006] to [0043] of WO2018/079854A can be referred to.

Further, suitable examples of an aspect of an organic EL display device which is an example of the image display device according to the embodiment of the present invention include an aspect of an image display device including the viewing angle control layer, the light absorption anisotropic film, the above-described optional optically anisotropic film, and an organic EL display panel from the viewing side.

[Surface Protective Material]

It is preferable that the image display device according to the embodiment of the present invention has a surface protective material on a side closest to the viewing side.

Here, the material constituting the surface protective material is not particularly limited and may be an inorganic substance or an organic substance. Examples of the inorganic substance include a glass substrate. In addition, examples of the organic substance include a support consisting of a polymer film such as polyimide or cellulose acylate. Each surface layer of the surface protective material may include one or a plurality of layers selected from a surface curing layer (hard coat layer), a low reflection layer which suppresses surface reflection occurring at an air interface, and the like.

The thickness of the surface protective material is not particularly limited, but is preferably 800 µm or less and more preferably 100 µm or less from the viewpoint of reducing the thickness. The lower limit thereof is not particularly limited, but is preferably 0.1 µm or greater.

For example, a bendable glass base material having a thickness of 100 µm or less is preferable from the viewpoint that flexible characteristics of an organic EL display device can be exhibited.

Further, from the viewpoint of impact resistance, it is also preferable that a resin film, for example, a (meth)acrylic resin, a polyester-based resin such as polyethylene terephthalate (PET), a cellulose-based resin such as triacetyl cellulose (TAC), or a cycloolefin-based resin such as a norbornene-based resin is bonded to, as a protective film, the glass base material having a thickness of 100 µm or less with an adhesive or the like. In particular, it is preferable that polyethylene terephthalate (PET) is bonded to the glass base material from the viewpoint of the flexibility and preferable that polyethylene terephthalate (PET) having a Re of 3000 nm or greater and 10000 nm or less is bonded to the glass base material from the viewpoint of the visibility.

[Liquid Crystal Display Device]

A liquid crystal display device which is an example of the image display device according to the embodiment of the present invention is a liquid crystal display device that includes the above-described laminate according to the embodiment of the present invention (but does not include a λ/4 plate) and a liquid crystal cell.

In the present invention, between the laminates provided on both sides of the liquid crystal cell, it is preferable that the laminate according to the embodiment of the present invention is used as a front-side polarizer and more preferable that the laminate according to the embodiment of the present invention is used as a front-side polarizer and a rear-side polarizer.

Hereinafter, the liquid crystal cell constituting the liquid crystal display device will be described in detail.

<Liquid Crystal Cell>

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystal molecules (rod-like liquid crystal compound) are substantially horizontally aligned in a case of no voltage application and further twistedly aligned at 600 to 120°. The liquid crystal cell in a TN mode is most frequently used as a color TFT liquid crystal display device and is described in a plurality of documents.

In the liquid crystal cell in a VA mode, rod-like liquid crystal molecules are substantially vertically aligned at the time of no voltage application. The concept of the liquid crystal cell in a VA mode includes (1) liquid crystal cell in a VA mode in a narrow sense where rod-like liquid crystal molecules are aligned substantially vertically in a case of no voltage application and substantially horizontally in a case of voltage application (described in JP1990-176625A (JP-H2-176625A)), (2) liquid crystal cell in a multi-domain vertical alignment (MVA) mode) (SID97, described in Digest of tech. Papers (proceedings) 28 (1997) 845) in which the VA mode is formed to have multi-domain in order to expand the viewing angle, (3) liquid crystal cell in an axially symmetric aligned microcell (n-ASM) mode in which rod-like liquid crystal molecules are substantially vertically aligned in a case of no voltage application and twistedly multi-domain aligned in a case of voltage application (described in proceedings of Japanese Liquid Crystal Conference, pp. 58 to 59 (1998)), and (4) liquid crystal cell in a SURVIVAL mode (presented at LCD International 98). Further, the liquid crystal cell may be of any of a patterned vertical alignment (PVA) type, a photo-alignment (optical alignment) type, or a polymer-sustained alignment (PSA) type. Details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP1998-54982A (JP-H10-54982A), JP1999-202323A (JP-H11-202323A), JP1997-292522A (JP-H9-292522A), JP1999-133408A (JP-H11-133408A), JP1999-305217A (JP-H11-305217A), and JP1998-307291A (JP-H10-307291A).

[Organic EL Display Device]

As an organic EL display device which is an example of the image display device according to the embodiment of the present invention, an aspect of a display device including the above-described laminate (here, including a pressure sensitive adhesive layer and a λ/4 plate) according to the embodiment of the present invention and an organic EL display panel in order from the viewing side is suitably exemplified. In this case, the laminate is formed such that a transparent support, and an alignment film, a light absorption anisotropic film, a transparent resin layer, a pressure sensitive adhesive layer, and a λ/4 plate which are provided as necessary are arranged in order from the viewing side.

Further, the organic EL display panel is a display panel formed using an organic EL element having an organic light-emitting layer (organic electroluminescence layer) interposed between electrodes (between a cathode and an anode). The configuration of the organic EL display panel is not particularly limited, and a known configuration is employed.

EXAMPLES

Hereinafter, the present invention will be described in more detail with reference to examples. Materials, used amounts, ratios, treatment contents, treatment procedures, and the like described in the following examples can be appropriately changed without departing from the spirit of the present invention. Therefore, the scope of the present invention should not be limitatively interpreted by the following examples.

Example 1

[Preparation of Transparent Support]
<Preparation of Core Layer Cellulose Acylate Dope>

The following composition was put into a mixing tank and stirred to dissolve each component, thereby preparing a cellulose acetate solution used as a core layer cellulose acylate dope.

| Core layer cellulose acylate dope | |
|---|---|
| Cellulose acetate having acetyl substitution degree of 2.88 | 100 parts by mass |
| Polyester compound B described in example of JP2015-227955A | 12 parts by mass |
| Compound F shown below | 2 parts by mass |
| Methylene chloride (first solvent) | 430 parts by mass |
| Methanol (second solvent) | 64 parts by mass |

Compound F

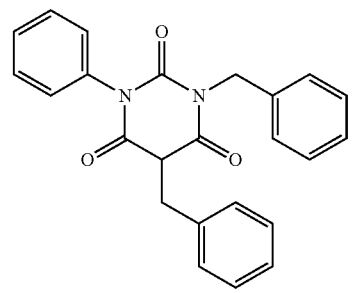 [SMILES: O=C1C(Cc2ccccc2)C(=O)N(c2ccccc2)C(=O)N1Cc1ccccc1]

<Preparation of Outer Layer Cellulose Acylate Dope>

10 parts by mass of the following matting agent solution was added to 90 parts by mass of the above-described core layer cellulose acylate dope, thereby preparing a cellulose acetate solution used as an outer layer cellulose acylate dope.

| Matting agent solution | |
|---|---|
| Silica particles with average particle size of 20 nm (AEROSIL R972, manufactured by Nippon Aerosil Co., Ltd.) | 2 parts by mass |
| Methylene chloride (first solvent) | 76 parts by mass |
| Methanol (second solvent) | 11 parts by mass |
| Core layer cellulose acylate dope described above | 1 parts by mass |

<Preparation of Cellulose Acylate Film 1>

The core layer cellulose acylate dope and the outer layer cellulose acylate dope were filtered through filter paper having an average pore size of 34 μm and a sintered metal filter having an average pore size of 10 μm, and three layers which were the core layer cellulose acylate dope and the outer layer cellulose acylate dopes provided on both sides of the core layer cellulose acylate dope were simultaneously cast from a casting port onto a drum at 20° C. (band casting machine).

Next, the film was peeled off in a state where the solvent content was approximately 20% by mass, both ends of the film in the width direction were fixed by tenter clips, and the film was dried while being stretched at a stretching ratio of 1.1 times in the lateral direction.

Thereafter, the film was further dried by being transported between the rolls of the heat treatment device to prepare an optical film (transparent support) having a thickness of 40 µm, and the optical film was used as a cellulose acylate film 1. The in-plane retardation of the obtained cellulose acylate film 1 was 0 nm.

[Formation of Photo-Alignment Film PA1]

The cellulose acylate film 1 was continuously coated with the following coating solution PA1 for forming a photo-alignment film with a wire bar. The support on which a coating film was formed was dried with hot air at 140° C. for 120 seconds, and the coating film was irradiated with polarized ultraviolet rays (10 mJ/cm$^2$, using an ultra-high pressure mercury lamp) to form a photo-alignment film PA1, thereby obtaining a triacetyl cellulose (TAC) film with a photo-alignment film. The film thickness of the photo-alignment film PA1 was 0.5 µm.

| Coating solution PA1 for forming photo-alignment film | |
| --- | --- |
| Polymer PA-1 shown below | 100.00 parts by mass |
| Acid generator PAG-1 shown below | 8.25 parts by mass |
| Stabilizer DIPEA shown below | 0.6 parts by mass |
| Xylene | 1126.60 parts by mass |
| Methyl isobutyl ketone | 125.18 parts by mass |

Polymer PA-1

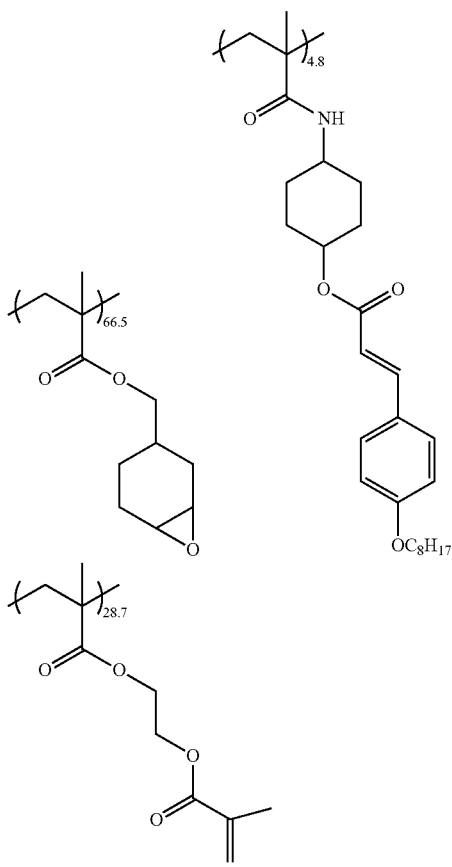

Acid Generator PAG-1

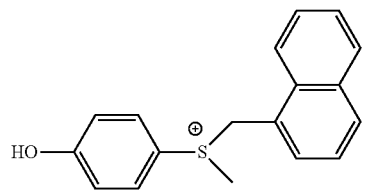 [SMILES: C[S+](Cc1cccc2ccccc12)c1ccc(O)cc1]

Stabilizer DIPEA

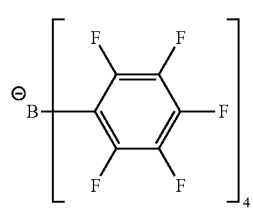

[Preparation of Light Absorption Anisotropic Film P1]

A coating layer P1 was formed by continuously coating the obtained photo-alignment film PA1 with a composition P1 for forming a light absorption anisotropic film with the following composition using a wire bar.

Next, the coating layer P1 was heated at 140° C. for 15 seconds, and the coating layer P1 was cooled to room temperature (23° C.).

Next, the coating layer was heated at the heating temperature listed in Table 1 for 60 seconds and cooled to room temperature again.

Thereafter, the coating layer was irradiated with an LED lamp (center wavelength of 365 nm) for 2 seconds under an irradiation condition of an illuminance of 200 mW/cm$^2$, thereby preparing a light absorption anisotropic film P1 on the photo-alignment film PA1. The film thickness of the light absorption anisotropic film P1 was 0.5 µm.

| Composition of composition P1 for forming light absorption anisotropic film | |
| --- | --- |
| First dichroic substance C-1 shown below | 0.59 parts by mass |
| Second dichroic substance M-1 shown below | 0.36 parts by mass |
| Third dichroic substance Y-1 shown below | 0.24 parts by mass |
| Liquid crystal compound L-1 shown below | 5.55 parts by mass |
| Polymerization initiator IRGACURE OXE-02 (manufactured by BASF SE) | 0.21 parts by mass |
| Surfactant F-1 shown below | 0.055 parts by mass |
| Cyclopentanone | 45.34 parts by mass |
| Tetrahydrofuran | 45.34 parts by mass |
| Benzyl alcohol | 2.33 parts by mass |

Dichroic Substance C-1 (Maximal Absorption Wavelength: 570 nm)

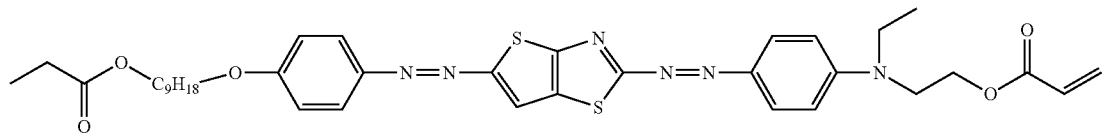

Dichroic Substance M-1 (Maximal Absorption Wavelength: 466 nm)

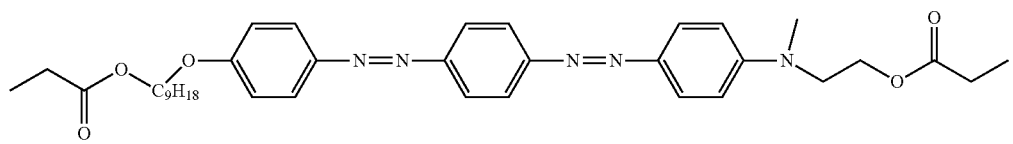

Dichroic Substance Y-1 (Maximal Absorption Wavelength: 417 nm)

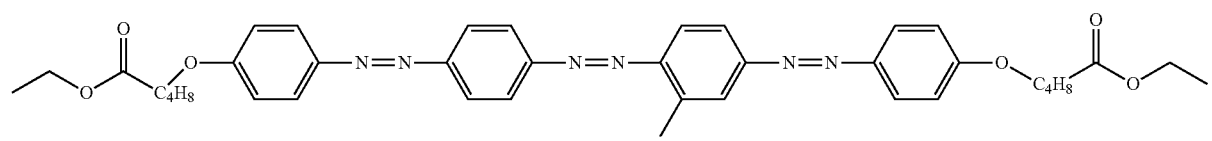

Liquid Crystal Compound L-1

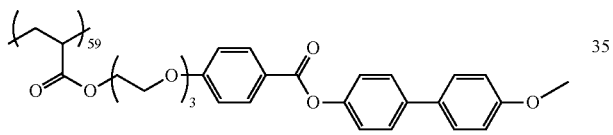

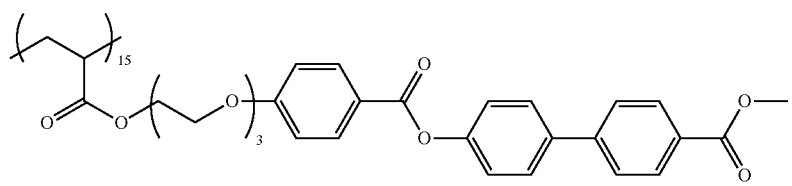

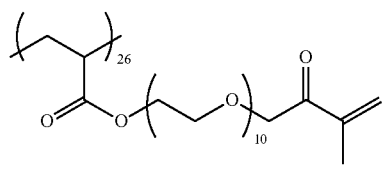

Surfactant F-1

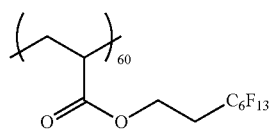

-continued

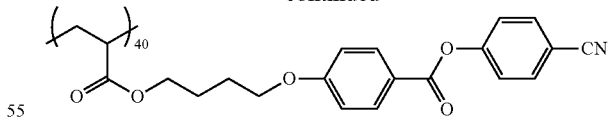

[Formation of Oxygen Blocking Layer B1]

The light absorption anisotropic film P1 was continuously coated with a coating solution B1 having the following composition with a wire bar. Thereafter, the film was dried with hot air at 80° C. for 5 minutes, thereby obtaining a laminate A on which the oxygen blocking layer B1 consisting of polyvinyl alcohol (PVA) having a thickness of 1.0 μm was formed, that is, a laminate A in which the cellulose acylate film 1 (transparent support), the photo-alignment film PA1, the light absorption anisotropic film P1, and the oxygen blocking layer B1 were provided adjacent to each other in this order.

| Composition of coating solution B1 for forming oxygen blocking layer | |
|---|---|
| Modified polyvinyl alcohol shown below | 3.80 parts by mass |
| Initiator Irg2959 | 0.20 parts by mass |
| Water | 70 parts by mass |
| Methanol | 30 parts by mass |

Modified Polyvinyl Alcohol

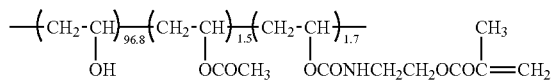

[Preparation of TAC Film A1 Including Positive A-Plate A1]

The cellulose acylate film 1 was continuously coated with the following coating solution PA2 for forming a photo-alignment film having the following composition with a wire bar. The support on which a coating film was formed was dried with hot air at 140° C. for 120 seconds, and the coating film was irradiated with polarized ultraviolet rays (10 mJ/cm$^2$, using an ultra-high pressure mercury lamp) to form a photo-alignment film PA2 having a thickness of 0.2 μm, thereby obtaining a TAC film with a photo-alignment film.

| Coating solution PA2 for forming photo-alignment film | |
|---|---|
| Polymer PA-2 shown below | 100.00 parts by mass |
| Acid generator PAG-1 shown above | 5.00 parts by mass |
| Acid generator CPI-110TF shown above | 0.005 parts by mass |
| Isopropyl alcohol | 16.50 parts by mass |
| Butyl acetate | 1072.00 parts by mass |
| Methyl ethyl ketone | 268.00 parts by mass |

Polymer PA-2

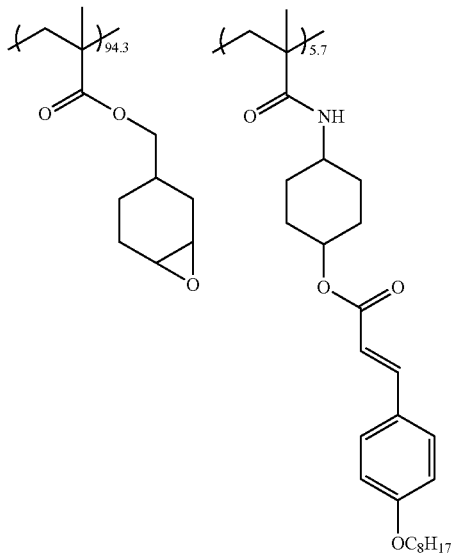

The photo-alignment film PA2 was coated with the composition A-1 having the following composition using a bar coater. The coating film formed on the photo-alignment film PA2 was heated to 120° C. with hot air, cooled to 60° C., irradiated with ultraviolet rays having a wavelength of 365 nm with an illuminance of 100 mJ/cm$^2$ using a high-pressure mercury lamp in a nitrogen atmosphere, and continuously irradiated with ultraviolet rays with an illuminance of 500 mJ/cm$^2$ while being heated at 120° C. so that the alignment of the liquid crystal compound was fixed, thereby preparing a TAC film A1 having a positive A-plate A1.

The thickness of the positive A-plate A1 was 2.5 μm, and the Re (550) was 144 nm. Further, the positive A-plate A1 satisfied the relationship of "Re (450)≤Re (550)≤Re (650)". Re (450)/Re (550) was 0.82.

| Composition A-1 | |
|---|---|
| Polymerizable liquid crystal compound LA-1 shown below | 43.50 parts by mass |
| Polymerizable liquid crystal compound LA-2 shown below | 43.50 parts by mass |
| Polymerizable liquid crystal compound LA-3 shown below | 8.00 parts by mass |
| Polymerizable liquid crystal compound LA-4 shown below | 5.00 parts by mass |
| Polymerization initiator PI-1 shown below | 0.55 parts by mass |
| Leveling agent T-1 | 0.20 parts by mass |
| Cyclopentanone | 235.00 parts by mass |

Polymerizable Liquid Crystal Compound LA-1 (tBu Represents Tertiary Butyl Group)
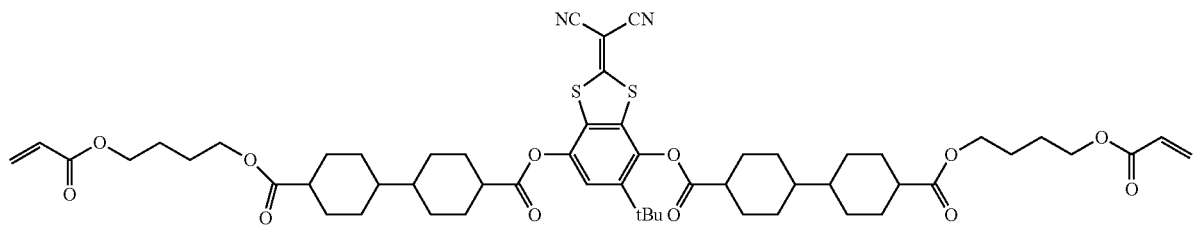 [SMILES: C=CC(=O)OCCCCOC(=O)C1CCC(C2CCC(C(=O)Oc3cc(C(C)(C)C)c(OC(=O)C4CCC(C5CCC(C(=O)OCCCCOC(=O)C=C)CC5)CC4)c4c3SC(=C(C#N)C#N)S4)CC2)CC1]
Polymerizable Liquid Crystal Compound LA-2
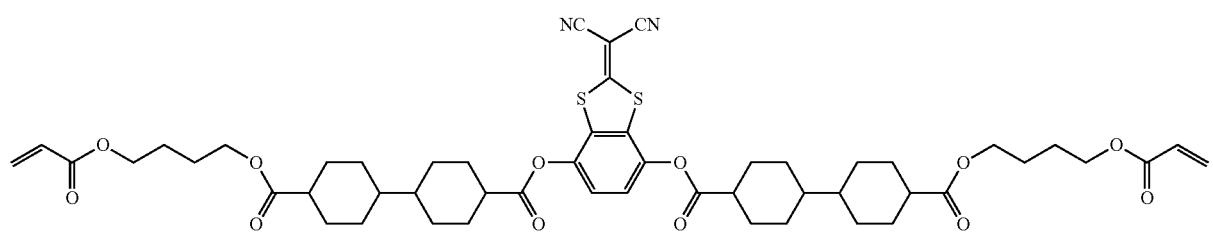 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c3SC(=C(C#N)C#N)S4)CC2)CC1]
Polymerizable Liquid Crystal Compound LA-3
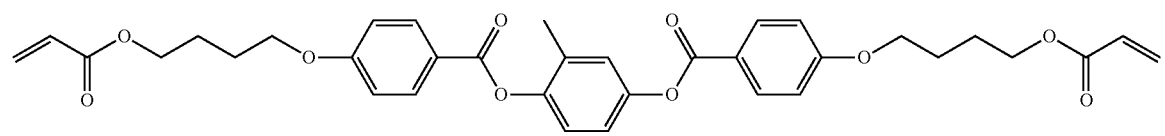
Polymerizable Liquid Crystal Compound LA-4 (Me Represents Methyl Group)
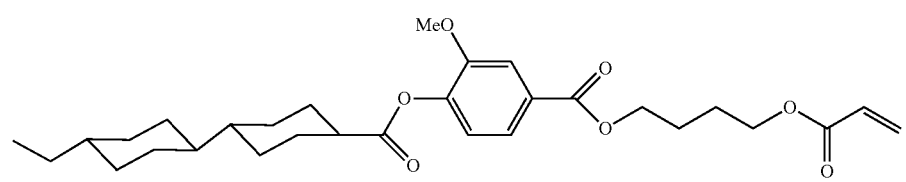 [SMILES: C=CC(=O)OCCCCOC(=O)c1ccc(OC(=O)C2CCC(C3CCC(CC)CC3)CC2)c(OC)c1]
Polymerization Initiator PI-1
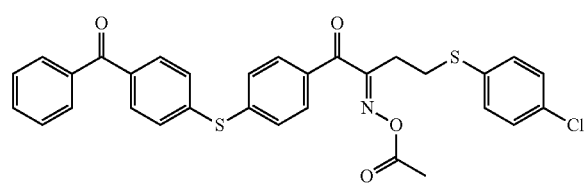 [SMILES: CC(=O)O/N=C(\CCSc1ccc(Cl)cc1)C(=O)c1ccc(Sc2ccc(C(=O)c3ccccc3)cc2)cc1]
Leveling Agent T-1
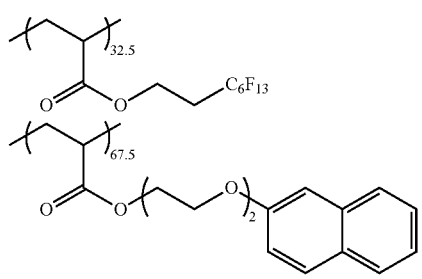

[Preparation of TAC Film C1 Having Positive C-Plate C1]

The above-described cellulose acylate film 1 was used as a temporary support.

The cellulose acylate film 1 was allowed to pass through a dielectric heating roll at a temperature of 60° C., the film surface temperature was increased to 40° C., one surface of the film was coated with an alkaline solution having the following composition such that the coating amount reached 14 ml/m² using a bar coater and heated to 110° C., and the film was transported for 10 seconds under a steam-type far-infrared heater (manufactured by Noritake Co., Ltd.).

Next, the film was coated with pure water such that the coating amount reached 3 ml/m² using the same bar coater.

Next, the process of washing the film with water using a fountain coater and draining the film using an air knife was repeated three times, and the film was transported to a drying zone at 70° C. for 10 seconds and dried, thereby preparing a cellulose acylate film 1 which had been subjected to an alkali saponification treatment.

| (Alkaline solution) | |
|---|---|
| Potassium hydroxide | 4.7 parts by mass |
| Water | 15.8 parts by mass |
| Isopropanol | 63.7 parts by mass |
| Fluorine-containing surfactant SF-1 ($C_{14}H_{29}O(CH_2CH_2O)_{20}H$) | 1.0 parts by mass |
| Propylene glycol | 14.8 parts by mass |

The cellulose acylate film 1 that had been subjected to the alkali saponification treatment was continuously coated with a coating solution PA3 for forming an alignment film with the following composition using a #8 wire bar. The obtained film was dried with hot air at 60° C. for 60 seconds and further dried with hot air at 100° C. for 120 seconds, thereby forming an alignment film PA3.

| Coating solution PA3 for forming alignment film | |
|---|---|
| Polyvinyl alcohol (PVA103, manufactured by Kuraray Co., Ltd.) | 2.4 parts by mass |
| Isopropyl alcohol | 1.6 parts by mass |
| Methanol | 36 parts by mass |
| Water | 60 parts by mass |

The alignment film PA3 was coated with a coating solution C1 for forming a positive C-plate with the following composition, the obtained coating film was aged at 60° C. for 60 seconds and irradiated with ultraviolet rays with an illuminance of 1000 mJ/cm² in the air using an air-cooled metal halide lamp at an illuminance of 70 mW/cm² (manufactured by Eye Graphics Co., Ltd.), and the alignment state thereof was fixed to vertically align the liquid crystal compound, thereby preparing a TAC film C1 having a positive C-plate C1 with a thickness of 0.5 μm.

The Rth (550) of the obtained positive C-plate was −60 nm.

| Coating solution C1 for forming positive C-plate | |
|---|---|
| Liquid crystal compound LC-1 shown below | 80 parts by mass |
| Liquid crystal compound LC-2 shown below | 20 parts by mass |
| Vertically aligned liquid crystal compound alignment agent S01 | 1 part by mass |
| Ethylene oxide-modified trimethylolpropane triacrylate (V#360, manufactured by Osaka Organic Chemical Industry Ltd.) | 8 parts by mass |
| IRGACURE 907 (manufactured by BASF SE) | 3 parts by mass |
| KAYACURE DETX (manufactured by Nippon Kayaku Co., Ltd.) | 1 part by mass |
| Compound B03 shown below | 0.4 parts by mass |
| Methyl ethyl ketone | 170 parts by mass |
| Cyclohexanone | 30 parts by mass |

Liquid Crystal Compound LC-1

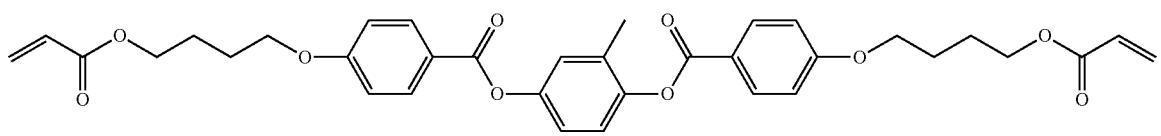 [SMILES: C=CC(=O)OCCCCOc1ccc(C(=O)Oc2ccc(OC(=O)c3ccc(OCCCCOC(=O)C=C)cc3)c(C)c2)cc1]

Liquid Crystal Compound LC-2

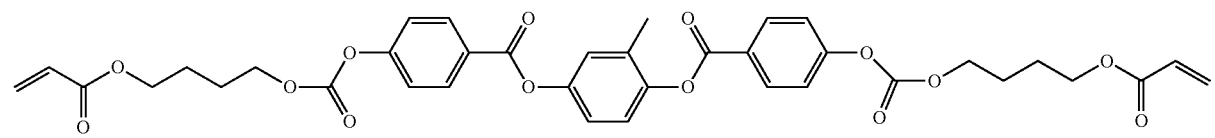 [SMILES: C=CC(=O)OCCCCOC(=O)Oc1ccc(C(=O)Oc2ccc(OC(=O)c3ccc(OC(=O)OCCCCOC(=O)C=C)cc3)c(C)c2)cc1]

Vertically Aligned Liquid Crystal Compound Alignment Agent S01

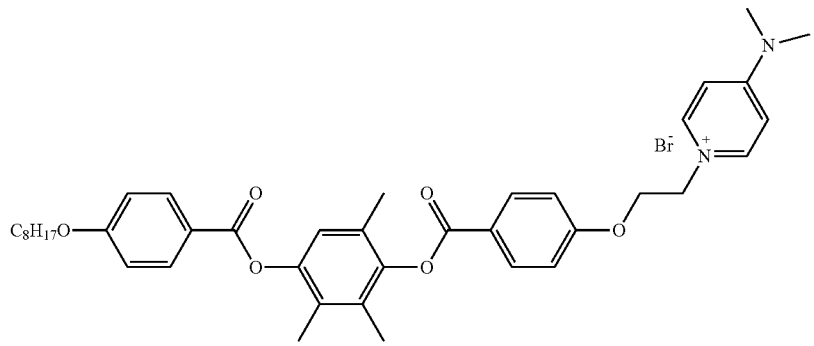

Compound B03

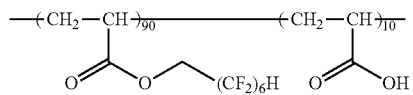

[Preparation of Pressure Sensitive Adhesives N1 and N2]

Next, an acrylate-based polymer was prepared according to the following procedures.

95 parts by mass of butyl acrylate and 5 parts by mass of acrylic acid were polymerized by a solution polymerization method in a reaction container equipped with a cooling pipe, a nitrogen introduction pipe, a thermometer, and a stirrer, thereby obtaining an acrylate-based polymer (A1) with an average molecular weight of 2000000 and a molecular weight distribution (Mw/Mn) of 3.0.

Next, an acrylate-based pressure sensitive adhesive was prepared with the following composition using the obtained acrylate-based polymer (A1). Each separate film that had been subjected to a surface treatment with a silicone-based release agent was coated with the composition using a die coater, dried in an environment of 90° C. for 1 minute, and irradiated with ultraviolet rays (UV) under the following conditions, thereby obtaining the following acrylate-based pressure sensitive adhesives N1 and N2 (pressure sensitive adhesive layers). The composition and the film thickness of the acrylate-based pressure sensitive adhesive are shown below.

<UV Irradiation Conditions>
Electrodeless lamp H bulb (Fusion Co., Ltd.)
Illuminance of 600 mW/cm², light dose of 150 mJ/cm²
The UV illuminance and the light dose were measured using "UVPF-36" (manufactured by Eye Graphics Co., Ltd.).

| (Acrylate-based pressure sensitive adhesive N1 (film thickness of 15 μm)) | |
|---|---|
| Acrylate-based polymer (A1) | 100 parts by mass |
| (A) Polyfunctional acrylate-based monomer shown below | 11.1 parts by mass |
| (B) Photopolymerization initiator shown below | 1.1 parts by mass |
| (C) Isocyanate-based crosslinking agent shown below | 1.0 parts by mass |
| (D) Silane coupling agent shown below | 0.2 parts by mass |

| (Acrylate-based pressure sensitive adhesive N2 (film thickness of 25 μm)) | |
|---|---|
| Acrylate-based polymer (A1) | 100 parts by mass |
| (C) Isocyanate-based crosslinking agent shown below | 1.0 parts by mass |
| (D) Silane coupling agent shown below | 0.2 parts by mass |

(A) Polyfunctional acrylate-based monomer: tris(acryloyloxyethyl) isocyanurate, molecular weight=423, trifunctional type (trade name, "ARONIX M-315", manufactured by Toagosei Co., Ltd.)

(B) Photopolymerization Initiator: mixture of benzophenone and 1-hydroxycyclohexyl phenyl ketone at mass ratio of 1:1, "IRGACURE 500" (manufactured by Ciba Specialty Chemicals Corp.)

(C) Isocyanate-based crosslinking agent: trimethylolpropane-modified tolylene diisocyanate ("CORONATE L", manufactured by Nippon Polyurethane Industry Co., Ltd.)

(D) Silane coupling agent: 3-glycidoxypropyltrimethoxysilane ("KBM-403", manufactured by Shin-Etsu Chemical Co., Ltd.)

[Preparation of UV Adhesive]

A UV adhesive composition having the following composition was prepared.

| UV adhesive composition | |
|---|---|
| CEL2021P (manufactured by Daicel Corporation) shown below | 70 parts by mass |
| 1,4-Butanediol diglycidyl ether | 20 parts by mass |
| 2-Ethylhexyl glycidyl ether | 10 parts by mass |
| CPI-100P | 2.25 parts by mass |

CPI-100P

[Preparation of Laminate A-1]

The TAC film A1 having the positive A-plate A1 on the retardation side and the PAC film C1 having the positive C-plate C1 on the retardation side were bonded to each other by irradiation with UV rays having a light dose of 600 mJ/cm2 using the UV adhesive composition. The thickness of the UV adhesive layer was 3 μm. Further, the surfaces bonded to each other with the UV adhesive were respectively subjected to a corona treatment. Next, the photo-alignment film PA2 on the side of the positive A-plate A1 and the cellulose acylate film 1 were removed to obtain a retardation plate 1. Further, the layer configuration of the retardation plate 1 is formed of the positive A-plate A1, the UV adhesive layer, the positive C-plate C1, a photo-alignment film PA3, and the cellulose acylate film 1.

The laminate A on the side of the oxygen blocking layer was bonded to the low-reflection surface film CV-LC5 (manufactured by FUJIFILM Corporation) on the side of the support using the pressure sensitive adhesive N1. Next, only the cellulose acylate film 1 of the laminate A was removed, and the surface from which the film had been removed and the retardation plate 1 on the side of the positive A-plate A1 were bonded to each other using the pressure sensitive adhesive N1. Next, the photo-alignment film PA3 on the side of the positive C-plate C1 and the cellulose acylate film 1 included in the retardation plate 1 were removed, thereby preparing a laminate A-1. At this time, the films were bonded to each other such that an angle between the absorption axis of the light absorption anisotropic film P1 included in the laminate A and the slow axis of the positive A-plate A1 was set to 45°. Further, the layer configuration of the laminate A-1 is formed of the low-reflection surface film CV-LC5, the pressure sensitive adhesive layer N1, the oxygen blocking layer B1, the light absorption anisotropic film P1, the photo-alignment film PA1, the pressure sensitive adhesive layer N1, the positive A-plate A1, the UV adhesive layer, and the positive C-plate C1.

GALAXY S5 (manufactured by Samsung Electronics Co., Ltd.) equipped with an organic EL panel (organic EL display element) was disassembled, the touch panel provided with a circularly polarizing plate was peeled off from the organic EL display device, and the circularly polarizing plate was further peeled off from the touch panel so that the organic EL display element, the touch panel, and the circularly polarizing plate were isolated from each other. Subsequently, the isolated touch panel was bonded to the organic EL display element again, and the laminate A-1 prepared above was bonded onto the touch panel using the pressure sensitive adhesive N2 so that air did not enter, thereby preparing an organic EL display device.

Examples 2 to 4 and Comparative Examples 2 and 3

Each laminate and each organic EL display device were prepared by the same method as that for Example 1 except that the composition P1 for forming a light absorption anisotropic film was replaced with the composition P2 for forming a light absorption anisotropic film with the following composition and the heating temperature was changed to the temperature listed in Tables 1 and 2.

| Composition P2 for forming light absorption anisotropic film | |
|---|---|
| First dichroic substance C-1 shown above | 0.59 parts by mass |
| Second dichroic substance M-1 shown above | 0.36 parts by mass |
| Third dichroic substance Y-1 shown above | 0.24 parts by mass |
| Liquid crystal compound L-1 shown above | 3.45 parts by mass |
| Liquid crystal compound L-2 shown below | 2.10 parts by mass |
| Polymerization initiator IRGACURE OXE-02 (manufactured by BASF SE) | 0.21 parts by mass |
| Surfactant F-1 shown above | 0.055 parts by mass |
| Cyclopentanone | 45.34 parts by mass |
| Tetrahydrofuran | 45.34 parts by mass |
| Benzyl alcohol | 2.33 parts by mass |

Liquid Crystal Compound L-2

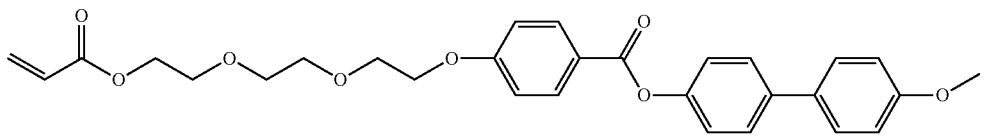 [SMILES: C=CC(=O)OCCOCCOCCOc1ccc(C(=O)Oc2ccc(-c3ccc(OC)cc3)cc2)cc1]

Example 5

A laminate and an organic EL display device were prepared by the same method as that for Example 4 except that a composition obtained by changing the following surfactant F-2 in place of the surfactant F-1 was used in the composition of the composition P2 for forming a light absorption anisotropic film.

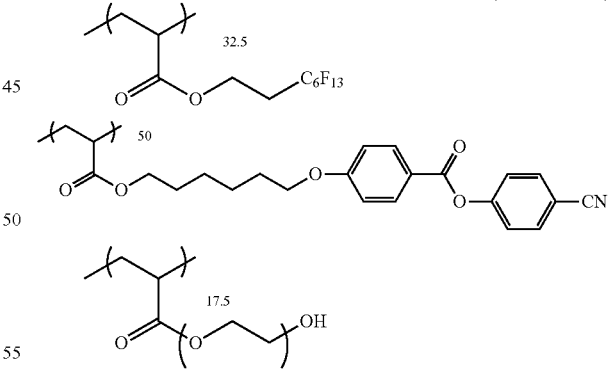

(Surfactant F-2)

Example 6

A laminate and an organic EL display device were prepared by the same method as that for Example 4 except that a composition obtained by changing the following surfactant F-3 in place of the surfactant F-1 was used in the composition of the composition P2 for forming a light absorption anisotropic film.

(Surfactant F-3)

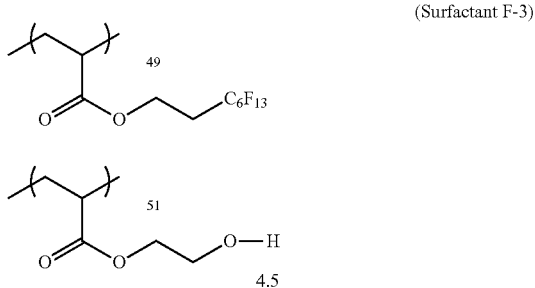

Example 7

A laminate and an organic EL display device were prepared by the same method as that for Example 1 except that the composition P1 for forming a light absorption anisotropic film was replaced with the composition P3 for forming a light absorption anisotropic film with the following composition and the film thickness of the light absorption anisotropic film P1 was changed to 2.0 μm.

| Composition P3 for forming light absorption anisotropic film | |
|---|---|
| First dichroic substance C-1 shown above | 0.65 parts by mass |
| Second dichroic substance M-1 shown above | 0.15 parts by mass |
| Third dichroic substance Y-1 shown above | 0.52 parts by mass |
| Liquid crystal compound L-1 shown above | 2.80 parts by mass |
| Liquid crystal compound L-4 shown below | 1.20 parts by mass |
| Polymerization initiator IRGACURE OXE-02 (manufactured by BASF SE) | 0.17 parts by mass |
| Surfactant F-1 shown above | 0.013 parts by mass |
| Cyclopentanone | 92.14 parts by mass |
| Benzyl alcohol | 2.36 parts by mass |

Liquid Crystal Compound L-4 (in the Following Formulae, the Numerical Values Each Represent the Mass Ratio)

Example 8

A laminate and an organic EL display device were prepared by the same method as that for Example 7 except that the film thickness of the light absorption anisotropic film P1 was changed to 1.2 μm (Example 8).

Example 9

A laminate and an organic EL display device were prepared by the same method as that for Example 7 except that the film thickness of the light absorption anisotropic film P1 was changed to 0.8 μm (Example 9).

Example 10

A laminate and an organic EL display device were prepared by the same method as that for Example 1 except that the composition P1 for forming a light absorption anisotropic film was replaced with the composition P4 for forming a light absorption anisotropic film with the following composition and the film thickness of the light absorption anisotropic film P1 was changed to 2.0 μm.

| Composition 4 for forming light absorption anisotropic film | |
|---|---|
| First dichroic substance C-1 shown above | 0.65 parts by mass |
| Second dichroic substance M-1 shown above | 0.32 parts by mass |
| Third dichroic substance Y-1 shown above | 0.55 parts by mass |
| Liquid crystal compound L-1 shown above | 2.93 parts by mass |
| Liquid crystal compound L-4 shown above | 1.26 parts by mass |
| Polymerization initiator IRGACURE OXE-02 (manufactured by BASF SE) | 0.18 parts by mass |
| Surfactant F-1 shown above | 0.014 parts by mass |
| Cyclopentanone | 91.75 parts by mass |
| Benzyl alcohol | 2.35 parts by mass |

Example 11

A laminate and an organic EL display device were prepared by the same method as that for Example 1 except that

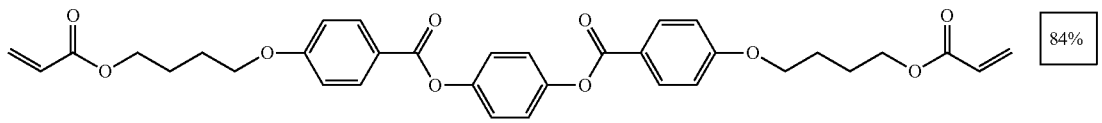

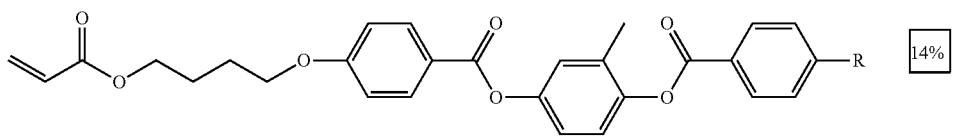

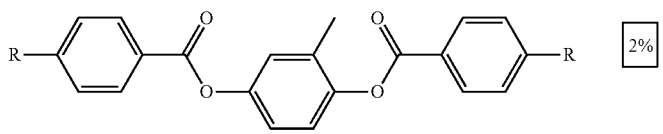

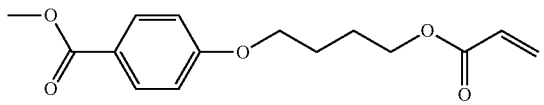

the composition P1 for forming a light absorption anisotropic film was replaced with the composition P5 for forming a light absorption anisotropic film with the following composition and the film thickness of the light absorption anisotropic film P1 was changed to 2.0 μm.

| Composition 5 for forming light absorption anisotropic film | |
|---|---|
| First dichroic substance C-1 shown above | 0.66 parts by mass |
| Third dichroic substance Y-1 shown below | 0.28 parts by mass |
| Liquid crystal compound L-1 shown above | 1.71 parts by mass |

| -continued | |
|---|---|
| Composition 5 for forming light absorption anisotropic film | |
| Liquid crystal compound L-4 shown above | 0.73 parts by mass |
| Polymerization initiator IRGACURE OXE-02 (manufactured by BASF SE) | 0.11 parts by mass |
| Surfactant F-1 shown above | 0.008 parts by mass |
| Cyclopentanone | 94.09 parts by mass |
| Benzyl alcohol | 2.41 parts by mass |

Example 12

A laminate and an organic EL display device were prepared by the same method as that for Example 1 except that the composition P1 for forming a light absorption anisotropic film was replaced with the composition P6 for forming a light absorption anisotropic film with the following composition and the film thickness of the light absorption anisotropic film P1 was changed to 2.0 μm.

| Composition P6 for forming light absorption anisotropic film | |
|---|---|
| First dichroic substance C-1 shown above | 0.65 parts by mass |
| Second dichroic substance M-1 shown above | 0.16 parts by mass |
| Third dichroic substance Y-1 shown below | 0.28 parts by mass |
| Liquid crystal compound L-1 shown above | 3.01 parts by mass |
| Liquid crystal compound L-2 shown above | 0.23 parts by mass |
| Liquid crystal compound L-4 shown above | 1.39 parts by mass |
| Polymerization initiator IRGACURE OXE-02 (manufactured by BASF SE) | 0.18 parts by mass |
| Surfactant F-1 shown above | 0.007 parts by mass |
| Cyclopentanone | 91.75 parts by mass |
| Benzyl alcohol | 2.35 parts by mass |

Example 13

A laminate and an organic EL display device were prepared by the same method as that for Example 12 except that the composition of the oxygen blocking layer B1 was replaced with the composition of the oxygen blocking layer B2 described below and the step after the oxygen blocking layer was dried was changed to a step of irradiating the layer with an LED lamp (center wavelength of 365 nm) for 2 seconds under an irradiation condition of an illuminance of 200 mW/cm².

| Composition of coating solution B2 for forming oxygen blocking layer | |
|---|---|
| ACRIT 8KX-078 (manufactured by Taisei Fine Chemical Co., Ltd., solid content of 40%) | 23.34 parts by mass |
| Polymerization initiator IRGACURE OXE-02 (manufactured by BASF SE) | 0.28 parts by mass |
| Surfactant F-5 shown below | 0.009 parts by mass |
| Methyl ethyl ketone | 76.37 parts by mass |

Surfactant F-5

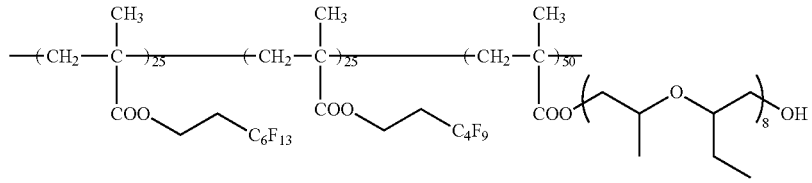

Example 14

A laminate and an organic EL display device were prepared by the same method as that for Example 13 except that ACRIT 8KX-078 was changed to ACRIT 8KX-212 in the composition of the oxygen blocking layer B2.

Example 15

The acrylate-based pressure sensitive adhesive N1 was changed to the following acrylate-based pressure sensitive adhesive N3, the low-reflection surface film CV-LC5 (manufactured by FUJIFILM Corporation) was changed to an alkali-free glass Eagle XG (manufactured by Corning Inc.) with a thickness of 1.1 mm during the preparation of the laminate A-1, and the laminate A on the side of the oxygen blocking layer B1 was bonded thereto using the pressure sensitive adhesive N3 so that bubbles did not enter. Here, the pressure sensitive adhesive N3 was allowed to stand in a low-humidity environment (at 25° C. and 10% RH) for 24 hours in advance, dehydrated, and bonded. The moisture content of the pressure sensitive adhesive N3 after dehydration was 0.2% (Karl Fischer method).

A laminate and an organic EL display device were prepared by the same method as that for Example 7 except for the above-described procedures.

| Acrylate-based pressure sensitive adhesive N3 (film thickness of 200 μm) | |
|---|---|
| Acrylate-based polymer (A1) | 100 parts by mass |
| (A) Polyfunctional acrylate-based monomer shown above | 11.1 parts by mass |
| (B) Photopolymerization initiator shown above | 1.1 parts by mass |
| (C) Isocyanate-based crosslinking agent shown above | 1.0 parts by mass |
| (D) Silane coupling agent shown above | 0.2 parts by mass |

Example 16

During the preparation of the laminate A-1, the laminate A on the side of the oxygen blocking layer B1 was bonded to a commercially available cycloolefin film (ZEONOR ZB12, film thickness of 50 μm, manufactured by Zeon Corporation) using the pressure sensitive adhesive N1. Further, the laminate on the side of the cycloolefin film was bonded to an alkali-free glass Eagle XG (manufactured by Corning Inc.) with a thickness of 1.1 mm using the pressure sensitive adhesive N3 so that bubbles did not enter. Here, the pressure sensitive adhesive N3 was not allowed to stand in a low-humidity environment. The moisture content of the pressure sensitive adhesive N3 was 1.1% (Karl Fischer method).

A laminate and an organic EL display device were prepared by the same method as that for Example 15 except for the above-described procedures.

Example 17

A laminate and an organic EL display device were prepared by the same method as that for Example 16 except that the cycloolefin film was changed to a commercially available polyethylene terephthalate film (COSMOSHINE SRF, film thickness of 80 μm) during the preparation of the laminate A-1.

Example 18

A laminate and an organic EL display device were prepared by the same method as that for Example 7 except that the composition P1 for forming a light absorption anisotropic film was replaced with a composition P7 for forming a light absorption anisotropic film with the following composition.

| Composition P7 for forming light absorption anisotropic film | |
|---|---|
| First dichroic substance C-1 shown above | 0.65 parts by mass |
| Second dichroic substance M-1 shown above | 0.15 parts by mass |
| Third dichroic substance Y-1 shown above | 0.52 parts by mass |
| Liquid crystal compound L-1 shown above | 2.69 parts by mass |
| Liquid crystal compound L-4 shown above | 1.15 parts by mass |
| Adhesion improver A-1 shown below | 0.17 parts by mass |
| Polymerization initiator IRGACURE OXE-02 (manufactured by BASF SE) | 0.17 parts by mass |
| Surfactant F-1 shown above | 0.013 parts by mass |
| Cyclopentanone | 92.14 parts by mass |
| Benzyl alcohol | 2.36 parts by mass |

Adhesion Improver A-1

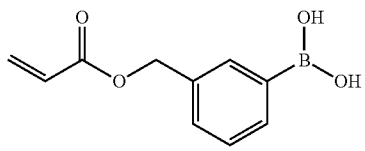

Example 19

A laminate and an organic EL display device were prepared by the same method as that for Example 7 except that the composition P1 for forming a light absorption anisotropic film was replaced with a composition P8 for forming a light absorption anisotropic film with the following composition.

| Composition P8 for forming light absorption anisotropic film | |
|---|---|
| First dichroic substance C-1 shown above | 0.65 parts by mass |
| Second dichroic substance M-1 shown above | 0.15 parts by mass |
| Third dichroic substance Y-1 shown above | 0.52 parts by mass |
| Liquid crystal compound L-1 shown above | 2.68 parts by mass |
| Liquid crystal compound L-4 shown above | 1.15 parts by mass |
| Adhesion improver A-1 shown above | 0.17 parts by mass |
| Polymerization initiator IRGACURE OXE-02 (manufactured by BASF SE) | 0.17 parts by mass |
| Surfactant F-6 shown below | 0.020 parts by mass |
| Cyclopentanone | 92.14 parts by mass |
| Benzyl alcohol | 2.36 parts by mass |

Surfactant F-6

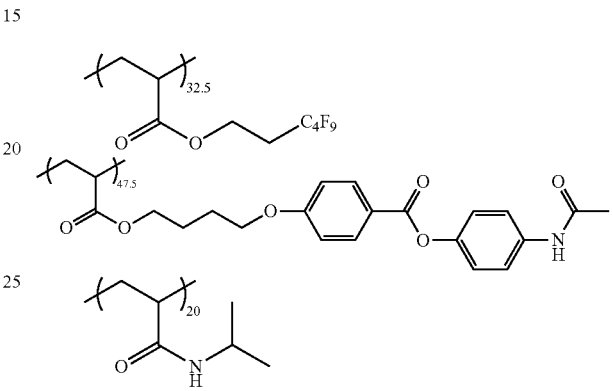

Example 20

A laminate and an organic EL display device were prepared by the same method as that for Example 7 except that the composition P1 for forming a light absorption anisotropic film was replaced with a composition P9 for forming a light absorption anisotropic film with the following composition.

| Composition P9 for forming light absorption anisotropic film | |
|---|---|
| First dichroic substance C-1 shown above | 0.65 parts by mass |
| Second dichroic substance M-1 shown above | 0.15 parts by mass |
| Third dichroic substance Y-1 shown above | 0.52 parts by mass |
| Liquid crystal compound L-1 shown above | 2.68 parts by mass |
| Liquid crystal compound L-4 shown above | 1.15 parts by mass |
| Adhesion improver A-1 shown above | 0.17 parts by mass |
| Polymerization initiator IRGACURE OXE-02 (manufactured by BASF SE) | 0.17 parts by mass |
| Surfactant F-7 shown below | 0.020 parts by mass |
| Cyclopentanone | 92.14 parts by mass |
| Benzyl alcohol | 2.36 parts by mass |

Surfactant F-7

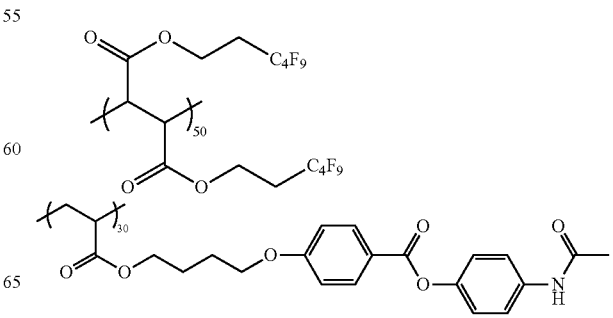

-continued

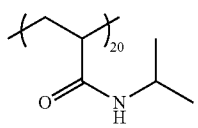

Example 21

A laminate and an organic EL display device were prepared by the same method as that for Example 7 except that the composition P1 for forming a light absorption anisotropic film was replaced with a composition P10 for forming a light absorption anisotropic film with the following composition.

| Composition P10 for forming light absorption anisotropic film | |
|---|---|
| First dichroic substance C-1 shown above | 0.65 parts by mass |
| Second dichroic substance M-1 shown above | 0.16 parts by mass |
| Third dichroic substance Y-1 shown below | 0.28 parts by mass |
| Liquid crystal compound L-1 shown above | 2.97 parts by mass |
| Liquid crystal compound L-2 shown above | 0.23 parts by mass |
| Liquid crystal compound L-4 shown above | 1.37 parts by mass |
| Adhesion improver A-1 shown above | 0.06 parts by mass |
| Polymerization initiator IRGACURE OXE-02 (manufactured by BASF SE) | 0.18 parts by mass |
| Surfactant F-8 shown below | 0.014 parts by mass |
| Cyclopentanone | 91.75 parts by mass |
| Benzyl alcohol | 2.35 parts by mass |

Surfactant F-8

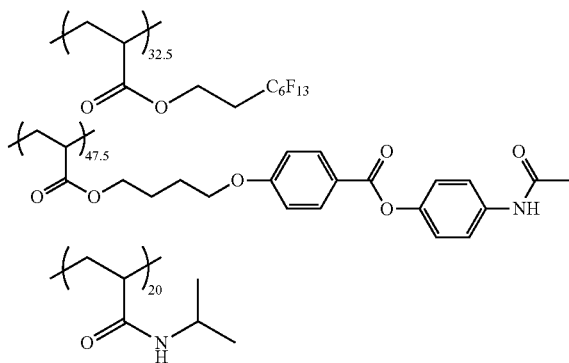

Example 22

<Preparation of Cellulose Acylate Film 2>

The following composition was put into a mixing tank, stirred, and further heated at 90° C. for 10 minutes. Thereafter, the obtained composition was filtered through filter paper having an average pore size of 34 μm and a sintered metal filter having an average pore size of m, thereby preparing a dope. The concentration of solid contents of the dope was 23.5% by mass, the addition amount of the plasticizer was the ratio to the cellulose acylate, and the solvent of the dope was methylene chloride/methanol/butanol=81/18/1 (mass ratio).

| Cellulose acylate dope | |
|---|---|
| Cellulose acylate (acetyl substitution degree of 2.86, viscosity average polymerization degree of 310) | 100 parts by mass |
| Sugar ester compound 1 (represented by Chemical Formula (S4)) | 6.0 parts by mass |
| Sugar ester compound 2 (represented by Chemical Formula (S5)) | 2.0 parts by mass |
| Silica particle dispersion liquid (AEROSIL R972, manufactured by Nippon Aerosil Co., Ltd.) | 0.1 parts by mass |
| Solvent (methylene chloride/methanol/butanol) | |

Sugar Ester Compound 1

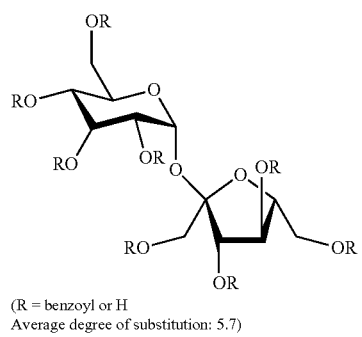

(R = benzoyl or H
Average degree of substitution: 5.7)

Sugar Ester Compound 2

(S5)

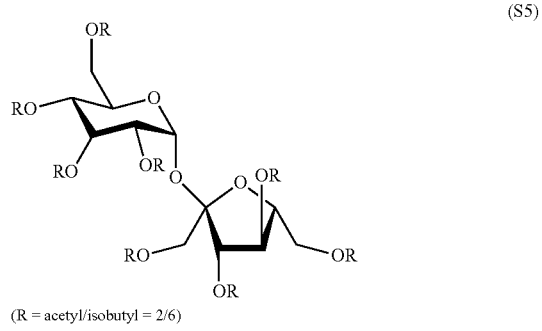

(R = acetyl/isobutyl = 2/6)

The dope prepared above was cast using a drum film forming machine. The dope was cast from a die such that the dope was in contact with the metal support cooled to 0° C., and the obtained web (film) was peeled off. Further, the drum was made of SUS.

The web (film) obtained by casting was peeled off from the drum and dried in a tenter device for 20 minutes using a tenter device such that both ends of the web were clipped with clips and transported at 30° C. to 40° C. during film transport. Subsequently, the web post-dried by zone heating while being transported using a roll. The obtained web was subjected to knurling and wound up.

The film thickness of the obtained cellulose acylate film 2 was 40 μm, the in-plane retardation Re (550) at a wavelength of 550 nm was 1 nm, and the retardation Rth (550) at a wavelength of 550 nm in the thickness direction was 26 nm.

The prepared cellulose acylate film 2 was continuously subjected to a rubbing treatment. At this time, the longitudinal direction of the long film was parallel to the transport direction, and the angle between the film longitudinal direction (transport direction) and the rotation axis of the rubbing roller was set to 80°. In a case where the film longitudinal direction (transport direction) is set to 90° and the clockwise direction is represented by a positive value with respect to the film width direction as a reference (0°) as observed from the film side, the rotation axis of the rubbing roller is 10°. That is, the position of the rotation axis of the rubbing roller is a position rotated by 80° counterclockwise with respect to the film longitudinal direction as a reference.

The cellulose acylate film 2 subjected to the rubbing treatment was used as a substrate and coated with a composition Q1 for forming an optically anisotropic layer with the following composition which contained a liquid crystal compound, using a Geyser coating machine, thereby forming a composition layer.

Next, the obtained composition layer was heated at 80° C. for 60 seconds. The liquid crystal compound of the composition layer was aligned in a predetermined direction by heating the composition layer.

Thereafter, the composition layer was irradiated with ultraviolet rays (irradiation amount: 35 mJ/cm$^2$) using an LED lamp (manufactured by Acroedge Corporation) at 365 nm under a temperature condition of 30° C. in the air containing oxygen (oxygen concentration: approximately 20% by volume).

Subsequently, the obtained composition layer was heated at 80° C. for 10 seconds.

Thereafter, nitrogen purging was performed to set the oxygen concentration to 100 ppm by volume, the composition layer was irradiated with ultraviolet rays (irradiation amount: 500 mJ/cm$^2$) at 80° C. using a metal halide lamp (manufactured by Eye Graphics Co., Ltd.) to form an optically anisotropic layer in which the alignment state of the liquid crystal compound was fixed. In this manner, an optical film A in which the optically anisotropic layer was formed on the cellulose acylate film 2 was prepared.

The molar absorption coefficient of the left twisted chiral agent (CL1) in the composition Q1 for forming an optically anisotropic layer at 365 nm was 40 L/(mol·cm), and even in a case where the composition was irradiated with light (35 mJ/cm$^2$) at 365 nm, the helical twisting power (HTP) of the chiral agent was not changed as compared with the helical twisting power before the irradiation. Further, the HTP was measured by the method described in paragraph [0064] of JP2013-129819A.

The molar absorption coefficient of the right twisted chiral agent (CR1) at 365 nm was 38,450 L/(mol·cm), and in a case where the composition was irradiated with light (35 mJ/cm$^2$) at 365 nm, the HTP of the chiral agent was decreased by 35 m$^{-1}$ as compared with the helical twisting power before the irradiation.

The photopolymerization initiator (Irgacure 819) had a small absorption at 365 nm (molar absorption coefficient of 860 L/(mol·cm)) and the molar absorption coefficient at an absorption peak wavelength of 290 nm was 7,700 L/(mol·cm).

| Composition Q1 for forming optically anisotropic layer | |
|---|---|
| Liquid crystal compound LQ-1 shown below | 80 parts by mass |
| Liquid crystal compound LQ-2 shown below | 10 parts by mass |
| Polymerizable compound (A) shown below | 10 parts by mass |
| Ethylene oxide-modified trimethylolpropane triacrylate (V#360, manufactured by Osaka Organic Chemical Industry Ltd.) | 4 parts by mass |
| Photopolymerization initiator (Irgacure 819, manufactured by BASF SE) | 3 parts by mass |
| Left twisted chiral agent (CL1) shown below | 0.43 parts by mass |
| Right twisted chiral agent (CR1) shown below | 0.38 parts by mass |
| Polymer (A) shown below | 0.08 parts by mass |
| Polymer (B) shown below | 0.50 parts by mass |
| Methyl isobutyl ketone | 116 parts by mass |
| Ethyl propionate | 40 parts by mass |

Liquid Crystal Compound LQ-1 (in the Following Formulae, the Numerical Values Each Represent the Mass Ratio)

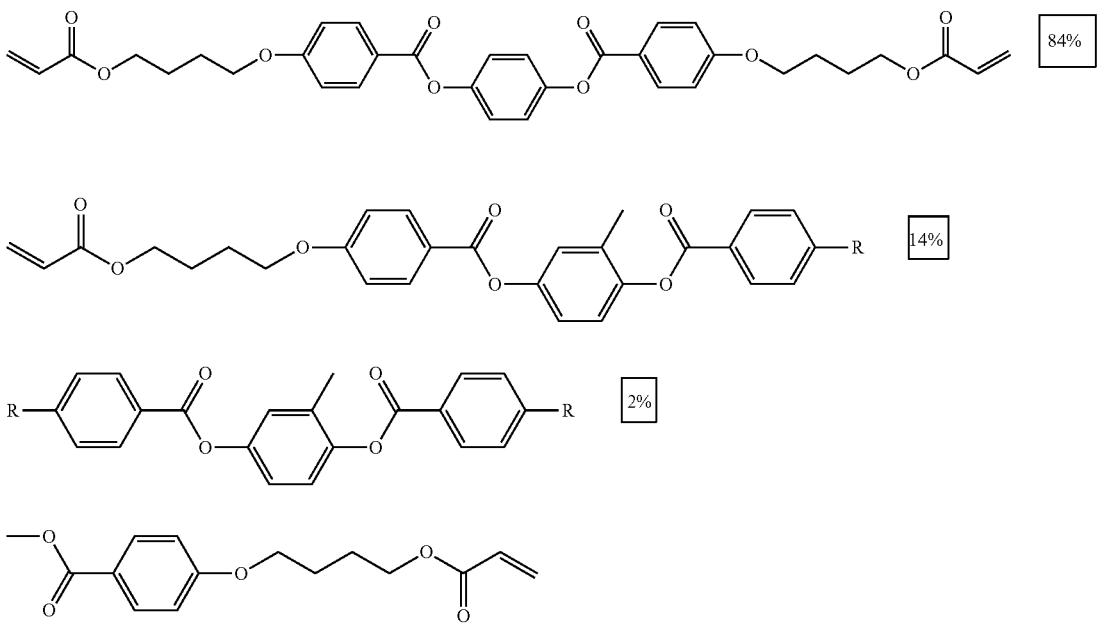

Liquid Crystal Compound LQ-2
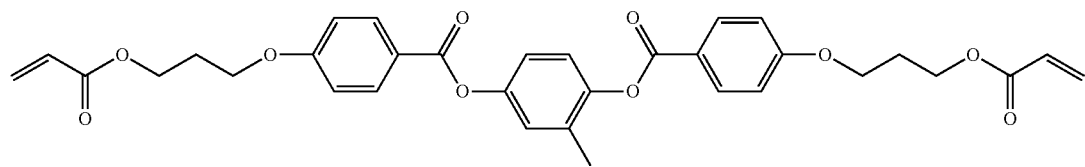 [SMILES: C=CC(=O)OCCCOc1ccc(C(=O)Oc2ccc(OC(=O)c3ccc(OCCCOC(=O)C=C)cc3)c(C)c2)cc1]
Polymerizable Compound (A)
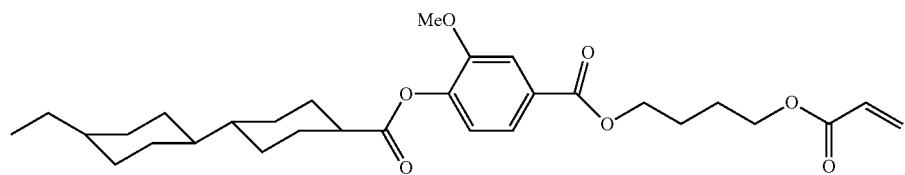 [SMILES: C=CC(=O)OCCCCOC(=O)c1ccc(OC(=O)C2CCC(C3CCC(CC)CC3)CC2)c(OC)c1]
Left Twisted Chiral Agent (CL1)
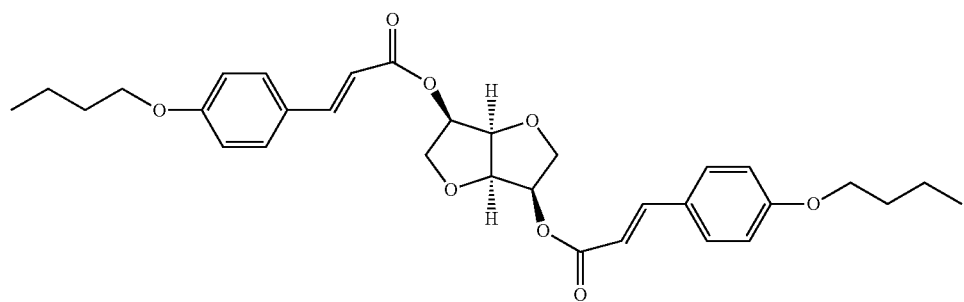 [SMILES: CCCCOc1ccc(/C=C/C(=O)O[C@@H]2CO[C@H]3[C@@H]2OC[C@H]3OC(=O)/C=C/c2ccc(OCCCC)cc2)cc1]
Right Twisted Chiral Agent (CR1)
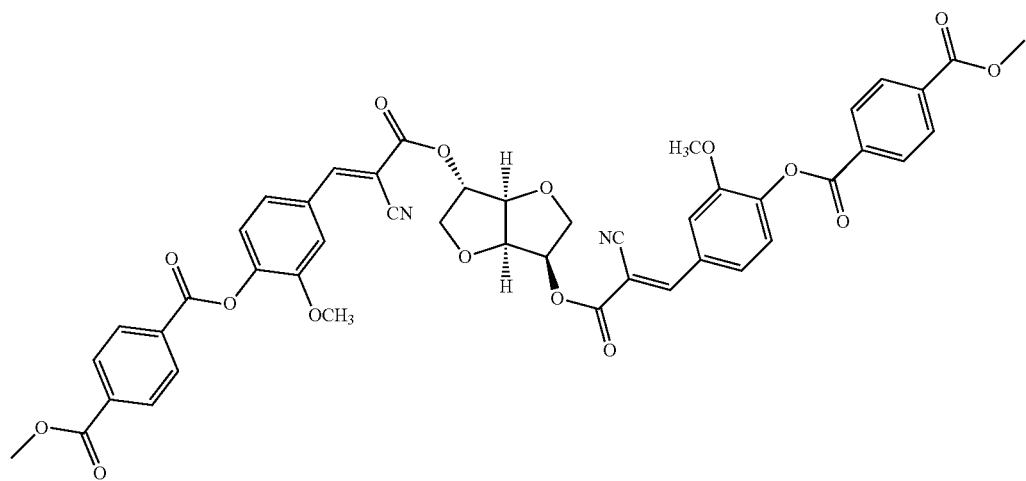

Polymer (A) (In the formulae, the numerical value described in each repeating unit represents the content (% by mass) of each repeating unit with respect to all repeating units)

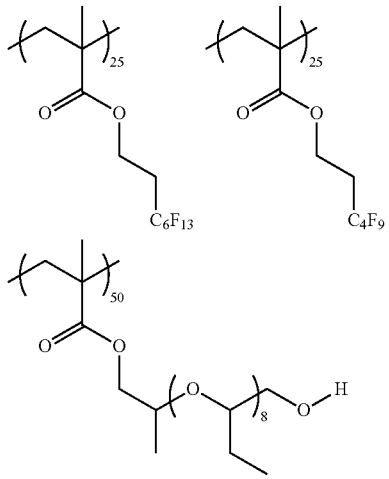

Polymer (B) (in the formulae, the numerical value described in each repeating unit represents the content (% by mass) of each repeating unit with respect to all repeating units)

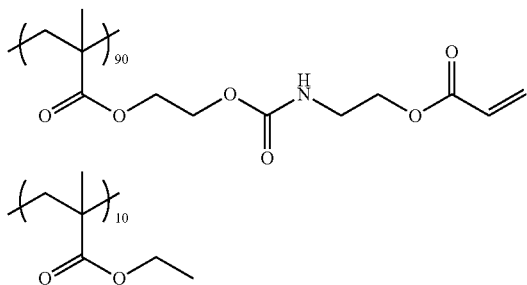

The optical film A prepared above was cut in parallel with the rubbing direction, and the optically anisotropic layer was observed in a cross-sectional direction with a polarizing microscope. The thickness of the optically anisotropic layer was 2.7 μm, a region (second region) where the thickness (d2) of the optically anisotropic layer on the side of the substrate was 1.3 μm was formed in a homogeneous alignment without a twisted angle, and a region (first region) where the thickness (d1) of the optically anisotropic layer on the air side (on a side opposite to the substrate) was 1.4 μm was formed such that the liquid crystal compound was twistedly aligned.

In addition, the optical characteristics of the optical film A were acquired using Axoscan (Axometrics, Inc.) and analysis software (Multi-Layer Analysis) (Axometrics, Inc.). The product ($\Delta n2 d2$) of $\Delta n2$ and the thickness d2 at a wavelength of 550 nm in the second region was 173 nm, the twisted angle of the liquid crystal compound was 0°, and the alignment axis angle of the liquid crystal compound with respect to the long longitudinal direction on the side in contact with the substrate was −10° and the alignment axis angle thereof on the side in contact with the first region was −10°.

The product ($\Delta n1 d1$) of $\Delta n1$ and the thickness d1 at a wavelength of 550 nm in the first region was 184 nm, the twisted angle of the liquid crystal compound was 75°, and the alignment axis angle of the liquid crystal compound with respect to the long longitudinal direction on the side in contact with the second region was −10° the alignment axis angle thereof on the air side was −85°.

The alignment axis angle of the liquid crystal compound contained in the optically anisotropic layer is described as negative in a case of clockwise (right-handed rotation) and as positive in a case of counterclockwise (left-handed rotation) as the substrate is observed from the surface side of the optically anisotropic layer by setting the width direction of the substrate to 0° as a reference.

In addition, the twisted angle of the liquid crystal compound is described as negative in a case where the alignment axis direction of the liquid crystal compound on the substrate side (back side) is clockwise (right-handed rotation) and as positive in a case where the alignment axis direction is counterclockwise (left-handed rotation) as the substrate is observed from the surface side of the optically anisotropic layer by setting the alignment axis direction of the liquid crystal compound on the surface side (front side) as a reference.

(Preparation of Circularly Polarizing Plate)

The surface of the substrate included in the optical film A prepared above and the surface of the above-described laminate A prepared in the same manner as in Example 20, from which the cellulose acylate film 1 had been removed, were bonded to each other using the pressure sensitive adhesive N1, thereby preparing a laminate A-2. That is, the laminate A-2 had the low-reflection surface film, the pressure sensitive adhesive layer, the oxygen blocking layer, the light absorption anisotropic film, the photo-alignment film, the pressure sensitive adhesive layer, the cellulose acylate film, and the optically anisotropic layer in this order.

Further, the absorption axis of the light absorption anisotropic film coincided with the longitudinal direction of the laminate A-2, the rotation angle of the in-plane slow axis in the second region of the optically anisotropic layer with respect to the absorption axis of the light absorption anisotropic film was 10°, and the rotation angle of the in-plane slow axis of the surface of the optically anisotropic layer on a side of the first region opposite to the side of the second region with respect to the absorption axis of the light absorption anisotropic film was 850.

An organic EL display device was prepared by the same method as in Example 1 except that the laminate A-2 prepared above was replaced with the laminate A-1.

Example 23

The cellulose acylate film 2 prepared in the same manner as in Example 22 was allowed to pass through a dielectric heating roll at a temperature of 60° C. and subjected to an alkali saponification treatment by the same method as that for Example 1.

(Formation of Alignment Film)

The surface of the cellulose acylate film 2 on which the alkali saponification treatment had been performed was continuously coated with a coating solution for forming an alignment film with the following composition using a #14 wire bar. The film was dried with hot air at 60° C. for 60 seconds and further dried with hot air at 100° C. for 120 seconds.

| Coating solution PA4 for forming alignment film | |
|---|---|
| Polyvinyl alcohol shown below | 10 parts by mass |
| Water | 371 parts by mass |
| Methanol | 119 parts by mass |
| Glutaraldehyde (crosslinking agent) | 0.5 parts by mass |
| Citric acid ester (manufactured by Sankyo Chemical Co., Ltd.) | 0.175 parts by mass |

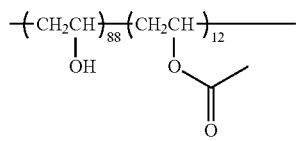

Polyvinyl alcohol (Formation of Optically Anisotropic Layer)

The alignment film prepared above was continuously subjected to a rubbing treatment. At this time, the longitudinal direction of the long film was parallel to the transport direction, and the angle between the longitudinal direction (transport direction) of the film and the rotation axis of the rubbing roller was set to 76°. In a case where the longitudinal direction (transport direction) of the film is set to 90° and the clockwise direction is represented by a positive value with respect to the film width direction as a reference (0°) as observed from the film side, the rotation axis of the rubbing roller is 14°. That is, the position of the rotation axis of the rubbing roller is a position rotated by 76° counterclockwise with respect to the longitudinal direction of the film as a reference.

The alignment film subjected to the rubbing treatment was coated with a composition (1a) for forming optically anisotropic layer with the following composition which contained a disk-like liquid crystal compound, using a Geyser coating machine, thereby forming a composition layer. Thereafter, the obtained composition layer was heated with hot air at 110° C. for 2 minutes for drying of the solvent and alignment aging of the disk-like liquid crystal compound. Subsequently, the obtained composition layer was irradiated with UV (500 mJ/cm$^2$) at 80° C. to fix the alignment of the liquid crystal compound, thereby forming an optically anisotropic layer (1a).

The thickness of the optically anisotropic layer (1a) was 1.1 μm. Further, the retardation at 550 nm was 168 nm. It was confirmed that the average tilt angle of the disc plane of the disk-like liquid crystal compound with respect to the film surface was 900 and the disc plane was aligned perpendicularly to the film surface. Further, the angle of the slow axis of the optically anisotropic layer (1a) was parallel to the rotation axis of the rubbing roller, and in a case where the width direction of the film was set to 0° (in the longitudinal direction, the counterclockwise direction was 900 and the clockwise direction was −90°), the slow axis was 14° as viewed from the side of the optically anisotropic layer (1a).

| Composition (1a) for forming optically anisotropic layer | |
|---|---|
| Disk-like liquid crystal compound LQ-3 shown below | 80 parts by mass |
| Disk-like liquid crystal compound LQ-4 shown below | 20 parts by mass |
| Alignment film interface alignment agent 1 shown below | 0.55 parts by mass |
| Alignment film interface alignment agent-2 | 0.05 parts by mass |
| Fluorine-containing compound A shown below | 0.1 parts by mass |
| Fluorine-containing compound B shown below | 0.05 parts by mass |
| Fluorine-containing compound C shown below | 0.21 parts by mass |
| Ethylene oxide-modified trimethylolpropane triacrylate (V#360, manufactured by Osaka Organic Chemical Industry Ltd.) | 10 parts by mass |
| Photopolymerization initiator (IRGACURE 907, manufactured by BASF SE) | 3.0 parts by mass |
| Methyl ethyl ketone | 200 parts by mass |

Disk-Like Liquid Crystal Compound LQ-3

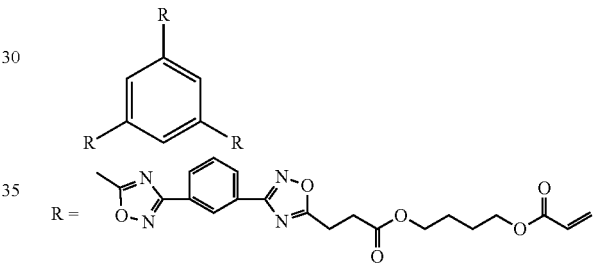

Disk-Like Liquid Crystal Compound LQ-4

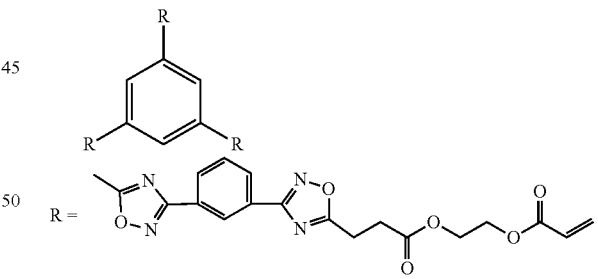

Alignment Film Interface Alignment Agent 1

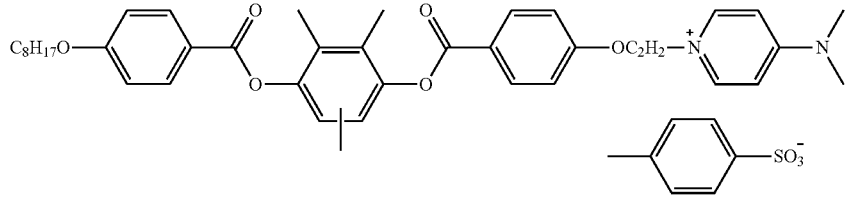

Fluorine-containing compound A (a and b in each repeating unit represent the content (% by mass) of each repeating unit with respect to all repeating units, and a represents 90% by mass and b represents 10% by mass)

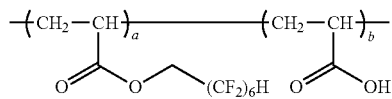

Fluorine-containing compound B (the numerical value in each repeating unit represents the content (% by mass) with respect to all repeating units, the content of the repeating unit on the left side was 32.5% by mass, and the content of the repeating unit on the right side was 67.5% by mass)

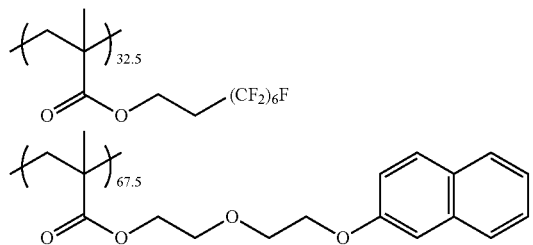

Fluorine-containing compound C (the numerical value in each repeating unit represents the content (% by mass) with respect to all repeating units, the content of the repeating unit on the left side was 25% by mass, the content of the repeating unit in the middle was 25% by mass, and the content of the repeating unit on the right side was 50% by mass)

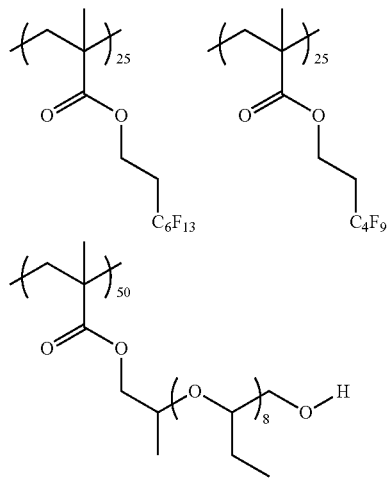

The prepared cellulose acylate film 2 was coated with a composition (1c) for forming an optically anisotropic layer with the following composition that contained a rod-like liquid crystal compound, using a Geyser coating machine, thereby forming a composition layer. Thereafter, both ends of the film were held, a cooling plate (9° C.) was provided on the side of the surface on which the coating film of the film was formed such that the distance from the film reached 5 mm, a heater (75° C.) was provided on a side opposite to the surface on which the coating film of the film was formed such that the distance from the film reached 5 mm, and the film was dried for 2 minutes.

Next, the film was heated with hot air at 60° C. for 1 minute and irradiated with ultraviolet rays with an irradiation amount of 100 mJ/cm$^2$ using a UV-LED at 365 nm while nitrogen purging was carried out such that an atmosphere with an oxygen concentration of 100 ppm or less was provided. Thereafter, a precursor layer was formed by performing annealing with hot air at 120° C. for 1 minute.

The obtained precursor layer was irradiated with UV light (ultra-high pressure mercury lamp; UL750; manufactured by HOYA Corporation) having passed through a wire grid polarizer at room temperature with an irradiation amount of 7.9 mJ/cm$^2$ (wavelength: 313 nm), thereby forming a composition layer having an alignment control ability on the surface.

Further, the film thickness of the formed composition layer was 0.5 μm. The in-plane retardation Re at a wavelength of 550 nm was 0 nm, and the retardation Rth at a wavelength of 550 nm in the thickness direction was −68 nm. It was confirmed that the average tilt angle of the rod-like liquid crystal compound with respect to the film surface in the major axis direction was 90° and the rod-like liquid crystal compound was aligned perpendicularly to the film surface.

In this manner, an optically anisotropic layer (1c) was formed on the cellulose acylate film 2.

| Composition (1c) for forming optically anisotropic layer | |
|---|---|
| Liquid crystal compound LQ-1 shown above | 100 parts by mass |
| Polymerizable monomer (A-400, manufactured by Shin Nakamura Chemical Industry Co., Ltd.) | 4.0 parts by mass |
| Polymerization initiator S-1 (oxime type) shown below | 5.0 parts by mass |
| Photoacid generator D-1 shown below | 3.0 parts by mass |
| Polymer M-1 shown below | 2.0 parts by mass |
| Vertical alignment agent S01 shown below | 2.0 parts by mass |
| Photo-alignment polymer A-1 shown below | 2.0 parts by mass |
| Fluorine-containing compound D shown below | 0.2 parts by mass |
| Methyl ethyl ketone | 42.3 parts by mass |
| Methyl isobutyl ketone | 627.5 parts by mass |

Polymerization Initiator S-1

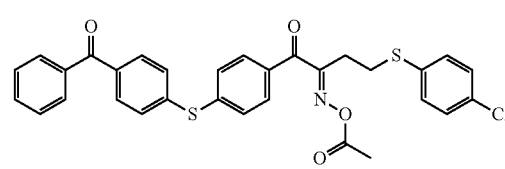

Photoacid Generator D-1

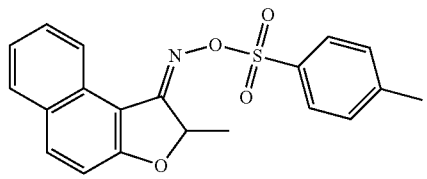 [SMILES: Cc1ccc(S(=O)(=O)O/N=C2/c3c(ccc4ccccc34)OC2C)cc1]

Polymer M-1
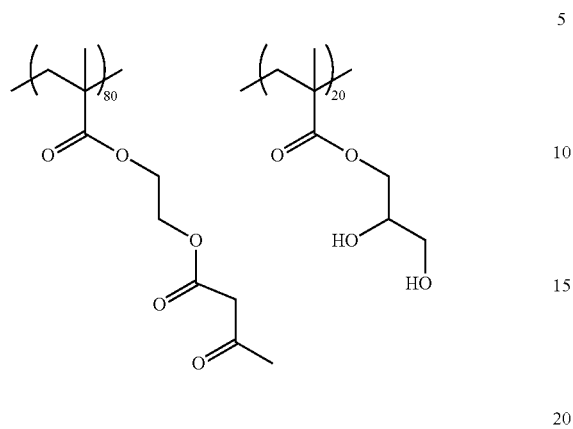
Vertical Alignment Agent S01
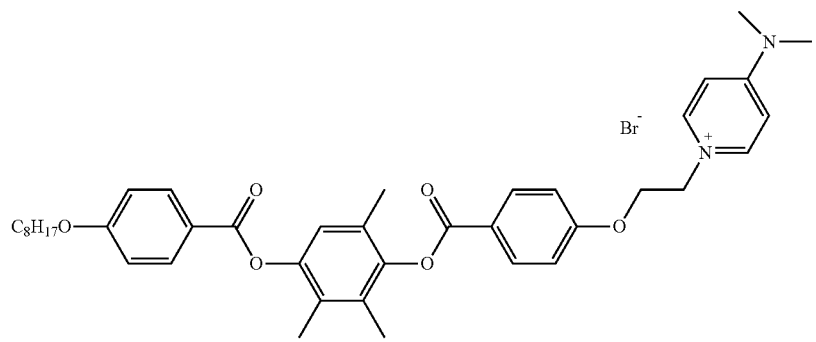
Photo-alignment polymer A-1 (the numerical value in each repeating unit represents the content (% by mass) of each repeating unit with respect to all repeating units, and the contents were 43% by mass, 27% by mass, and 30% by mass from the repeating unit on the left side, and the weight-average molecular weight was 69800.)
-continued
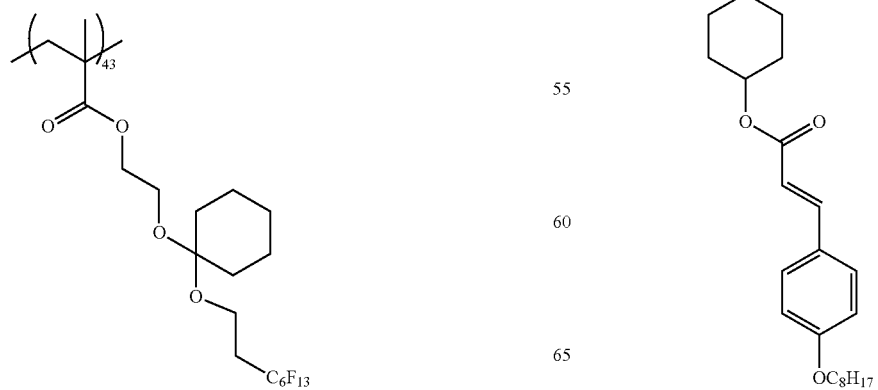

-continued

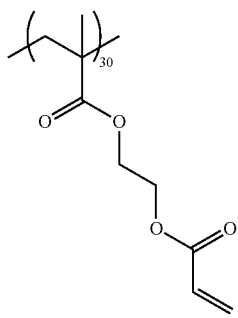

Fluorine-Containing Compound D (Weight-Average Molecular Weight: 2200)

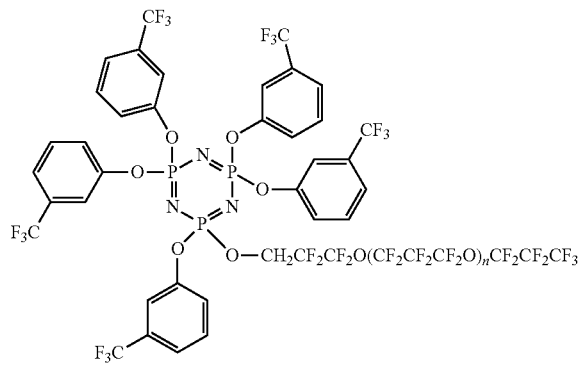

Next, the optically anisotropic layer (1c) prepared above was coated with a composition (1b) for forming an optically anisotropic layer with the following composition which contained a rod-like liquid crystal compound using a Geyser coating machine and heated with hot air at 80° C. for 60 seconds. Subsequently, the obtained composition layer was irradiated with UV (500 mJ/cm$^2$) at 80° C. to fix the alignment of the liquid crystal compound, thereby forming an optically anisotropic layer (1b).

The thickness of the optically anisotropic layer (1b) was 1.2 μm, the Δnd at a wavelength of 550 nm was 164 nm, and the twisted angle of the liquid crystal compound was 81°. In a case where the width direction of the film was set to 0° (the longitudinal direction was set to −90°), the angle of the alignment axis of the liquid crystal compound was −14° on the air side and was −95° on the side in contact with the optically anisotropic layer (1c) as viewed from the side of the optically anisotropic layer (1b).

| Composition (1b) for forming optically anisotropic layer | |
|---|---|
| Liquid crystal compound LQ-1 shown above | 100 parts by mass |
| Ethylene oxide-modified trimethylolpropane triacrylate (V#360, manufactured by Osaka Organic Chemical Industry Ltd.) | 4 parts by mass |
| Photopolymerization initiator (Irgacure 819, manufactured by BASF SE) | 3 parts by mass |
| Left twisted chiral agent (CL2) shown below | 0.60 parts by mass |
| Fluorine-containing compound C shown above | 0.08 parts by mass |
| Methyl ethyl ketone | 156 parts by mass |

Left Twisted Chiral Agent (CL2)

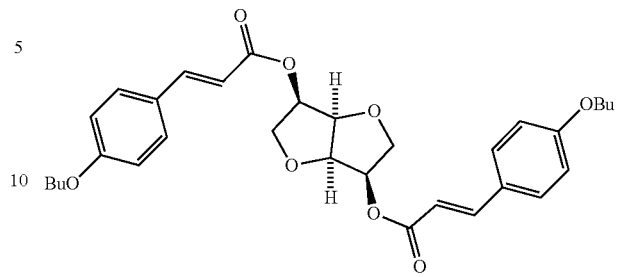

A laminate (1c-1b) was prepared by directly laminating the optically anisotropic layer (1c) and the optically anisotropic layer (1b) on the cellulose acylate film 2 according to the above-described procedures. In addition, the surface of the optically anisotropic layer (1c) on the side in contact with the optically anisotropic layer (1b) was confirmed by the above-described method, and it was confirmed that the photo-alignment polymer was present.

The optically anisotropic layer (1a) formed on the prepared cellulose acylate film 2 on the surface side and the optically anisotropic layer (1b) of the laminate (1c-1b) formed on the prepared cellulose acylate film 2 on the surface side were bonded to each other using an ultraviolet curable adhesive.

Subsequently, the cellulose acylate film on the side of the optically anisotropic layer (1a) was peeled off to expose the surface of the optically anisotropic layer (1a) in contact with the cellulose acylate film. In this manner, an optical film (1c-1b-1a) in which the optically anisotropic layer (1c), the optically anisotropic layer (1b), and the optically anisotropic layer (1a) were laminated in this order on a long cellulose acylate film was obtained.

(Preparation of Circularly Polarizing Plate)

The surface of the optically anisotropic layer (1a) of the optical film (1c-1b-1a) prepared above and the surface of the laminate A prepared in the same manner as in Example 20, from which the cellulose acylate film 1 had been removed, were bonded to each other with the pressure sensitive adhesive N1. Subsequently, the cellulose acylate film on the side of the optically anisotropic layer (1c) was peeled off to expose the surface of the optically anisotropic layer (1c) in contact with the cellulose acylate film.

In this manner, a laminate A-3 consisting of the optical film (1c-1b-1a) and the laminate A was prepared. That is, in the laminate A-3 was formed such that the low-reflection surface film, the pressure sensitive adhesive layer, the oxygen blocking layer, the light absorption anisotropic film, the photo-alignment film, the pressure sensitive adhesive layer, the optically anisotropic layer (1a), the optically anisotropic layer (1b), and the optically anisotropic layer (1c) were laminated in this order, and the angle between the absorption axis of the light absorption anisotropic film and the slow axis of the optically anisotropic layer (1a) was 76°. Further, the angle of the alignment axis of the liquid crystal compound on the side of the optically anisotropic layer (1a) of the optically anisotropic layer (1b) was 14° and coincided with the direction of the slow axis of the optically anisotropic layer (1a) in a case where the width direction was set to 0° as a reference.

An organic EL display device was prepared by the same method as in Example 1 except that the laminate A-3 prepared above was replaced with the laminate A-1.

Example 24

An organic EL display device was prepared by the same method as that for Example 16 except that the composition for forming a light absorption anisotropic film was changed to P9 and an alkali-free glass Eagle XG (manufactured by Corning Inc.) with a thickness of 1.1 mm was changed to a glass base material having a thickness of 50 μm (D263, manufactured by SCHOTT AG) in Example 16.

Example 25

An organic EL display device was prepared by the same method as that for Example 17 except that the composition for forming a light absorption anisotropic film was changed to P9 and an alkali-free glass Eagle XG (manufactured by Corning Inc.) with a thickness of 1.1 mm was changed to a glass base material having a thickness of 50 μm (D263, manufactured by SCHOTT AG) in Example 17.

Example 26

An organic EL display device was prepared by the same method as that for Example 25 except for a change to glass with an AR film, obtained by bonding an AR film having a multilayer sputtered metal oxide film (AR100: 91 μm, manufactured by Dexerials Corporation) in advance and a glass base material having a thickness of 50 μm (D263, manufactured by SCHOTT AG) to each other with the UV adhesive in Example 25. Further, during the bonding with a UV adhesive, the bonding was performed by irradiation with UV at 600 mJ/cm². The thickness of the UV adhesive layer was 3 μm. Further, the surfaces bonded to each other with the UV adhesive were respectively subjected to a corona treatment.

Example 27

An organic EL display device was prepared by the same method as that for Example 26 except for a change to glass with an AR film, obtained by bonding an AR film (AR100: 91 μm, manufactured by Dexerials Corporation) and a glass base material having a thickness of 50 μm (D263, manufactured by SCHOTT AG) to each other with the pressure sensitive adhesive N1 in Example 26.

Example 28

As a viewing angle control film, a light absorption anisotropic film P11 in which the dichroic substance was aligned perpendicularly to the film thickness direction was prepared as described below.

<Preparation of Transparent Support 1>

A surface of a cellulose acylate film 3 (TAC base material having a thickness of 40 μm; TG40, manufactured by FUJIFILM Corporation) was saponified with an alkaline solution and coated with the following coating solution PA5 for forming an alignment film using a wire bar. The support on which the coating film had been formed was dried with hot air at 60° C. for 60 seconds and further dried with hot air at 100° C. for 120 seconds to form an alignment layer, thereby obtaining a TAC film with an alignment layer.

The film thickness of the alignment layer was 1 μm.

| Coating solution PA5 for forming alignment film | |
|---|---|
| Modified polyvinyl alcohol shown below | 3.80 parts by mass |
| Photopolymerization initiator Irg2959 (manufactured by BASF SE) | 0.20 parts by mass |
| Water | 70 parts by mass |
| Methanol | 30 parts by mass |

Modified Polyvinyl Alcohol

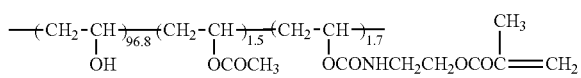

<Formation of Light Absorption Anisotropic Layer P11>

The obtained alignment layer was continuously coated with the following composition P11 for forming a light absorption anisotropic film with a wire bar to form a coating layer P11.

Next, the coating layer P11 was heated at 140° C. for 30 seconds, and the coating layer P11 was cooled to room temperature (23° C.).

Next, the coating layer was heated at 80° C. for 60 seconds and cooled to room temperature again.

Thereafter, a light absorption anisotropic film P11 in which the dichroic substance was aligned perpendicularly to the film surface of the alignment layer was prepared by irradiating the coating layer with an LED lamp (center wavelength of 365 nm) for 2 seconds under an irradiation condition of an illuminance of 200 mW/cm². The film thickness of the coating layer P11 was 3 μm and the alignment degree thereof was 0.96. The resulting layer was defined as a viewing angle control film 1.

| Composition of composition P11 for forming light absorption anisotropic film | |
|---|---|
| Dichroic substance Y-1 shown above | 0.40 parts by mass |
| Dichroic substance M-1 shown above | 0.15 parts by mass |
| Dichroic substance C-1 shown above | 0.63 parts by mass |
| Liquid crystal compound L-1 shown above | 3.65 parts by mass |
| Polymerization initiator IRGACURE OXE-02 (manufactured by BASF SE) | 0.040 parts by mass |
| Compound E-1 shown below | 0.060 parts by mass |
| Compound E-2 shown below | 0.060 parts by mass |
| Fluorine-containing compound E shown below | 0.010 parts by mass |
| Fluorine-containing compound F shown below | 0.015 parts by mass |
| Cyclopentanone | 47.00 parts by mass |
| Tetrahydrofuran | 47.00 parts by mass |
| Benzyl alcohol | 1.00 parts by mass |

Compound E-1

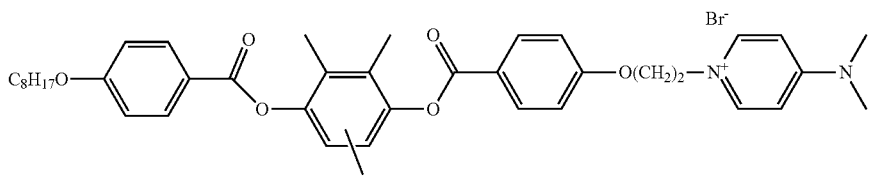

Compound E-2

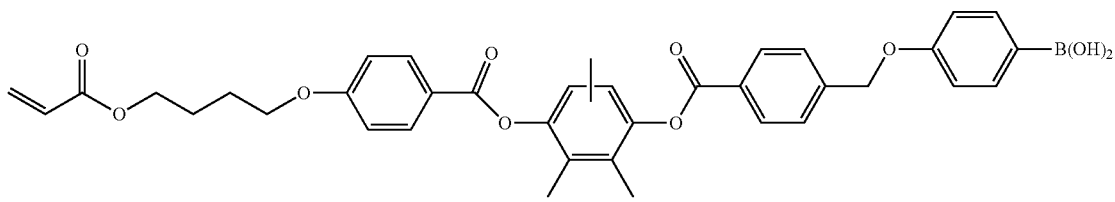

Fluorine-Containing Compound E

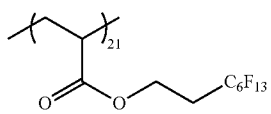

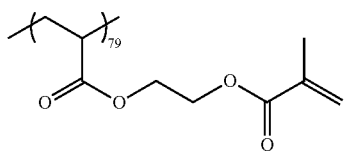

Fluorine-Containing Compound F

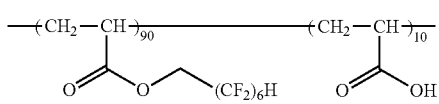

In Example 16, the cycloolefin film was changed to the viewing angle control film 1, and the surface of the viewing angle control film on the side of the cellulose acylate film and the laminate A on the side of the oxygen blocking layer B1 were bonded to each other with the pressure sensitive adhesive N1. An organic EL display device was prepared by the same method as that for Example 16 except for the procedures described above. The obtained organic EL display device had a high transmittance from the front surface and a low transmittance in an oblique direction.

Comparative Example 1

A laminate and an organic EL display device were prepared by the same method as that for Example 1 except that the composition P1 for forming a light absorption anisotropic film was replaced with a composition P12 for forming a light absorption anisotropic film with the following composition and the heating temperature was changed to the temperature listed in Table 2.

| Composition P12 for forming light absorption anisotropic film | |
|---|---|
| First dichroic substance C-1 shown above | 0.64 parts by mass |
| Second dichroic substance M-2 shown below | 0.42 parts by mass |
| Third dichroic substance Y-2 shown below | 0.39 parts by mass |
| Liquid crystal compound L-3 shown below | 4.48 parts by mass |
| Polymerization initiator IRGACURE OXE-02 (manufactured by BASF SE) | 0.051 parts by mass |
| Surfactant F-4 shown below | 0.031 parts by mass |
| Cyclopentanone | 45.83 parts by mass |
| Tetrahydrofuran | 45.83 parts by mass |
| Benzyl alcohol | 2.35 parts by mass |

Dichroic Substance M-2 (Maximal Absorption Wavelength: 475 nm)

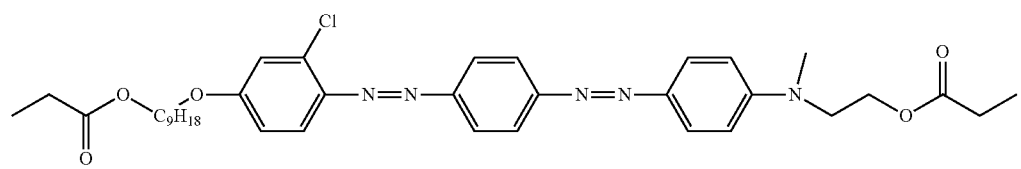

Dichroic Substance Y-2 (Maximal Absorption Wavelength: 416 nm)

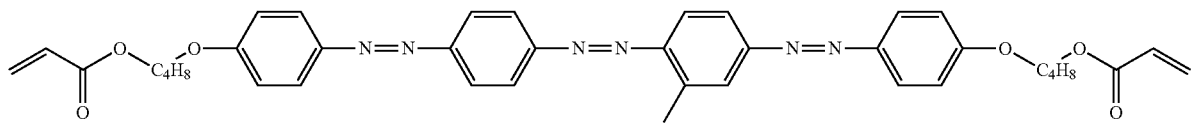

Liquid Crystal Compound L-3

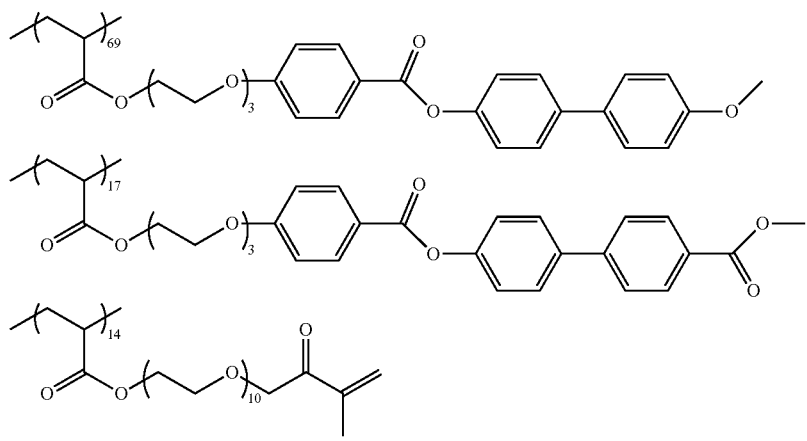

Surfactant F-4

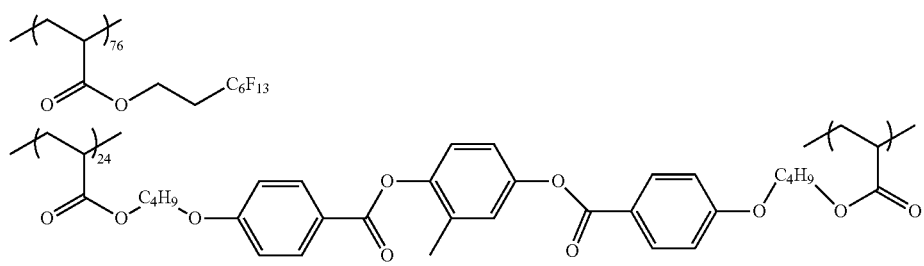

Example 29

A laminate and an organic EL display device were prepared by the same method as that for Example 1 except that the composition P1 for forming a light absorption anisotropic film was replaced with a composition P13 for forming a light absorption anisotropic film with the following composition, the film thickness of the light absorption anisotropic film P1 was changed to 2.0 μm, and the heating temperature was set as listed in Table 1.

| Composition P13 for forming light absorption anisotropic film | |
|---|---|
| First dichroic substance C-1 shown above | 0.65 parts by mass |
| Second dichroic substance M-1 shown above | 0.16 parts by mass |
| Third dichroic substance Y-1 shown below | 0.28 parts by mass |
| Liquid crystal compound L-1 shown above | 3.64 parts by mass |
| Liquid crystal compound L-4 shown above | 1.56 parts by mass |
| Polymerization initiator IRGACURE OXE-02 (manufactured by BASF SE) | 0.19 parts by mass |
| Surfactant F-9 shown below | 0.016 parts by mass |

-continued

| Composition P13 for forming light absorption anisotropic film | |
|---|---|
| Cyclopentanone | 91.16 parts by mass |
| Benzyl alcohol | 2.34 parts by mass |

Surfactant F-9

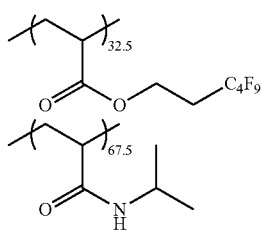

Example 30

A laminate and an organic EL display device were prepared by the same method as that for Example 1 except that the composition P1 for forming a light absorption anisotropic film was replaced with a composition P14 for forming a light absorption anisotropic film with the following composition, the film thickness of the light absorption anisotropic film P1 was changed to 2.0 µm, and the heating temperature was changed to the temperature listed in Table 1.

| Composition P14 for forming light absorption anisotropic film | |
|---|---|
| First dichroic substance C-1 shown above | 0.65 parts by mass |
| Second dichroic substance M-1 shown above | 0.16 parts by mass |
| Third dichroic substance Y-1 shown below | 0.28 parts by mass |
| Liquid crystal compound L-1 shown above | 3.64 parts by mass |
| Liquid crystal compound L-4 shown above | 1.56 parts by mass |
| Polymerization initiator IRGACURE OXE-02 (manufactured by BASF SE) | 0.19 parts by mass |
| Surfactant F-1 shown above | 0.003 parts by mass |
| Surfactant F-9 shown above | 0.013 parts by mass |
| Cyclopentanone | 91.16 parts by mass |
| Benzyl alcohol | 2.34 parts by mass |

[Display Performance]

The visibility and display quality of the prepared organic EL display device were evaluated under bright light. The display screen of the display device was set to be displayed in black, and reflected light in a case of projecting fluorescent light on the front surface at a polar angle of 45 degrees was observed. The display performance was evaluated based on the following standards. The evaluation results are listed in Tables 1 and 2.

<Evaluation Standards>
A: The screen was displayed in black and coloring was not visually recognized
B: Coloring was slightly visually recognized, but the reflectivity was extremely low
C: Coloring was slightly visually recognized, but the reflectivity was low
D: Coloring was slightly visually recognized, and the reflectivity was high
E: Coloring was clearly visually recognized, and the reflectivity was extremely high

[Durability]

The prepared organic EL display device was allowed to be aged for 500 hours in an environment of 80° C. and a relative humidity of less than 10%. Thereafter, the visibility and the display quality of the obtained display device were evaluated under bright light. The display screen of the display device was set to be displayed in black, and reflected light in a case of projecting fluorescent light on the front surface at a polar angle of 45 degrees was observed. The display performance was evaluated based on the following standards. The evaluation results are listed in Tables 1 and 2.

<Evaluation Standards>
A: The screen was displayed in black and coloring was not visually recognized
B: Coloring was slightly visually recognized, but the reflectivity was extremely low
C: Coloring was slightly visually recognized, but the reflectivity was low
D: Coloring was slightly visually recognized, and the reflectivity was high
E: Coloring was clearly visually recognized, and the reflectivity was extremely high

[Durability at 95° C.]

The prepared organic EL display device was allowed to be aged for 600 hours in an environment of 95° C. and a relative humidity of less than 5%. Thereafter, the visibility and the display quality of the obtained display device were evaluated under bright light. The display screen of the display device was set to be displayed in black, and reflected light in a case of projecting fluorescent light on the front surface at a polar angle of 45 degrees was observed. The display performance was evaluated based on the following standards. The evaluation results are listed in Tables 1 and 2.

<Evaluation Standards>
A: The screen was displayed in black and coloring was not visually recognized
B: Coloring was slightly visually recognized, but the reflectivity was extremely low
C: Coloring was slightly visually recognized, but the reflectivity was low
D: Coloring was slightly visually recognized, and the reflectivity was high
E: Coloring was clearly visually recognized, and the reflectivity was extremely high

TABLE 1

| | Light absorption anisotropic layer | | | | | | | | | | |
|---|---|---|---|---|---|---|---|---|---|---|---|
| | Surfactant | | Liquid crystal compound | | Dichroic substance | | | | | | Difference between log P of surfactant and log P of liquid crystal compound (minimum value) |
| | Structure | log P | Structure | log P | Structure | log P | Structure | log P | Structure | log P | |
| Example 1 | F-1 | 6.0 | L-1 | 2.9 | Y-1 | 9.7 | M-1 | 10.3 | C-1 | 10.6 | 3.1 |
| Example 2 | F-1 | 6.0 | L-1 L-2 | 2.9 4.6 | Y-1 | 9.7 | M-1 | 10.3 | C-1 | 10.6 | 1.4 |
| Example 3 | F-1 | 6.0 | L-3 L-2 | 2.9 4.6 | Y-1 | 9.7 | M-1 | 10.3 | C-1 | 10.6 | 1.4 |
| Example 4 | F-1 | 6.0 | L-1 L-2 | 2.9 4.6 | Y-1 | 9.7 | M-1 | 10.3 | C-1 | 10.6 | 1.4 |
| Example 5 | F-2 | 3.9 | L-1 L-2 | 2.9 4.6 | Y-1 | 9.7 | M-1 | 10.3 | C-1 | 10.6 | 0.7 |
| Example 6 | F-3 | 2.8 | L-1 L-2 | 2.9 4.6 | Y-1 | 9.7 | M-1 | 10.3 | C-1 | 10.6 | 0.1 |

TABLE 1-continued

| | | | | | | | | | | |
|---|---|---|---|---|---|---|---|---|---|---|
| Example 7 | F-1 | 6.0 | L-3<br>L-4 | 2.9<br>7.6 | Y-1 | 9.7 | M-1 | 10.3 | C-1 | 10.6 | 1.6 |
| Example 8 | F-1 | 6.0 | L-3<br>L-4 | 2.9<br>7.6 | Y-1 | 9.7 | M-1 | 10.3 | C-1 | 10.6 | 1.6 |
| Example 9 | F-1 | 6.0 | L-1<br>L-4 | 2.9<br>7.6 | Y-1 | 9.7 | M-1 | 10.3 | C-1 | 10.6 | 1.6 |
| Example 10 | F-1 | 6.0 | L-3<br>L-4 | 2.9<br>7.6 | Y-1 | 9.7 | M-1 | 10.3 | C-1 | 10.6 | 1.6 |
| Example 11 | F-1 | 6.0 | L-3<br>L-4 | 2.9<br>7.6 | Y-1 | 9.7 | — | — | C-1 | 10.6 | 1.6 |
| Example 12 | F-1 | 6.0 | L-1<br>L-2<br>L-4 | 2.9<br>4.6<br>7.6 | Y-1 | 9.7 | M-1 | 10.3 | C-1 | 10.6 | 1.4 |
| Example 13 | F-1 | 6.0 | L-1<br>L-2<br>L-4 | 2.9<br>4.6<br>7.6 | Y-1 | 9.7 | M-1 | 10.3 | C-1 | 10.6 | 1.4 |
| Example 14 | F-1 | 6.0 | L-1<br>L-2<br>L-4 | 2.9<br>4.6<br>7.6 | Y-1 | 9.7 | M-1 | 10.3 | C-1 | 10.6 | 1.4 |
| Example 15 | F-1 | 6.0 | L-1<br>L-4 | 2.9<br>7.6 | Y-1 | 9.7 | M-1 | 10.3 | C-1 | 10.6 | 1.6 |

| | Light absorption anisotropic layer | | | | Evaluation | | |
|---|---|---|---|---|---|---|---|
| | Difference between log P of dichroic substance and log P of liquid crystal compound (maximum value) | Heating temperature | Intensity ratio Imax/[snr] in signal derived from dichroic substance | Gradient thickness [nm] | Display performance | Durability | Durability at 95° C. |
| Example 1 | 7.7 | 80° C. | 2.4 | 50 | C | C | C |
| Example 2 | 7.7 | 65° C. | 15 | 53 | B | B | C |
| Example 3 | 7.7 | 70° C. | 15 | 60 | B | B | B |
| Example 4 | 7.7 | 75° C. | >20 | 62 | B | B | B |
| Example 5 | 7.7 | 75° C. | >20 | 75 | A | A | A |
| Example 6 | 7.7 | 75° C. | >20 | 93 | A | A | A |
| Example 7 | 7.7 | 75° C. | >20 | 60 | B | B | B |
| Example 8 | 7.7 | 75° C. | >20 | 58 | B | B | C |
| Example 9 | 7.7 | 75° C. | >20 | 55 | B | B | C |
| Example 10 | 7.7 | 75° C. | >20 | 56 | B | B | C |
| Example 11 | 7.7 | 75° C. | >20 | 58 | B | B | C |
| Example 12 | 7.7 | 75° C. | >20 | 66 | B | B | B |
| Example 13 | 7.7 | 75° C. | >20 | 60 | B | B | B |
| Example 14 | 7.7 | 75° C. | >20 | 57 | B | B | C |
| Example 15 | 7.7 | 75° C. | >20 | 68 | B | B | B |

TABLE 2

| | Light absorption anisotropic layer | | | | | | | | | |
|---|---|---|---|---|---|---|---|---|---|---|
| | Surfactant | | Liquid crystal compound | | Dichroic substance | | | | | | Difference between log P of surfactant and log P of liquid crystal compound (minimum value) |
| | Structure | log P | Structure | log P | Structure | log P | Structure | log P | Structure | log P | |
| Example 16 | F-1 | 6.0 | L-1<br>L-4 | 2.9<br>7.6 | Y-1 | 9.7 | M-1 | 10.3 | C-1 | 10.6 | 1.6 |
| Example 17 | F-1 | 6.0 | L-1<br>L-4 | 2.9<br>7.6 | Y-1 | 9.7 | M-1 | 10.3 | C-1 | 10.6 | 1.6 |
| Example 18 | F-1 | 6.0 | L-1<br>L-4 | 2.9<br>7.6 | Y-1 | 9.7 | M-1 | 10.3 | C-1 | 10.6 | 1.6 |
| Example 19 | F-6 | 3.3 | L-1<br>L-4 | 2.9<br>7.6 | Y-1 | 9.7 | M-1 | 10.3 | C-1 | 10.6 | 0.4 |
| Example 20 | F-7 | 3.1 | L-1<br>L-4 | 2.9<br>7.6 | Y-1 | 9.7 | M-1 | 10.3 | C-1 | 10.6 | 0.2 |
| Example 21 | F-8 | 4.0 | L-1<br>L-2<br>L-4 | 2.9<br>4.6<br>7.6 | Y-1 | 9.7 | M-1 | 10.3 | C-1 | 10.6 | 0.6 |
| Example 22 | F-7 | 3.1 | L-1<br>L-4 | 2.9<br>7.6 | Y-1 | 9.7 | M-1 | 10.3 | C-1 | 10.6 | 0.2 |
| Example 23 | F-7 | 3.1 | L-1<br>L-4 | 2.9<br>7.6 | Y-1 | 9.7 | M-1 | 10.3 | C-1 | 10.6 | 0.2 |
| Example 24 | F-7 | 3.1 | L-1<br>L-4 | 2.9<br>7.6 | Y-1 | 9.7 | M-1 | 10.3 | C-1 | 10.6 | 0.2 |
| Example 25 | F-7 | 3.1 | L-1<br>L-4 | 2.9<br>7.6 | Y-1 | 9.7 | M-1 | 10.3 | C-1 | 10.6 | 0.2 |
| Example 26 | F-7 | 3.1 | L-1<br>L-4 | 2.9<br>7.6 | Y-1 | 9.7 | M-1 | 10.3 | C-1 | 10.6 | 0.2 |
| Example 27 | F-7 | 3.1 | L-1<br>L-4 | 2.9<br>7.6 | Y-1 | 9.7 | M-1 | 10.3 | C-1 | 10.6 | 0.2 |
| Example 28 | F-1 | 6.0 | L-1<br>L-4 | 2.9<br>7.6 | Y-1 | 9.7 | M-1 | 10.3 | C-1 | 10.6 | 1.6 |
| Example 29 | F-9 | 2.3 | L-1<br>L-4 | 2.9<br>7.6 | Y-1 | 9.7 | M-1 | 10.3 | C-1 | 10.6 | 0.6 |
| Example 30 | F-1<br>F-9 | 6.0<br>2.3 | L-1<br>L-4 | 2.9<br>7.6 | Y-1 | 9.7 | M-1 | 10.3 | C-1 | 10.6 | 0.6 |
| Comparative Example 1 | F-4 | 7.0 | L-3 | 3.7 | Y-2 | 9.4 | M-2 | 10.1 | C-1 | 10.6 | 3.3 |
| Comparative Example 2 | F-1 | 6.0 | L-1<br>L-2 | 2.9<br>4.6 | Y-1 | 9.7 | M-1 | 10.3 | C-1 | 10.6 | 1.4 |
| Comparative Example 3 | F-1 | 6.0 | L-1<br>L-2 | 2.9<br>4.6 | Y-1 | 9.7 | M-1 | 10.3 | C-1 | 10.6 | 1.4 |

| | Light absorption anisotropic layer | | | | Evaluation | | |
|---|---|---|---|---|---|---|---|
| | Difference between log P of dichroic substance and log P of liquid crystal compound (maximum value) | Heating temperature | Intensity ratio Imax/[snr] in signal derived from dichroic substance | Gradient thickness [nm] | Display performance | Durability | Durability at 95° C. |
| Example 16 | 7.7 | 75° C. | >20 | 62 | B | B | B |
| Example 17 | 7.7 | 75° C. | >20 | 61 | B | B | B |
| Example 18 | 7.7 | 75° C. | >20 | 71 | B | B | B |
| Example 19 | 7.7 | 75° C. | >20 | 90 | A | A | A |
| Example 20 | 7.7 | 75° C. | >20 | 94 | A | A | A |
| Example 21 | 7.7 | 75° C. | >20 | 90 | A | A | A |
| Example 22 | 7.7 | 75° C. | >20 | 94 | A | A | A |
| Example 23 | 7.7 | 75° C. | >20 | 94 | A | A | A |

TABLE 2-continued

| | | | | | | | |
|---|---|---|---|---|---|---|---|
| Example 24 | 7.7 | 75° C. | >20 | 95 | A | A | A |
| Example 25 | 7.7 | 75° C. | >20 | 94 | A | A | A |
| Example 26 | 7.7 | 75° C. | >20 | 94 | A | A | A |
| Example 27 | 7.7 | 73° C. | >20 | 94 | A | A | A |
| Example 28 | 7.7 | 75° C. | >20 | 62 | B | B | B |
| Example 29 | 7.7 | 65° C. | >20 | 98 | A | A | A |
| Example 30 | 7.7 | 65° C. | >20 | 94 | A | A | A |
| Comparative Example 1 | 6.9 | 80° C. | 1.3 | 42 | D | E | E |
| Comparative Example 2 | 7.7 | 23° C. | 1.0 | 7 | E | E | E |
| Comparative Example 3 | 7.7 | 60° C. | 1.7 | 21 | D | E | E |

Based on the results listed in Tables 1 and 2, it was found that in a case where the relationship between the maximum intensity Imax of the light absorption anisotropic film in the thickness direction and the intensity Isur1 in the viewing-side surface of the image display device of the light absorption anisotropic film did not satisfy Expression (I-1) in the signal derived from the dichroic substance detected by TOF-SIMS, both the display performance and the durability were degraded (Comparative Examples 1 to 3).

On the contrary, it was found that in a case where the relationship between the maximum intensity Imax and the intensity Isur1 satisfied Expression (I-1), both the display performance and the durability were enhanced (Examples 1 to 30).

In particular, based on the comparison between the examples, it was found that the display performance and the durability were further enhanced in a case where the gradient thickness was greater than 50 nm, and the display performance and the durability were even further enhanced in a case where the gradient thickness was greater than 60 nm. Similarly, it was found that the display performance and the durability were further enhanced in a case where the difference between the log P value of the surfactant and the log P value of the liquid crystal compound was less than 3.1, and the display performance and the durability were even further enhanced in a case where the difference was less than 1.4.

In addition, based on the comparison between the examples and the comparative examples, it was also found that the relationship between the maximum intensity Imax and the intensity Isur1 could not be adjusted depending on the kind of the dichroic substance and the heating temperature during the formation of the light absorption anisotropic film.

Further, in a case where the composition contained a surfactant in which the difference in the log P value with the liquid crystal compound was less than 1.4 and a surfactant in which the difference in the log P value with the liquid crystal compound was 1.4 or greater, the display performance and the durability were enhanced, the surface smoothness was high, cissing and unevenness were suppressed, and the in-plane uniformity was extremely excellent.

What is claimed is:

1. A light absorption anisotropic film used for an image display device, which is formed of a liquid crystal composition containing a liquid crystal compound and a dichroic substance,
    wherein in a signal derived from the dichroic substance detected by time-of-flight secondary ion mass spectrometry, a relationship between a maximum intensity Imax of the light absorption anisotropic film in a thickness direction and an intensity Isur1 in a surface of the light absorption anisotropic film on a viewing side of the image display device satisfies Expression (I-1), $$2.0 \leq Imax/Isur1 \qquad (I\text{-}1).$$

2. A light absorption anisotropic film used for an image display device, which is formed of a liquid crystal composition containing a liquid crystal compound and a dichroic substance,
    wherein in a signal derived from the dichroic substance detected by time-of-flight secondary ion mass spectrometry, a relationship between a maximum intensity Imax of the light absorption anisotropic film in a thickness direction and an intensity Isur1 in a surface of the light absorption anisotropic film on a viewing side of the image display device satisfies Expression (I-1), and
    wherein a thickness between the surface of the light absorption anisotropic film on the viewing side of the image display device and a position where the maximum intensity Imax is exhibited is greater than 50 nm, $$2.0 \leq Imax/Isur1 \qquad (I\text{-}1).$$

3. The light absorption anisotropic film according to claim 1,
    wherein a thickness between the surface of the light absorption anisotropic film on the viewing side of the image display device and a position where the maximum intensity Imax is exhibited is greater than 60 nm.

4. A light absorption anisotropic film used for an image display device, which is formed of a liquid crystal composition containing a liquid crystal compound and a dichroic substance,
    wherein in a signal derived from the dichroic substance detected by time-of-flight secondary ion mass spectrometry, a relationship between a maximum intensity Imax of the light absorption anisotropic film in a thickness direction and an intensity Isur1 in a surface of the light absorption anisotropic film on a viewing side of the image display device satisfies Expression (I-1), and wherein the liquid crystal composition further contains a surfactant, and a difference between a log P value of the surfactant and a log P value of the liquid crystal compound is less than 3.1, $$2.0 \leq Imax/Isur1 \quad (I\text{-}1).$$

5. The light absorption anisotropic film according to claim 1, wherein the liquid crystal composition further contains a surfactant, and a difference between a log P value of the surfactant and a log P value of the liquid crystal compound is less than 1.4.

6. The light absorption anisotropic film according to claim 1, wherein the liquid crystal composition further contains a surfactant, where a difference in a log P value between the surfactant and the liquid crystal compound is less than 1.4 and a surfactant, where a difference in a log P value between the surfactant and the liquid crystal compound is greater than or equal to 1.4.

7. A laminate used for an image display device, comprising in order:

a base material;

an alignment film; and a light absorption anisotropic film, wherein the light absorption anisotropic film is the light absorption anisotropic film according to claim 1, and in a signal derived from the dichroic substance detected by time-of-flight secondary ion mass spectrometry, a relationship between a maximum intensity Imax of the light absorption anisotropic film in a thickness direction and an intensity Isur1 in a surface of the light absorption anisotropic film on a viewing side of the image display device satisfies Expression (I-1), $$2.0 \leq Imax/Isur1 \quad (I\text{-}1).$$

8. The laminate according to claim 7, further comprising:
a retardation plate provided on the light absorption anisotropic film,
wherein the retardation plate includes a plurality of optically anisotropic layers containing a liquid crystal compound, and
at least one of the plurality of optically anisotropic layers is an optically anisotropic layer containing a twistedly aligned liquid crystal compound having a helix axis in the thickness direction.

9. The laminate according to claim 7, further comprising:
a surface protective material provided on the light absorption anisotropic film,
wherein the base material is a glass base material having a thickness of 100 μm or less.

10. The laminate according to claim 7, further comprising:
a λ/4 plate provided on the light absorption anisotropic film.

11. An image display device comprising:
the light absorption anisotropic film according to claim 1.

12. An image display device comprising:
the laminate according to claim 7.

13. The light absorption anisotropic film according to claim 2,
wherein the liquid crystal composition further contains a surfactant, and
a difference between a log P value of the surfactant and a log P value of the liquid crystal compound is less than 3.1.

14. The light absorption anisotropic film according to claim 2,
wherein the liquid crystal composition further contains a surfactant, and
a difference between a log P value of the surfactant and a log P value of the liquid crystal compound is less than 1.4.

15. The light absorption anisotropic film according to claim 2,
wherein the liquid crystal composition further contains a surfactant, where a difference in a log P value between the surfactant and the liquid crystal compound is less than 1.4 and a surfactant, where a difference in a log P value between the surfactant and the liquid crystal compound is greater than or equal to 1.4.

16. A laminate used for an image display device, comprising in order:
a base material;
an alignment film; and
a light absorption anisotropic film,
wherein the light absorption anisotropic film is the light absorption anisotropic film according to claim 2.

17. The laminate according to claim 16, further comprising:
a retardation plate provided on the light absorption anisotropic film,
wherein the retardation plate includes a plurality of optically anisotropic layers containing a liquid crystal compound, and
at least one of the plurality of optically anisotropic layers is an optically anisotropic layer containing a twistedly aligned liquid crystal compound having a helix axis in the thickness direction.

18. The laminate according to claim 16, further comprising:
a surface protective material provided on the light absorption anisotropic film,
wherein the base material is a glass base material having a thickness of 100 μm or less.

19. The laminate according to claim 16, further comprising:
a λ/4 plate provided on the light absorption anisotropic film.

20. An image display device comprising:
the light absorption anisotropic film according to claim 2.

* * * * *